(12) United States Patent
Yu et al.

(10) Patent No.: US 12,424,486 B2
(45) Date of Patent: *Sep. 23, 2025

(54) INTEGRATED CIRCUIT STRUCTURE WITH BACKSIDE INTERCONNECTION STRUCTURE HAVING AIR GAP

(71) Applicant: TAIWAN SEMICONDUCTOR MANUFACTURING CO., LTD., Hsinchu (TW)

(72) Inventors: Li-Zhen Yu, New Taipei (TW); Huan-Chieh Su, Changhua County (TW); Lin-Yu Huang, Hsinchu (TW); Cheng-Chi Chuang, New Taipei (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/630,814

(22) Filed: Apr. 9, 2024

(65) Prior Publication Data

US 2024/0258158 A1    Aug. 1, 2024

Related U.S. Application Data

(63) Continuation of application No. 18/066,071, filed on Dec. 14, 2022, now Pat. No. 11,984,350, which is a
(Continued)

(51) Int. Cl.
*H01L 21/768* (2006.01)
*H10D 30/67* (2025.01)

(52) U.S. Cl.
CPC .... *H01L 21/7682* (2013.01); *H01L 21/76805* (2013.01); *H01L 21/76843* (2013.01);
(Continued)

(58) Field of Classification Search
CPC .......... H01L 21/7682; H01L 29/42392; H01L 21/823475; H01L 21/76805;
(Continued)

(56) References Cited

U.S. PATENT DOCUMENTS 7,531,407 B2    5/2009   Clevenger
9,209,247 B2    12/2015  Colinge et al.
(Continued)

*Primary Examiner* — Changhyun Yi
(74) *Attorney, Agent, or Firm* — Maschoff Brennan

(57) ABSTRACT

A method includes forming a transistor over a substrate; forming a front-side interconnection structure over the transistor; after forming the front-side interconnection structure, removing the substrate; after removing the substrate, forming a backside via to be electrically connected to the transistor; depositing a dielectric layer to cover the backside via; forming an opening in the dielectric layer to expose the backside via; forming a spacer structure on a sidewall of the opening; after forming a spacer structure, forming a conductive feature in the opening to be electrically connected to the backside via; and after forming the conductive feature, forming an air gap in the spacer structure.

20 Claims, 54 Drawing Sheets

Related U.S. Application Data continuation of application No. 17/199,085, filed on Mar. 11, 2021, now Pat. No. 11,551,969.

(60) Provisional application No. 63/082,018, filed on Sep. 23, 2020.

(52) U.S. Cl.
CPC ... H01L 21/76895 (2013.01); H10D 30/6729 (2025.01); H10D 30/6735 (2025.01); H10D 30/6757 (2025.01)

(58) Field of Classification Search
CPC ........ H01L 21/76895; H01L 21/76843; H10D 30/6729; H10D 30/6735; H10D 30/6757
See application file for complete search history.

(56) References Cited

U.S. PATENT DOCUMENTS

| | | |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,283,600 B2 | 5/2019 | Lee |
| 11,551,969 B2 * | 1/2023 | Yu ................... H01L 29/0673 |
| 11,984,350 B2 * | 5/2024 | Yu ................... H01L 29/775 |
| 2008/0054313 A1 | 3/2008 | Dyer |
| 2017/0179242 A1 * | 6/2017 | Chang ................ H01L 29/401 |
| 2019/0043959 A1 * | 2/2019 | Lee ................ H01L 23/53209 |

* cited by examiner

INTEGRATED CIRCUIT STRUCTURE WITH BACKSIDE INTERCONNECTION STRUCTURE HAVING AIR GAP

PRIORITY CLAIM AND CROSS-REFERENCE

This application is a Continuation Application of the U.S. application Ser. No. 18/066,071, filed Dec. 14, 2022, which is a Continuation Application of the U.S. application Ser. No. 17/199,085, filed on Mar. 11, 2021, now U.S. Pat. No. 11,551,969, issued on Jan. 10, 2023, which claims priority to U.S. Provisional Application Ser. No. 63/082,018, filed Sep. 23, 2020, which are herein incorporated by references in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
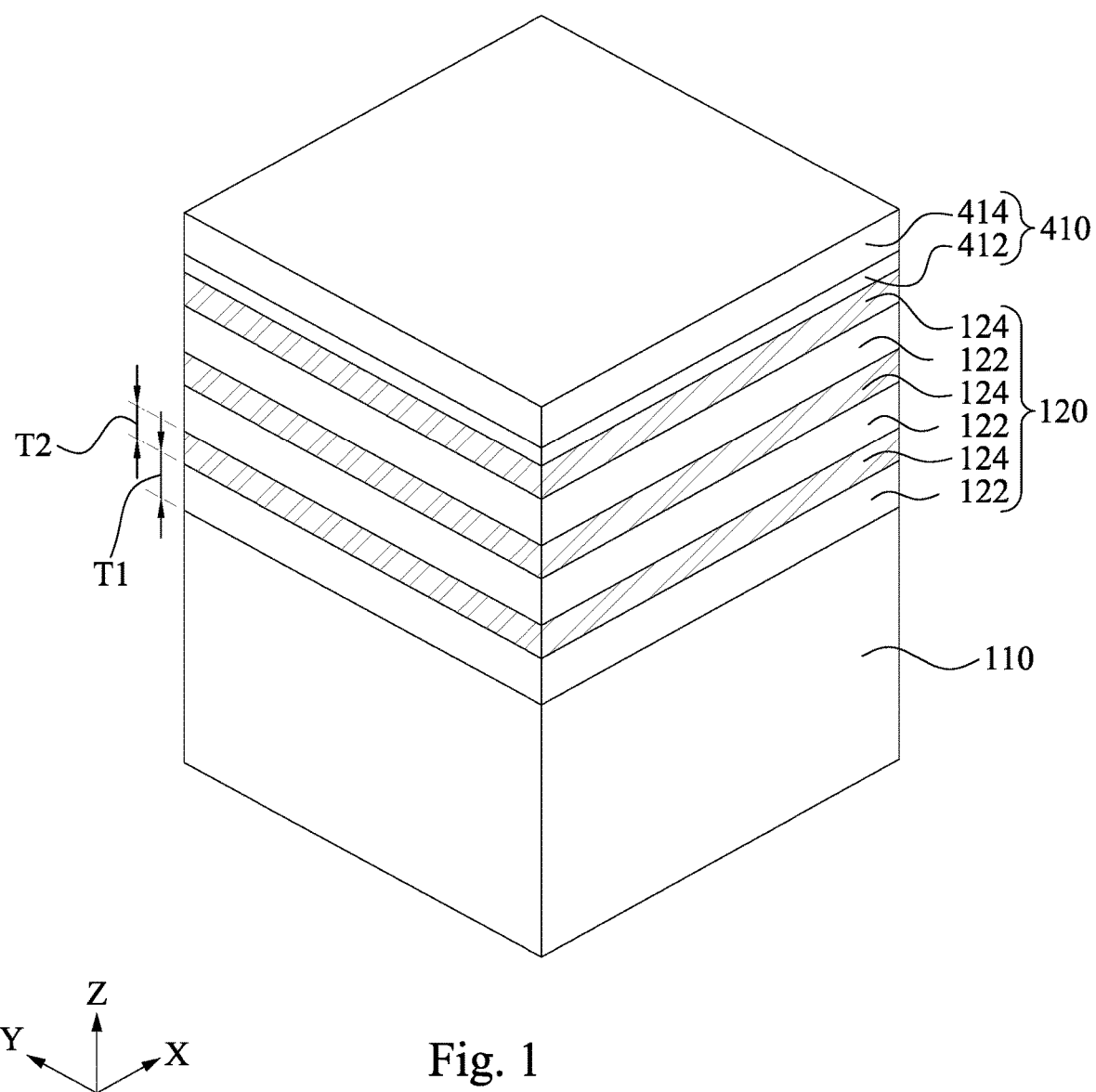
FIGS. 1, 2, 3, 4, 5, 6, 7A, 7B, 8A, 8B, 8C, 9, 10A, 10B, 10C, 11, 12A, 12B, 13, 14, 15A, 15B, 15C, 16A, 16B, 17A, 17B, 18A, 18B, 19A, 19B, 20A, 20B, 21A, 21B, 22A, 22B, 23A, and 23B illustrate a method for manufacturing an integrated circuit structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit structures and methods of forming the same. More particularly, some embodiments of the present disclosure are related to GAA devices including an air gap in a backside interconnection structure of the GAA device. The GAA devices presented herein include a p-type GAA device or an n-type GAA device. Further, the GAA devices may have one or more channel regions (e.g., nanowires) associated with a single, contiguous gate structure, or multiple gate structures. One of ordinary skill may recognize other examples of integrated circuit structures that may benefit from aspects of the present disclosure.

FIGS. 1-23B illustrate a method for manufacturing an integrated circuit structure at various stages in accordance with some embodiments of the present disclosure. In addition to the integrated circuit structure, FIGS. 1-7A, 8A, 9-10A, 11-12A, and 13-15A depict X-axis, Y-axis, and Z-axis directions. In some embodiments, the integrated circuit structure shown in FIGS. 1-23B may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A stacked structure 120 is formed on the substrate 110 through epitaxy, such that the stacked structure 120 forms crystalline layers. The stacked structure 120 includes first semiconductor layers 122 and second semiconductor layers 124 stacked alternately. The first semiconductor layers 122 and the second semiconductor layers 124 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 122 and the second semiconductor layers 124 are made of Si, a Si compound, SiGe, Ge or a Ge compound. In FIG. 1, three layers of the first semiconductor layer 122 and three layers of the second semiconductor layer 124 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

In some embodiments, the first semiconductor layers 122 can be SiGe layers having a germanium atomic percentage greater than zero. In some embodiments, the germanium percentage of the first semiconductor layers 122 is in the range between about 5 percent and about 50 percent. In some embodiments, the thickness T1 of the first semiconductor layers 122 is in the range between about 5 nm and about 20 nm.

In some embodiments, the second semiconductor layers 124 may be pure silicon layers that are free from germanium. The second semiconductor layers 124 may also be substantially pure silicon layers, for example, with a germanium atomic percentage lower than about 1 percent. Furthermore, the second semiconductor layers 124 may be intrinsic, which are not doped with p-type and n-type impurities. In some embodiments, the thickness T2 of the second semiconductor layers 124 is in the range between about 5 nm and about 20 nm.

Subsequently, a mask layer 410 is formed above the stacked structure 120. In some embodiments, the mask layer 410 includes a first mask layer 412 and a second mask layer 414. The first mask layer 412 may be a pad oxide layer made of a silicon oxide, which can be formed by a thermal oxidation. The second mask layer 414 may be made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Figure 2:
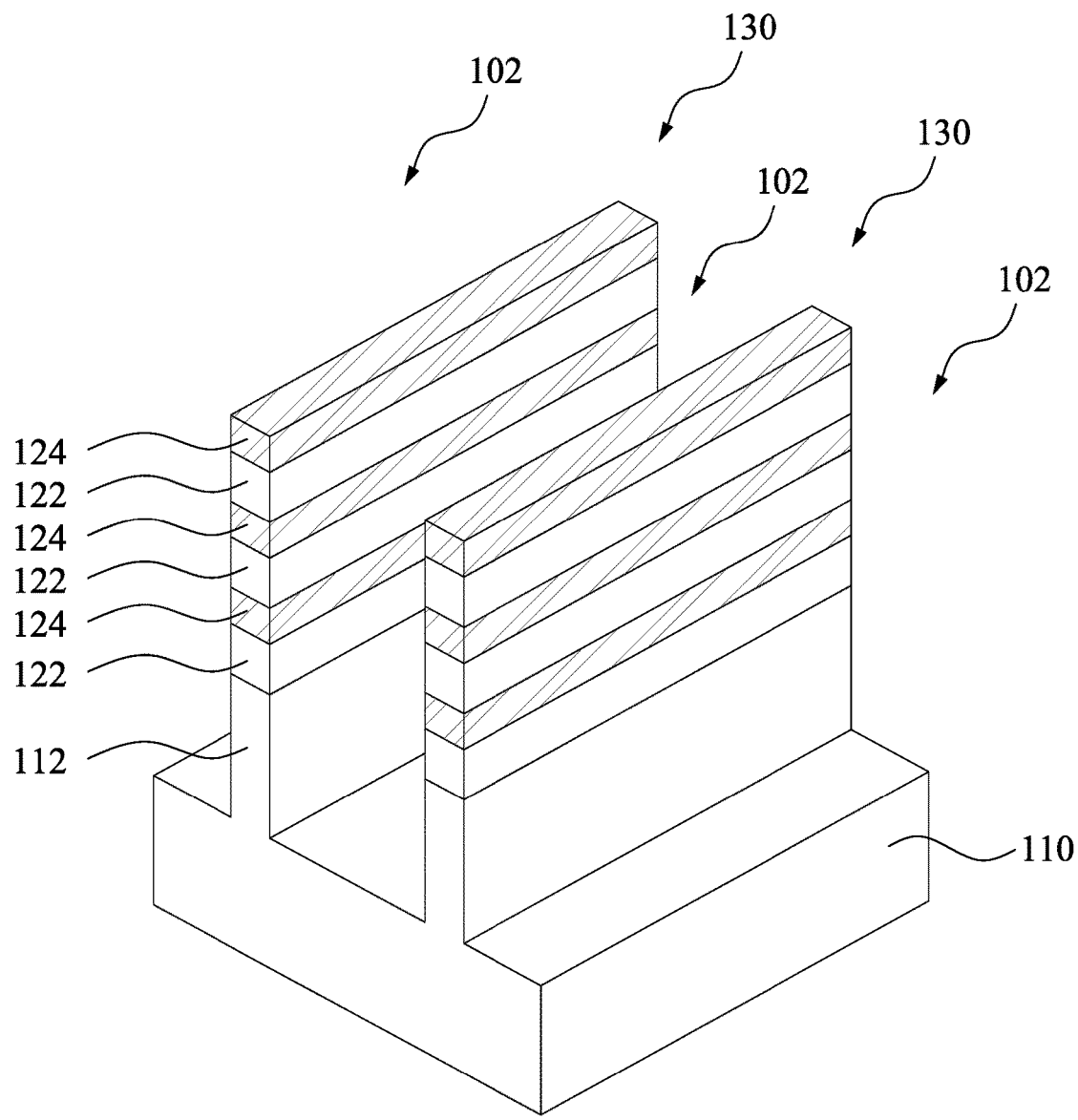

Reference is made to FIG. 2. The mask layer 410 (see FIG. 1) is patterned into a mask pattern by using patterning operations including photo-lithography and etching. After the patterning of the mask layer 410, the stacked structure 120 (see FIG. 1) is patterned by using the patterned mask layer 410 as an etch mask, such that the stacked structure 120 is patterned into fin structures 130 and trenches 102 extending in the X direction. In FIG. 2, two fin structures 130 are arranged in the Y direction. But the number of the fin structures is not limited to, and may be as small as one and three or more. In some embodiments, one or more dummy fin structures are formed on both sides of the fin structures 130 to improve pattern fidelity in the patterning operations.

The trenches 102 extend into the substrate 110, and have lengthwise directions substantially parallel to each other. The trenches 102 form base portions 112 in the substrate 110, where the base portions 112 protrude from the substrate 110, and the fin structures 130 are respectively formed above the base portions 112 of the substrate 110. The remaining portions of the stacked structure 120 are accordingly referred to as the fin structures 130 alternatively.

Figure 3:
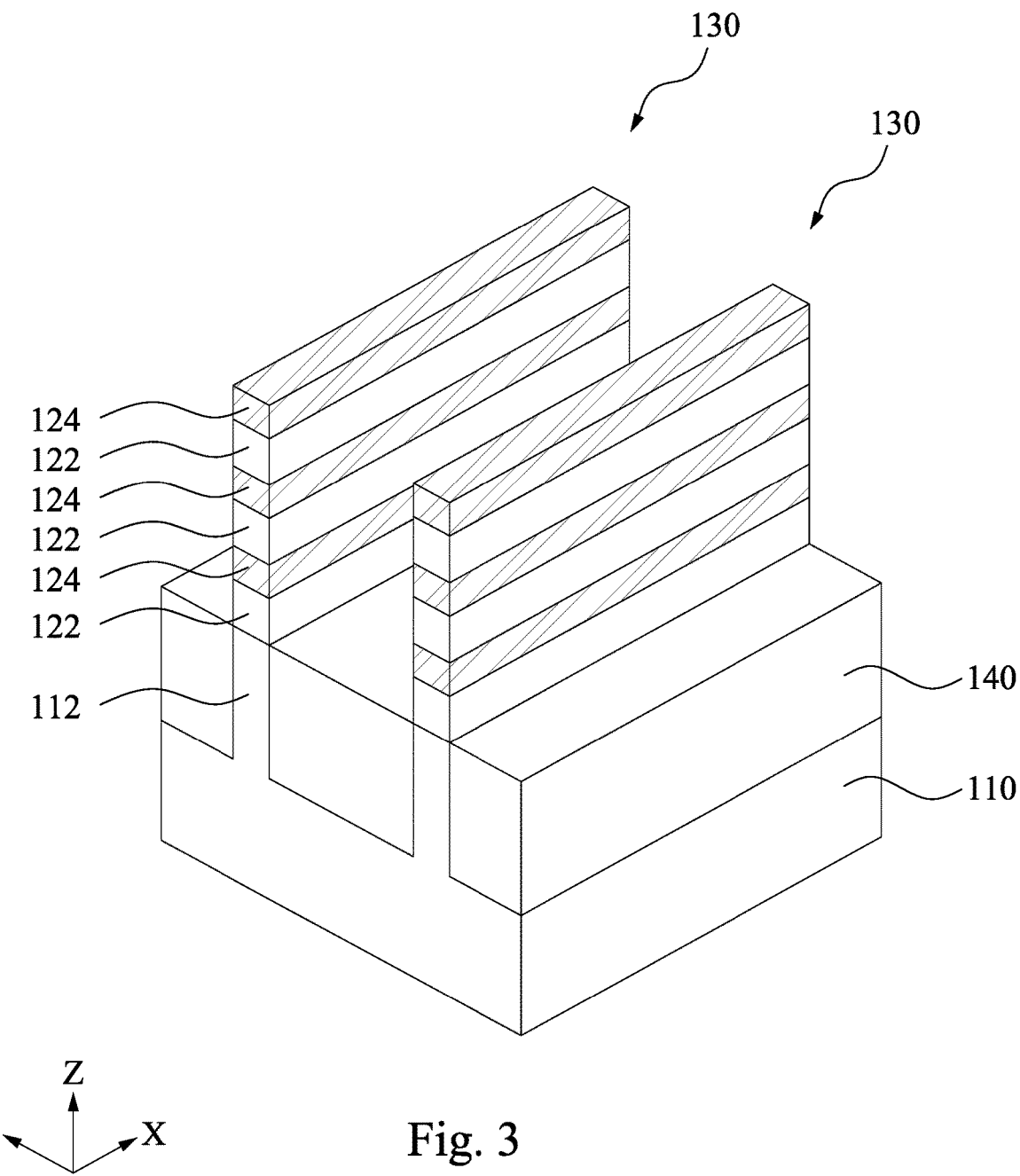

Reference is made to FIG. 3. After the fin structures 130 are formed, isolation structures 140 are formed above the structure in FIG. 2 so that the upper portions of the fin structures 130 are exposed. For example, an insulating material layer including one or more layers of insulating material is formed over the substrate 110 so that the fin structures 130 are fully embedded in the insulating material layer. The insulating material for the insulating material layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer, especially when the insulating material layer is formed using flowable CVD. Subsequently, a planarization operation, such as a chemical mechanical polishing (CMP) method or an etch-back method, is performed such that the upper surface of the uppermost second semiconductor layer 124 is exposed from the insulating material layer. In some embodiments, a liner layer is formed over the structure of FIG. 2 before forming the insulating material layer. The first liner layer is made of SiN or a silicon nitride-based material (e.g., SiON, SiCN or SiOCN).

The insulating material layer is then recessed to form the isolation structures 140 so that the upper portions of the fin structures 130 are exposed. With this operation, the fin structures 130 are electrically insulated from each other by the isolation structures 140, which are also referred to as an STI structure. In some embodiments, the insulating material layer is recessed until the bottommost first semiconductor layer 122 is exposed. The first semiconductor layers 122 are sacrificial layers which are subsequently partially removed, and the second semiconductor layers 124 will serve as channel regions of a GAA FET.

Figure 4:
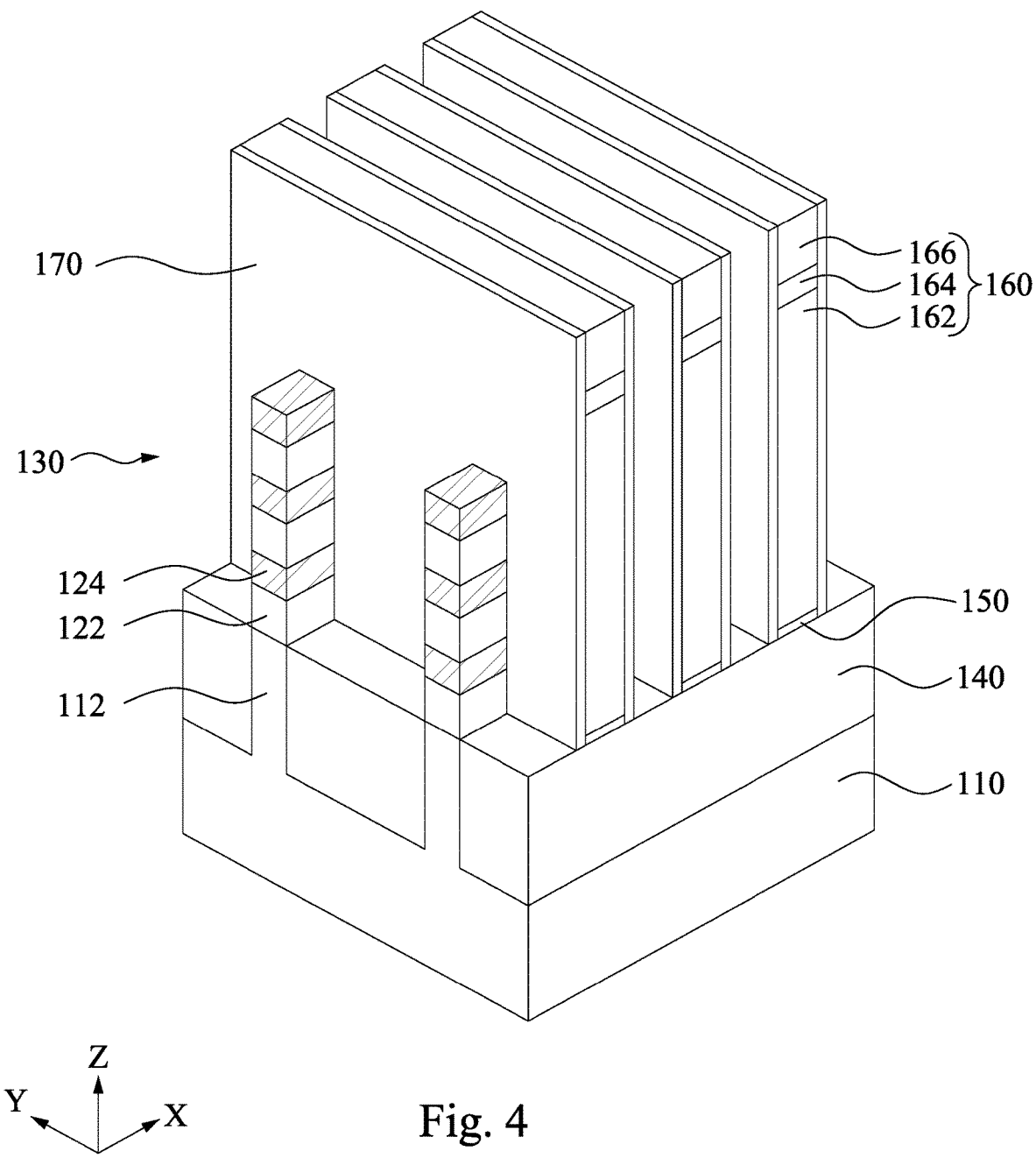

Reference is made to FIG. 4. A sacrificial gate dielectric layer 150 is conformally formed above the structure of FIG. 3. In some embodiments, the sacrificial gate dielectric layer 150 may include silicon dioxide, silicon nitride, a high-κ dielectric material or other suitable material. In various examples, the sacrificial gate dielectric layer 150 may be deposited by an ALD process, a CVD process, a subatmospheric CVD (SACVD) process, a flowable CVD process, a PVD process, or other suitable process. By way of example, the sacrificial gate dielectric layer 150 may be used to prevent damage to the fin structures 130 by subsequent processing (e.g., subsequent formation of the dummy gate structure).

At least one dummy gate structure 160 is then formed above the sacrificial gate dielectric layer 150. The dummy gate structure 160 includes a dummy gate layer 162, a pad layer 164 formed over the dummy gate layer 162, and a mask layer 166 formed over the pad layer 164. Formation of the dummy gate structure 160 includes depositing in sequence a dummy gate layer, a pad layer and a mask layer over the substrate 110, patterning the pad layer and mask layer into patterned pad layer 164 and mask layer 166 using suitable photolithography and etching techniques, followed by patterning the dummy gate layer using the pad layer 164 and the mask layer 166 as masks to form the patterned dummy gate layer 162. As such, the dummy gate layer 162, the pad layer 164, and the mask layer 166 are referred to as the dummy gate structure 160. In some embodiments, the dummy gate layer 162 may be made of polycrystalline-silicon (poly-Si), poly-crystalline silicon-germanium (poly-SiGe), or other suitable materials. The pad layer 164 may be made of silicon nitride or other suitable materials, and the mask layer 166 may be made of silicon dioxide or other suitable materials. After the patterning of the dummy gate layer 162, the sacrificial gate dielectric layer 150 is patterned as well to expose portions of the fin structures 130, thereby defining source/drain (S/D) regions. In this disclosure, a source and a drain are interchangeably used and the structures thereof are substantially the same. In FIG. 4, three dummy gate structures 160 are arranged in the X direction. But the number of the dummy gate structures is not limited to, and may be as small as one and three or more.

Subsequently, gate spacers 170 are formed on opposite sidewalls of the dummy gate structures 160. For example, a blanket layer of an insulating material for sidewall spacers is conformally formed to cover the dummy gate structures 160 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the dummy gate structures 160. In some embodiments, the insulating material of the blanket layer is a silicon nitride-based material, such as SiN, SiON, SiOCN or SiCN and combinations thereof. The blanket layer is then etched using an anisotropic process to form the gate spacers 170 on opposite sidewalls of the dummy gate structures 160.

The gate spacers 170 may include a seal spacer and a main spacer (not shown). The seal spacers may be formed on sidewalls of the dummy gate structure 160 and the main spacers are formed on the seal spacers. The anisotropic etching performed on the blanket layer can be, for example, reactive ion etching (RIE). During the anisotropic etching process, most of the insulating material is removed from horizontal surfaces, leaving the dielectric spacer layer on the vertical surfaces such as the sidewalls of the dummy gate structures 160.

Figure 5:
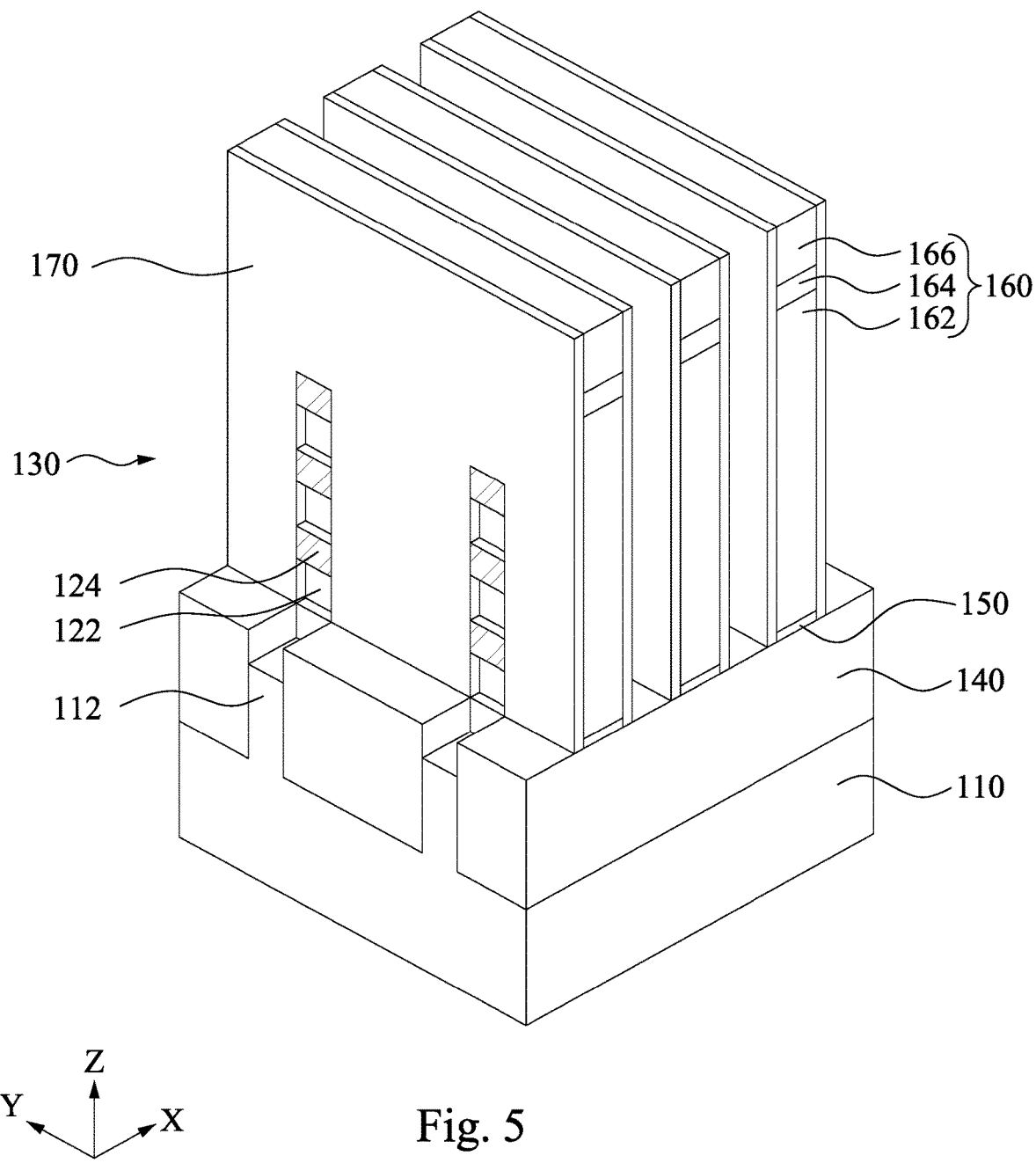

Reference is made to FIG. 5. The exposed portions of the fin structures 130 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch. In some embodiments, parts of the base portions 112 are removed as well, such that recesses are formed between the isolation structures 140.

Subsequently, the first semiconductor layers 122 are horizontally recessed (etched) so that the second semiconductor layers 124 laterally extend past opposite end surfaces of the first semiconductor layers 122. In some embodiments, end surfaces of the first semiconductor layers 122 may be substantially vertically aligned with the sidewalls of the sacrificial gate dielectric layer 150 and/or the sidewalls of the gate spacers 170.

Figure 6:
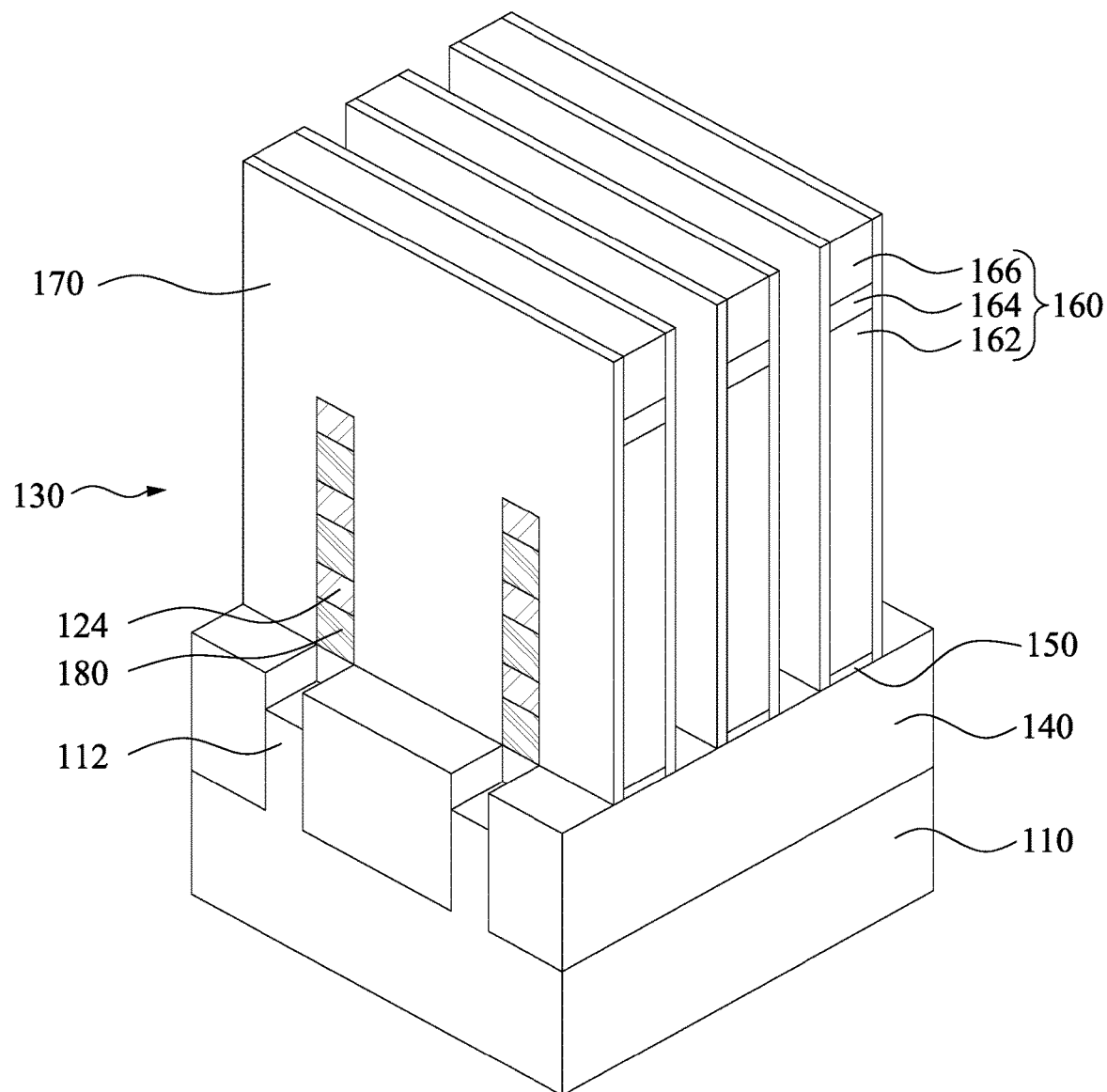

Reference is made to FIG. 6. Inner spacers 180 are respectively formed on sidewalls of the first semiconductor layers 122 (see FIG. 5). For example, a dielectric material layer is formed over the structure of FIG. 5, and one or more etching operations are performed to form the inner spacers 180. In some embodiments, the inner spacers 180 includes a silicon nitride-based material, such as SiN, SiON, SiOCN or SiCN and combinations thereof and is different from the material of the gate spacers 170. In some embodiments, the inner spacers 180 are silicon nitride. The inner spacers 180 may fully fill the recesses as shown in FIG. 6. The dielectric material layer can be formed using CVD, including LPCVD and PECVD, PVD, ALD, or other suitable processes. The etching operations include one or more wet and/or dry etching operations.

Figure 7A:
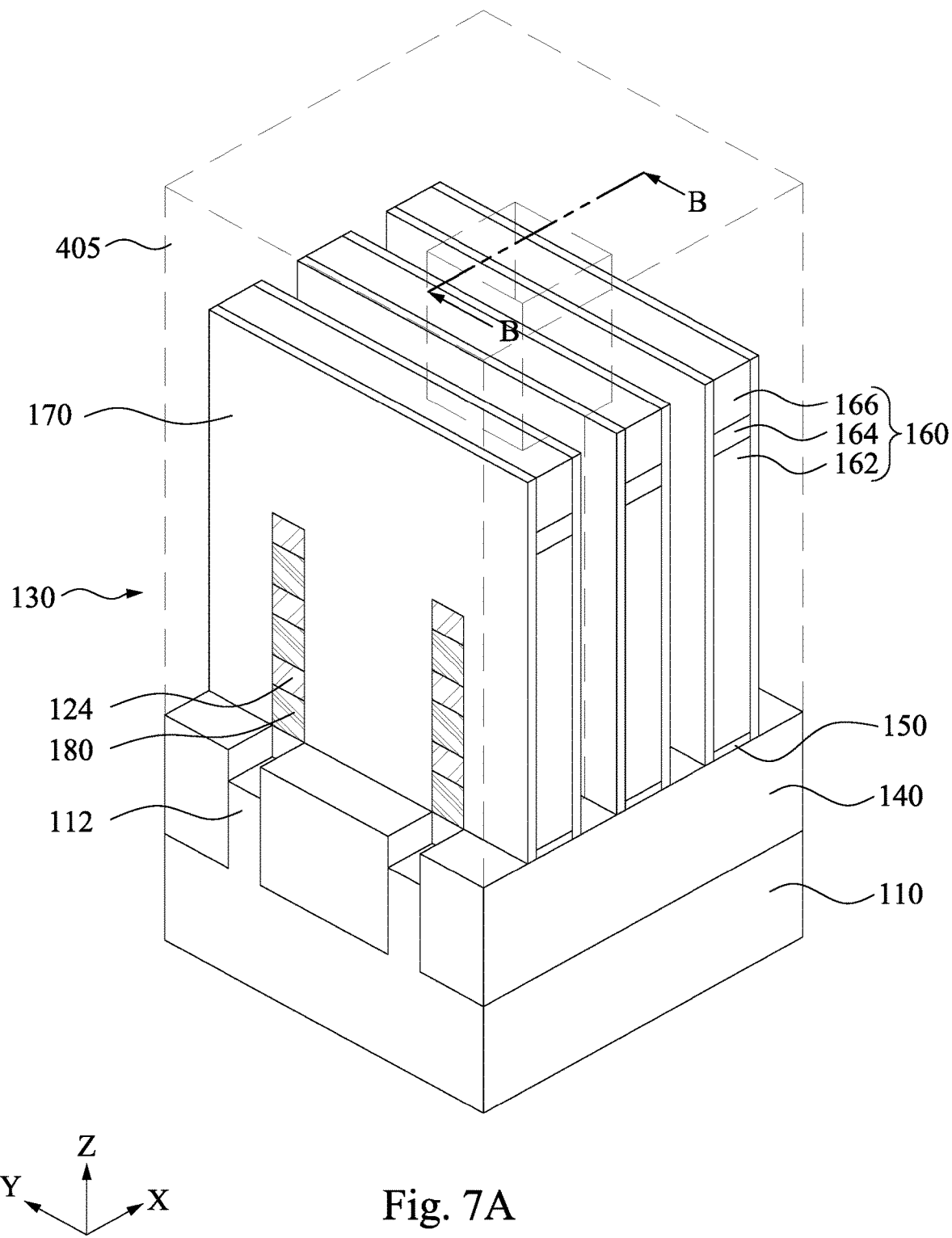
Figure 7B:
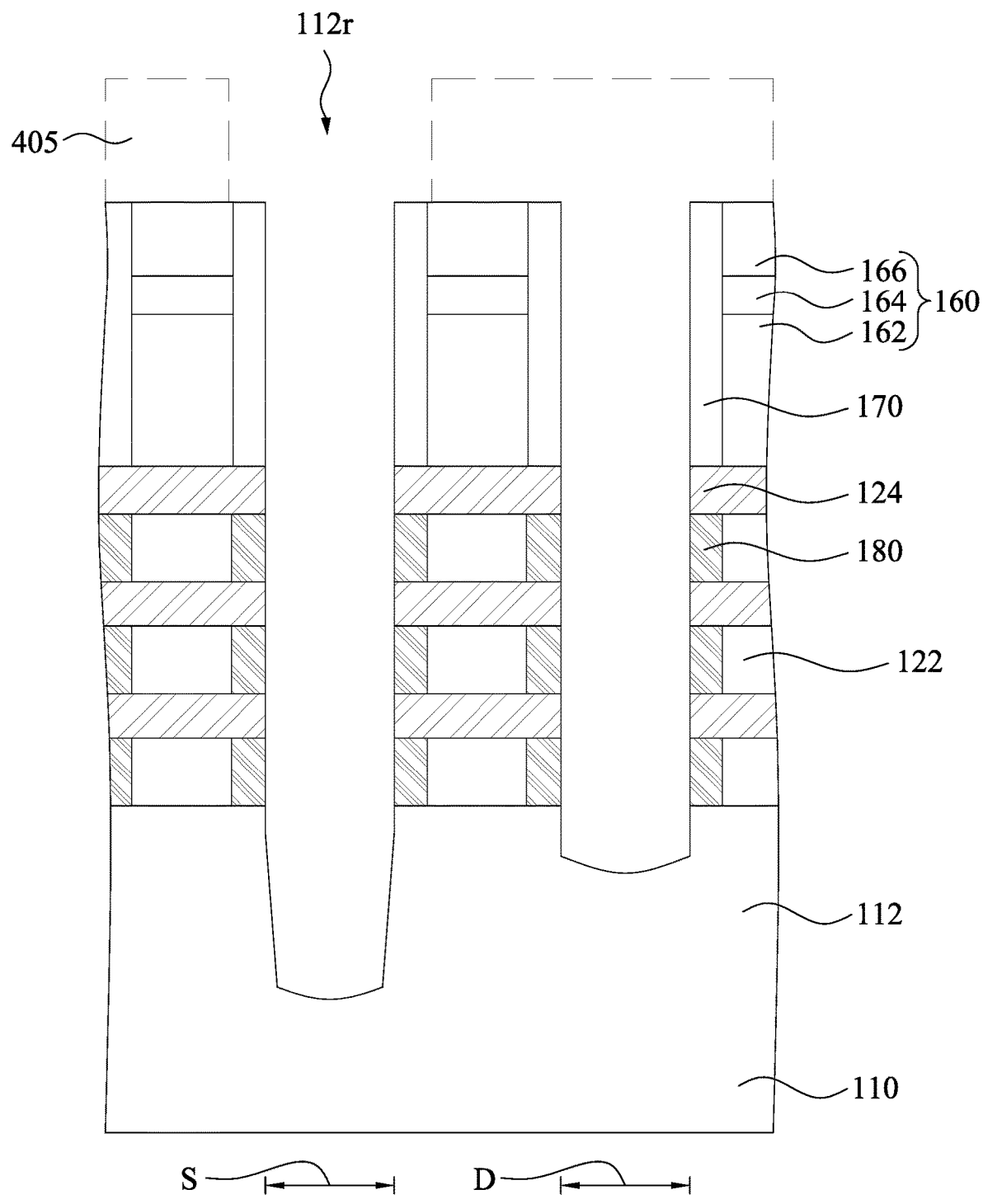

Reference is made to FIGS. 7A and 7B, where FIG. 7B is a cross-sectional view taken along line B-B in FIG. 7A. A mask layer 405 is formed above the structure of FIG. 6. For clarity, the mask layer 405 is illustrated with dashed lines. The mask layer 405 is formed to cover drain regions D of the base portion 112 but not cover at least one source region S of the base portion 112, and then the source region(s) S of the base portion 112 are recessed, resulting in at least one source-region recess 112r in the base portion 112. In some embodiments, the mask layer 405 may be a photoresist mask formed by suitable photolithography process. For example, the photolithography process may include spin-on coating a photoresist layer over the structure as illustrated in FIG. 6, performing post-exposure bake processes, and developing the photoresist layer to form the mask layer 405. In some embodiments, patterning the resist to form the patterned mask element may be performed using an electron beam (e-beam) lithography process or an extreme ultraviolet (EUV) lithography process.

Once the mask layer 405 is formed, the source-region recess 112r can be formed in the source region S using, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 8A:
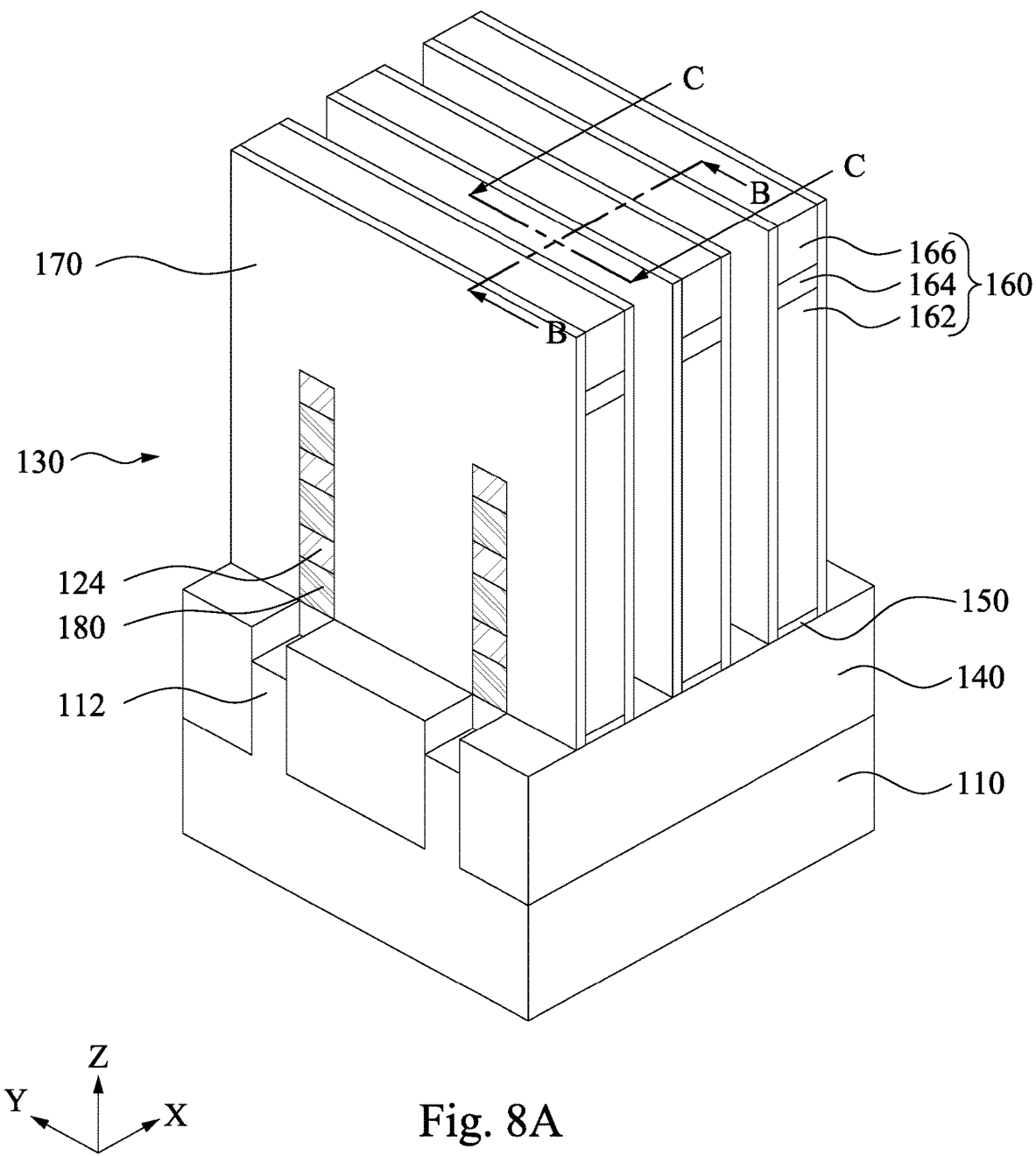
Figure 8B:
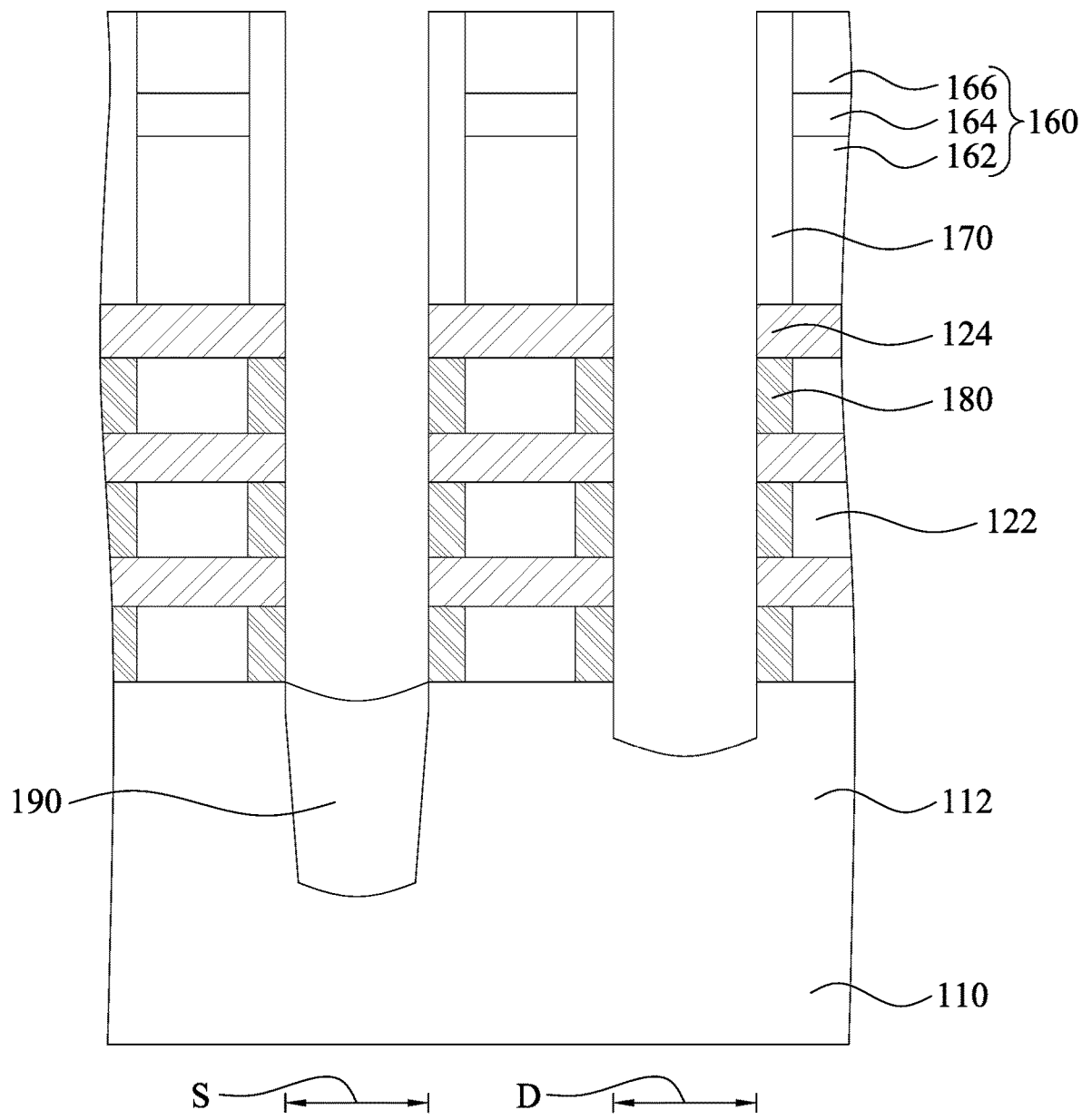
Figure 8C:
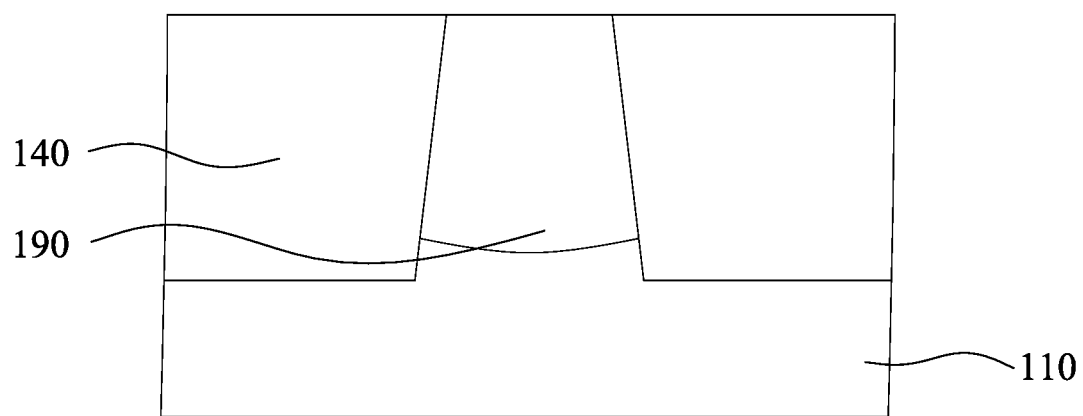

Reference is made to FIGS. 8A-8C, where FIG. 8B is a cross-sectional view taken along line B-B in FIG. 8A, and FIG. 8C is a cross-sectional view taken along line C-C in FIG. 8A. An epitaxial growth process is performed to grow an epitaxial material in the source-region recess 112r until the epitaxial material builds up sacrificial epitaxial plug 190 filling the source-region recess 112r. The epitaxial material has a different composition than the substrate 110, thus resulting in different etch selectivity between the sacrificial epitaxial plug 190 and the substrate 110. For example, the substrate 110 is Si and the sacrificial epitaxial plug 190 is SiGe. In some embodiments, the sacrificial epitaxial plug 190 are SiGe free from p-type dopants (e.g., boron) and n-type dopants (e.g., phosphorous), because the sacrificial epitaxial plug 190 will be removed in subsequent processing and not serve as source terminals of transistors in a final IC product. After the formation of the sacrificial epitaxial plug 190, the mask layer 405 (see FIG. 7A) is removed.

Figure 9:
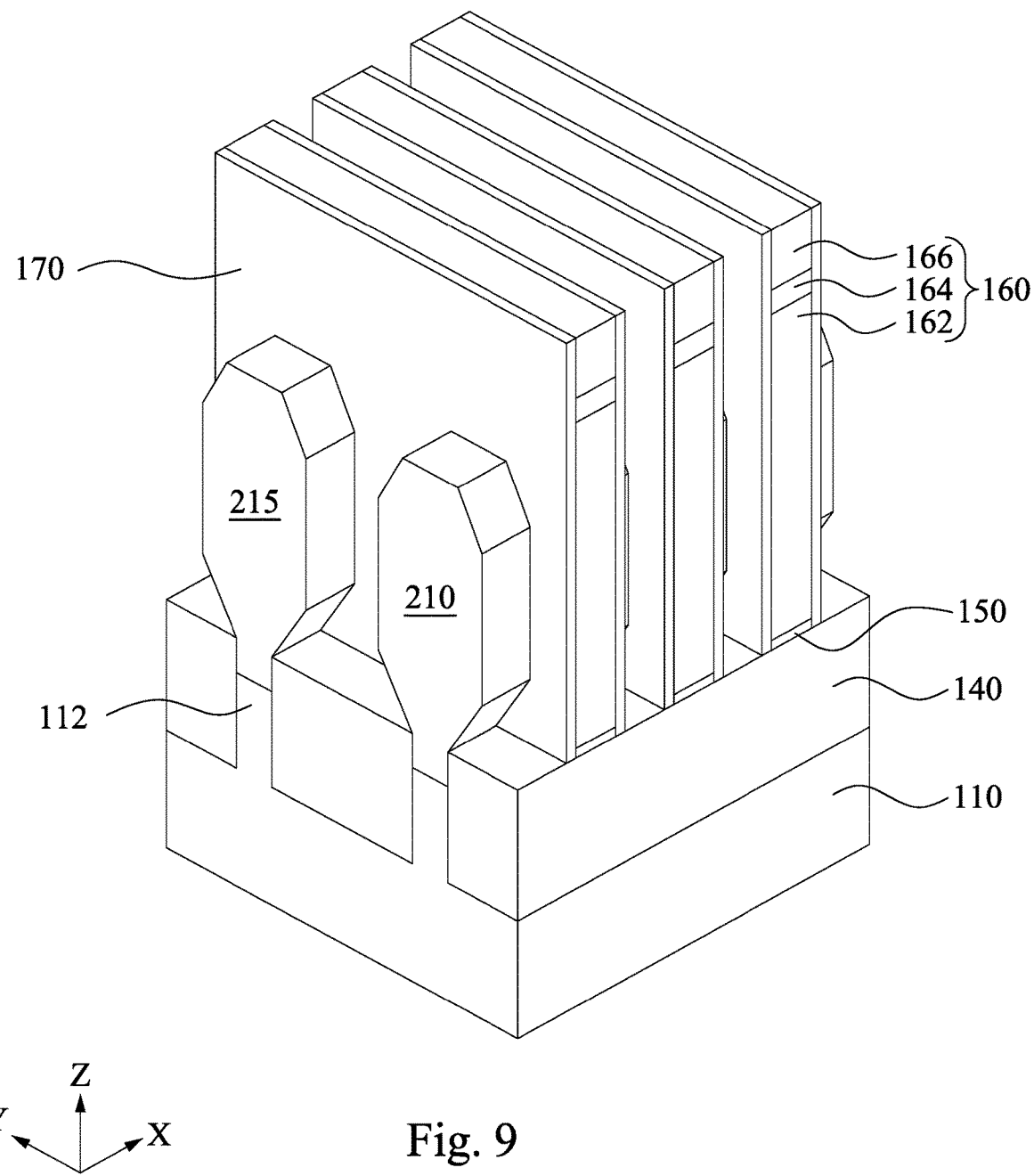

Reference is made to FIG. 9. Source/drain (S/D) epitaxial structures 210 and 215 are epitaxially grown from the base portions 112. The S/D epitaxial structures 210 and 215 includes one or more layers of Si, SiP, SiC and SiCP for an n-channel FET or Si, SiGe, Ge for a p-channel FET. The S/D epitaxial structures 210 and 215 are formed by an epitaxial growth method using CVD, ALD or molecular beam epitaxy (MBE). In some embodiments as depicted in FIG. 9, the S/D epitaxial structures 210 and 215 grown from neighboring base portions 112 of the substrate 110 do not merged. In some other embodiments, the S/D epitaxial structures 210 and 215 grown from neighboring base portions 112 merge above the isolation structures 140 and form a void in some embodiments. In some embodiments, the S/D epitaxial structures 210 and 215 have different conductivity types. For example, the S/D epitaxial structures 210 are N-type epitaxial structures, and the S/D epitaxial structure 215 are P-type epitaxial structures, or vice versa.

Figure 10A:
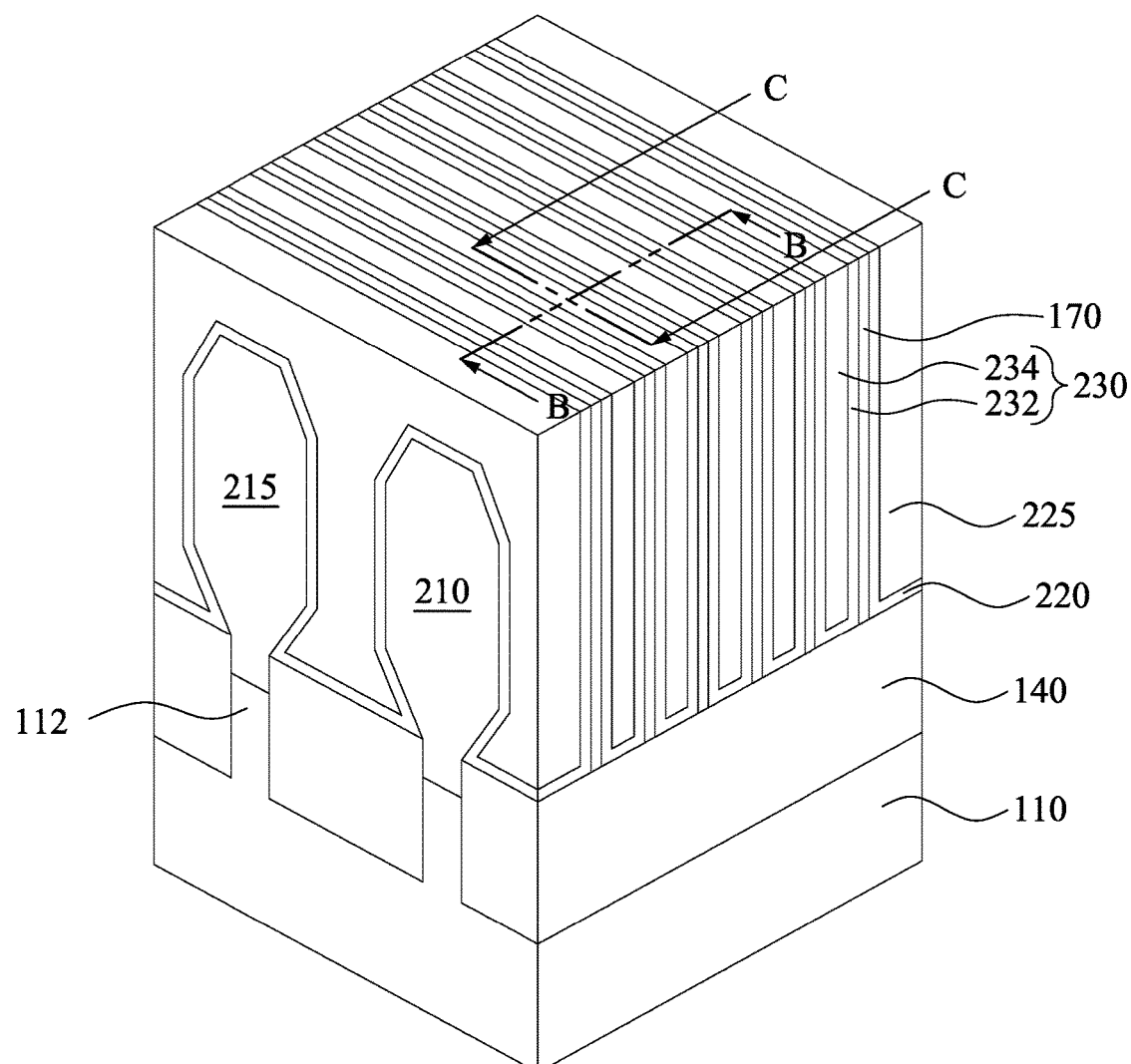
Figure 10B:
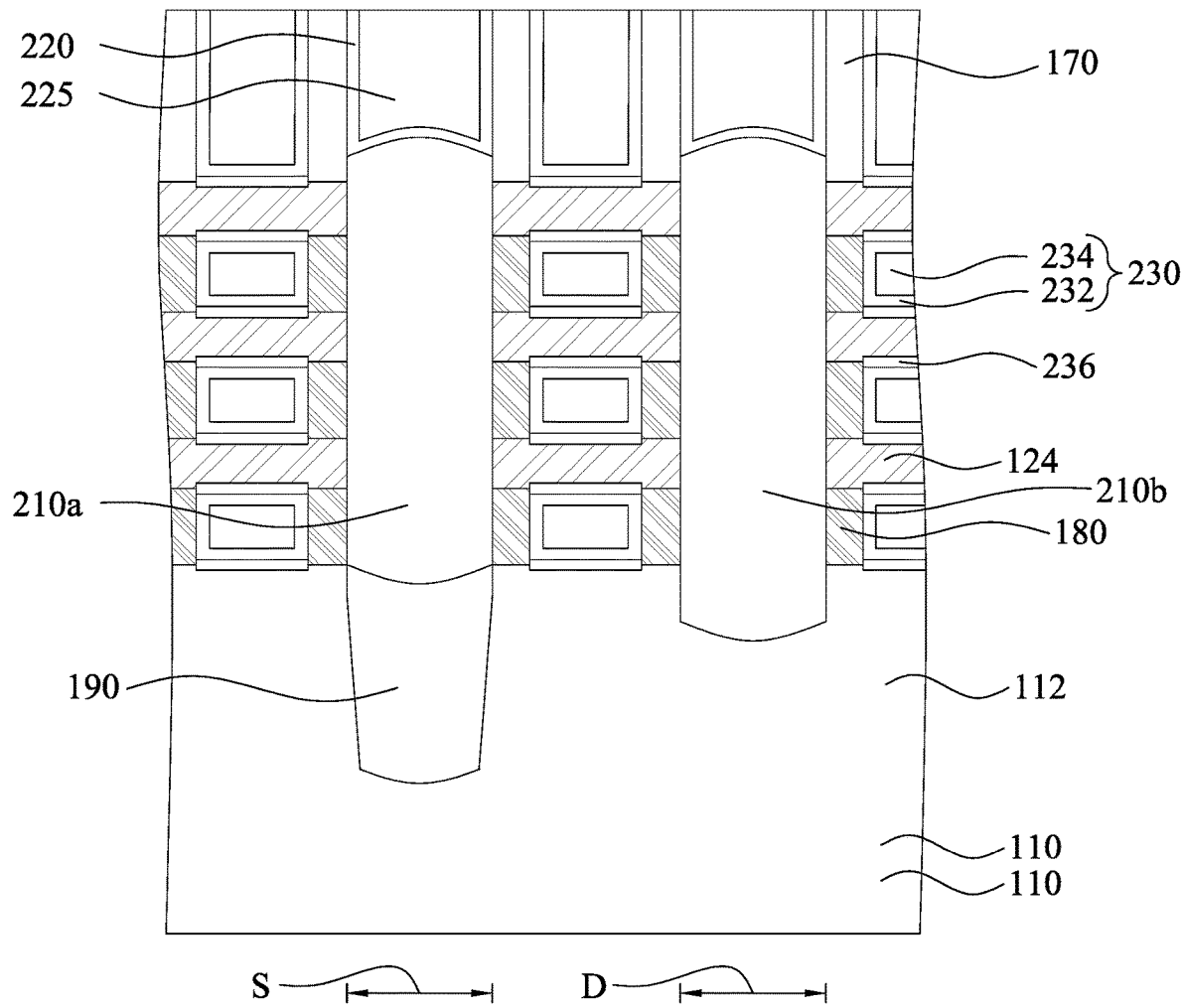
Figure 10C:
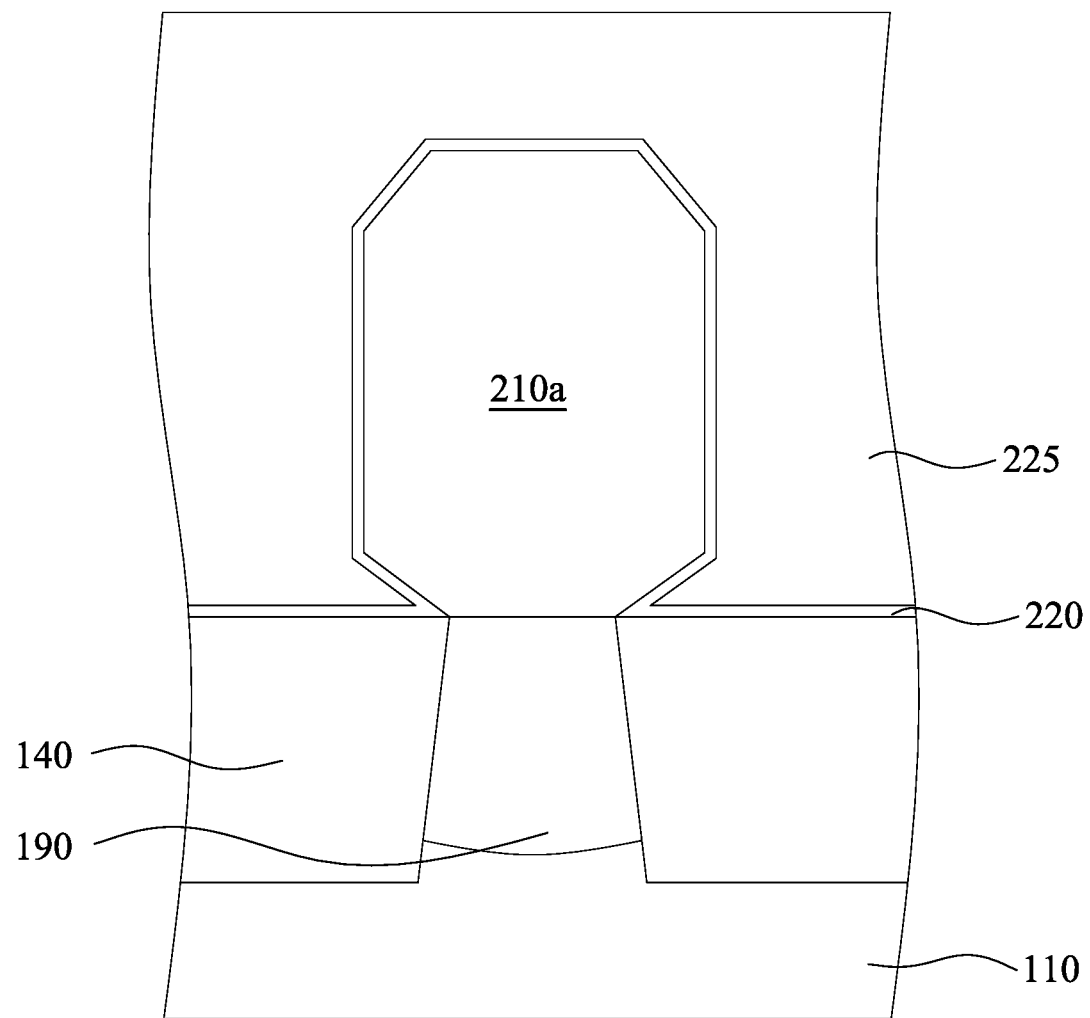

Reference is made to FIGS. 10A-10C, where FIG. 10B is a cross-sectional view taken along line B-B of FIG. 10A, and FIG. 10C is a cross-sectional view taken along line C-C of FIG. 10A. A first contact etch stop layer (CESL) 220 is conformally formed over the structure of FIG. 9. In some embodiments, the first CESL 220 can be a stressed layer or layers. In some embodiments, the first CESL 220 has a tensile stress and is formed of $Si_3N_4$. In some other embodiments, the first CESL 220 includes materials such as oxynitrides. In yet some other embodiments, the first CESL 220 may have a composite structure including a plurality of layers, such as a silicon nitride layer overlying a silicon oxide layer. The first CESL 220 can be formed using plasma enhanced CVD (PECVD), however, other suitable methods, such as low pressure CVD (LPCVD), atomic layer deposition (ALD), and the like, can also be used.

Figure 23A:
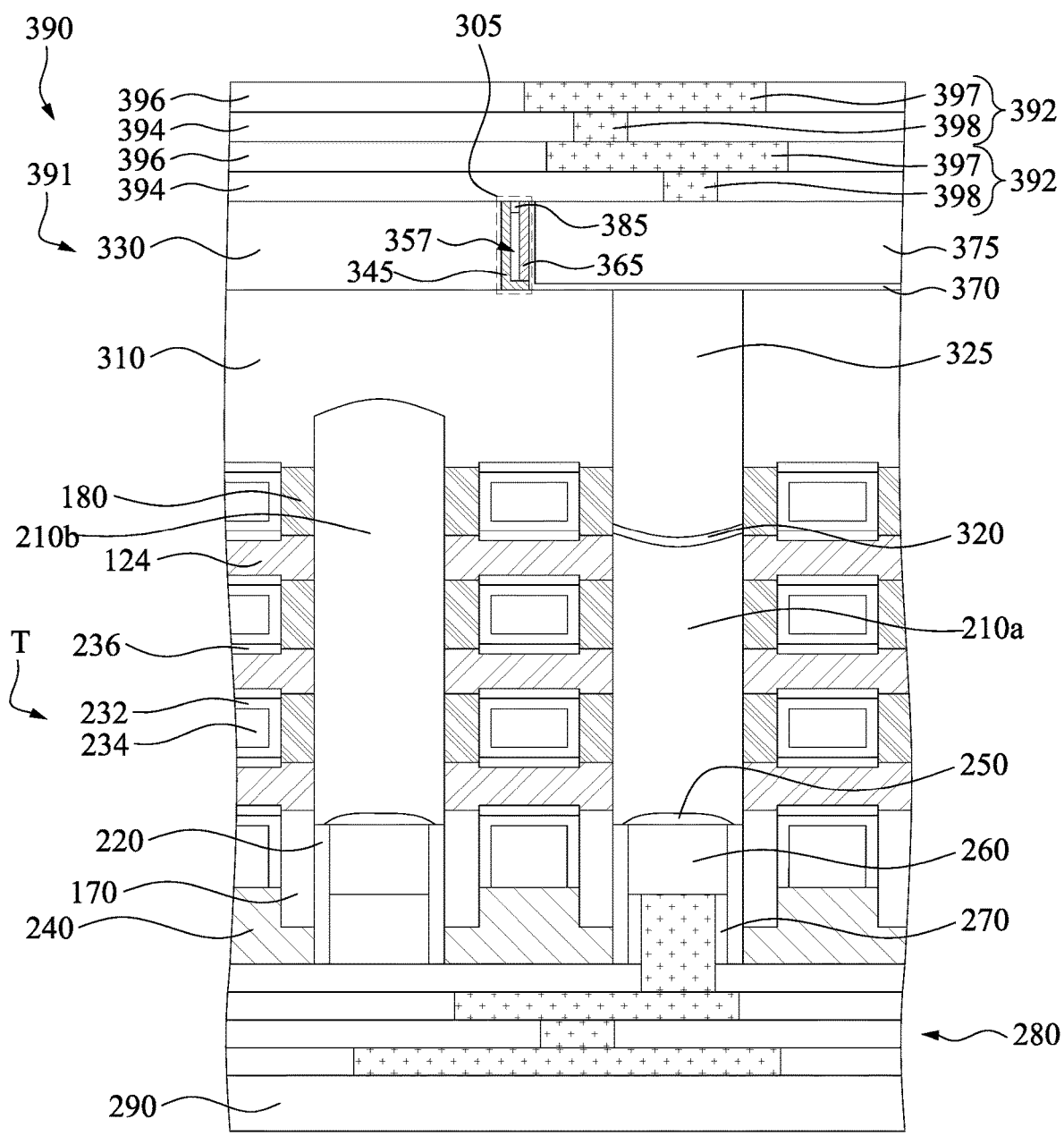
Figure 23B:
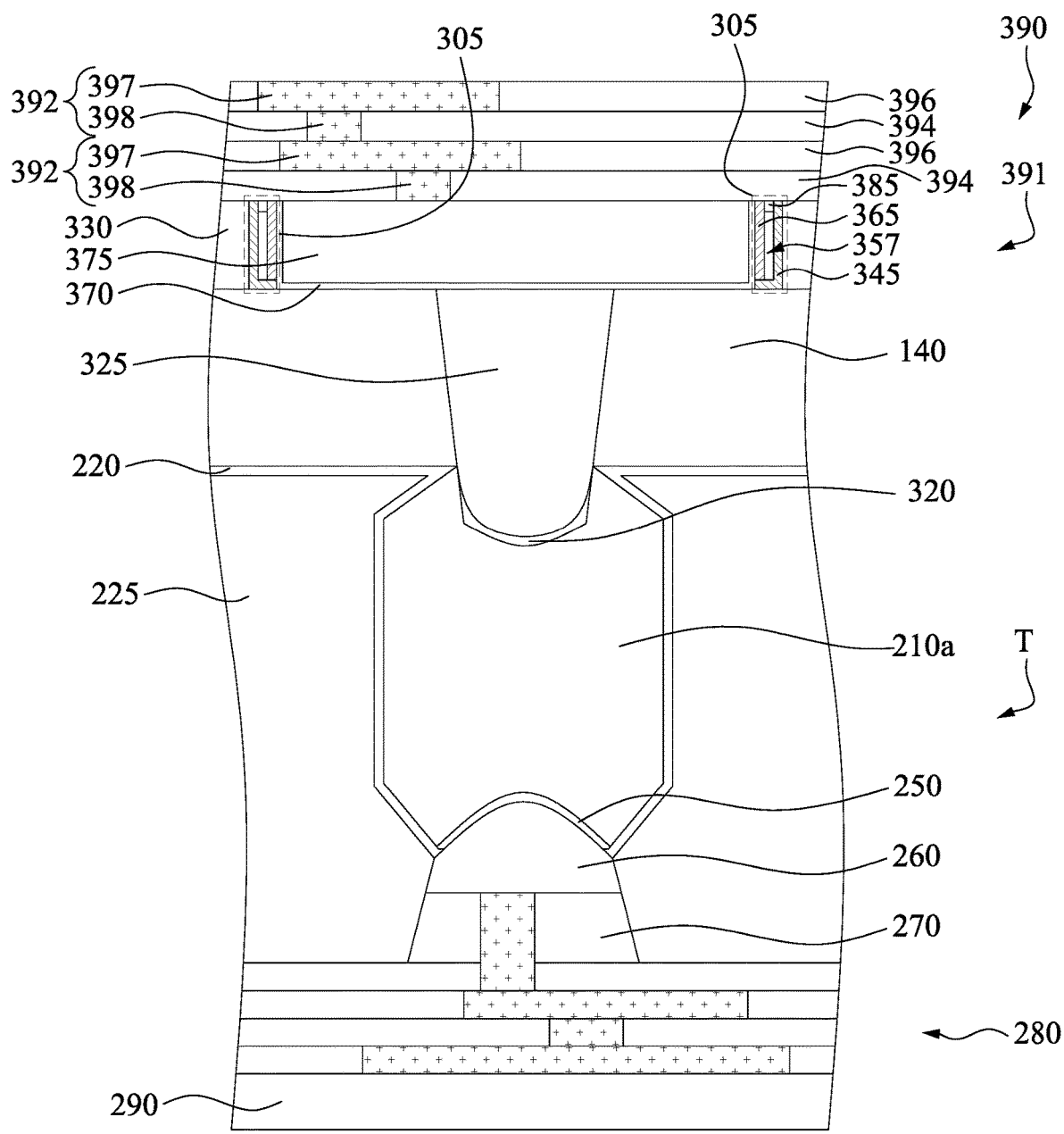

In some embodiments, adjacent epitaxial structures may respectively be a source and a drain of a transistor T (see FIGS. 23A and 23B). For example, in FIG. 10B, the epitaxial structure 210a of the S/D epitaxial structure 210 is a source of the transistor T while the epitaxial structure 210b of the S/D epitaxial structure 210 is a drain of the transistor T. Similarly, the of the S/D epitaxial structures 215 may include some sources and some drains adjacent to each other.

A first interlayer dielectric (ILD) 225 is then formed on the first CESL 220. The first ILD 225 may be formed by chemical vapor deposition (CVD), high-density plasma CVD, spin-on, sputtering, or other suitable methods. In some embodiments, the first ILD 225 includes silicon oxide. In some other embodiments, the first ILD 225 may include silicon oxy-nitride, silicon nitride, compounds including Si, O, C and/or H (e.g., silicon oxide, SiCOH and SiOC), a low-k material, or organic materials (e.g., polymers). After the first ILD 225 is formed, a planarization operation, such as CMP, is performed, so that the pad layer 164 and the mask layer 166 (see FIG. 9) are removed and the dummy gate layer 162 (see FIG. 9) is exposed.

The dummy gate layer 162 and the sacrificial gate dielectric layer 150 (see FIG. 9) are then removed, thereby exposing the first and second semiconductor layers 122 and 124 (see FIG. 8B). The first ILD 225 protects the S/D epitaxial structures 210 and 215 during the removal of the dummy gate layer 162. The dummy gate layer 162 can be removed using plasma dry etching and/or wet etching. When the dummy gate layer 162 is polysilicon and the first ILD 225 is silicon oxide, a wet etchant such as a TMAH solution can be used to selectively remove the dummy gate layer 162. The dummy gate layer 162 can be removed using plasma dry etching and/or wet etching. Subsequently, the sacrificial gate dielectric layer 150 is removed as well. As such, the first and second semiconductor layers 122 and 124 are exposed.

The first semiconductor layers 122 (see FIG. 8B) in the fin structures 130 are then removed, thereby forming nanosheets (or nanowires or nanorods or nano-columns) of the second semiconductor layers 124. The first semiconductor layers 122 can be removed or etched using an etchant that can selectively etch the first semiconductor layers 122 at a faster etching rate than etching the second semiconductor layers 124. In FIG. 10B, since the inner spacers 180 is made of a material that has etching selectivity to that of the first semiconductor layers 122, the inner spacers 180 protect the S/D epitaxial structures 210 and 215 from the etchant used in etching the first semiconductor layers 122.

In some embodiments, interfacial layers 236 are optionally formed to surround exposed surfaces of the second semiconductor layers 124 and exposed surfaces of the base portions of the substrate 110. In various embodiments, the interfacial layer 236 may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods.

Gate structures 230 are then formed and/or filled between the gate spacers 170 and the inner spacers 180. That is, the gate structure 230 encircles (or surrounds or wraps) the second semiconductor layers 124, in which the second semiconductor layers 124 are referred to as channels of the transistor T (see FIGS. 23A and 23B). The gate spacers 170 are disposed on opposite sides of the gate structure 230. The gate structure 230 includes a gate dielectric layer 232 and a gate electrode 234. The gate electrode 234 includes one or more work function metal layer (s) and a filling metal. The gate dielectric layer 232 is conformally formed. That is, the gate dielectric layer 232 is in contact with the isolation structures 140 and the interfacial layers 236 (or the second semiconductor layers 124 when the interfacial layers 236 are omitted). Furthermore, the gate dielectric layer 232 surrounds the second semiconductor layers 124, and spaces between the second semiconductor layers 124 are still left after the deposition of the gate dielectric layer 232. In some embodiments, the gate dielectric layer 232 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the gate dielectric layer 232 may be formed by performing an ALD process or other suitable process.

The work function metal layer of the gate electrode 234 is conformally formed on the gate dielectric layer 232, and the work function metal layer surrounds the second semiconductor layers 124 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process. The filling metal of the gate electrode 234 fills the remained space between the gate spacers 170 and between the inner spacers 180. That is, the work function metal layer(s) is in contact with and between the gate dielectric layer 232 and the filling metal. The filling metal may include material such as tungsten or aluminum. After the deposition of the gate dielectric layer 232 and the gate electrode 234, a planarization process, such as a CMP process, may be then performed to remove excess portions of the gate dielectric layer 232 and the gate electrode 234 to form the gate structure 230.

Figure 11:
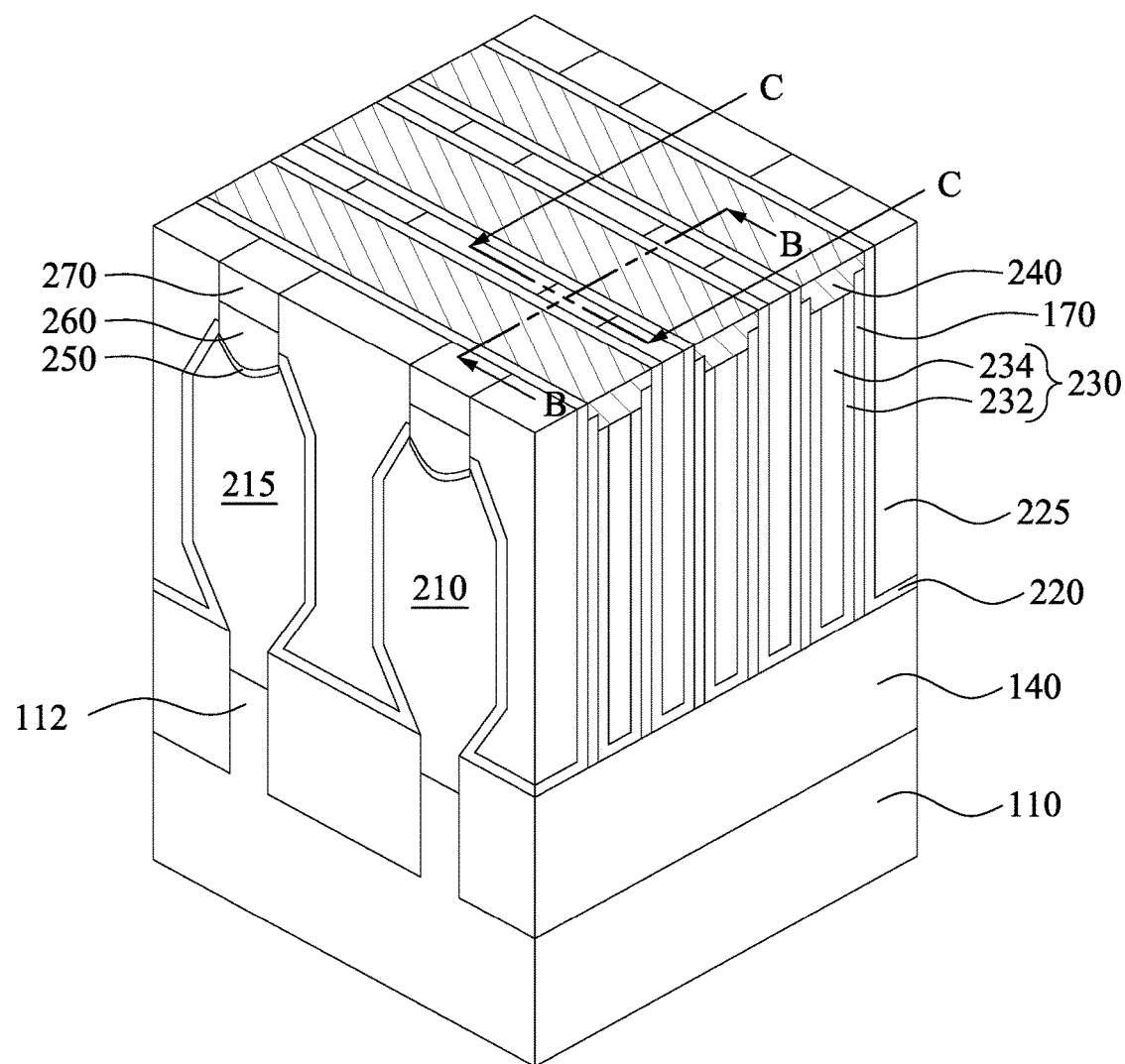

Reference is made to FIG. 11. In some embodiments, the gate structures 230 and (optionally) the gate spacers 170 are recessed, and first front-side dielectric caps 240 are formed over respective gate structures 230 and the gate spacers 170 using, for example, a deposition process to deposit a dielectric material over the substrate 110, followed by a CMP process to remove excess dielectric material outside the gate trenches. In some embodiments, the first front-side dielectric caps 240 include silicon nitride or other suitable dielectric material. In some embodiments, due to the etching selectivity between the gate structures 230 and the gate spacers 170, the etched gate structures 230 and the etched gate spacers 170 have different heights. For example, top surfaces of the etched gate spacers 170 are higher than top surfaces of the etched gate structures 230. The first front-side dielectric caps 240 have different etch selectivity than the first ILD 225, so as to selective etch back the first front-side dielectric caps 240. The first front-side dielectric caps 240 can be used to define self-aligned contact region and thus referred to as SAC structures or a SAC layer.

The first ILD 225 is then patterned to form trenches on opposite sides of the gate structures 230, and then the first CESL 220 is patterned to expose the S/D epitaxial structures 210 and 215. In some embodiments, multiple etching processes are performed to pattern the first ILD 225 and the first CESL 220. The etching processes include dry etching process, wet etching process, or combinations thereof.

In some embodiments, front-side metal alloy layers 250 are respectively formed above the S/D epitaxial structures 210 and 215. The front-side metal alloy layers 250, which may be silicide layers, are respectively formed in the trenches and over the exposed S/D epitaxial structures 210 and 215 by a self-aligned silicide (salicide) process. The silicide process converts the surface portions of the S/D epitaxial structures 210 and 215 into the silicide contacts. Silicide processing involves deposition of a metal that undergoes a silicidation reaction with silicon (Si). In order to form silicide contacts on the S/D epitaxial structures 210 and 215, a metal material is blanket deposited on the S/D epitaxial structures 210 and 215. After heating the wafer to a temperature at which the metal reacts with the silicon of the S/D epitaxial structures 210 and 215 to form contacts, unreacted metal is removed. The silicide contacts remain over the S/D epitaxial structures 210 and 215, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the front-side metal alloy layer 250 may include germanium.

Contacts 260 are then formed in the trenches and above the front-side metal alloy layers 250. As such, the contacts 260 are electrically connected to the S/D epitaxial structures 210 and 215. In some embodiments, the contacts 260 may be made of metal, such as W, Co, Ru, Al, Cu, or other suitable materials. After the deposition of the contacts 260, a planarization process, such as a chemical mechanical planarization (CMP) process, may be then performed. In some embodiments, barrier layers may be formed in the trenches before the formation of the contacts 260. The barrier layers may be made of TiN, TaN, or combinations thereof.

Subsequently, the contacts 260 are etched back and then second front-side dielectric caps 270 are formed above the contacts 260. For example, a deposition process to deposit a dielectric material over the etched contacts 260, followed by a CMP process to remove excess dielectric material outside the recesses above the contacts 260. In some embodiments, the second front-side dielectric caps 270 include silicon nitride or other suitable dielectric material. The second front-side dielectric caps 270 have different etch selectivity than the first ILD 225, so as to selective etch back the second front-side dielectric caps 270. The second front-side dielectric caps 270 can be used to define self-aligned contact region and thus referred to as SAC structures or a SAC layer.

Figure 12A:
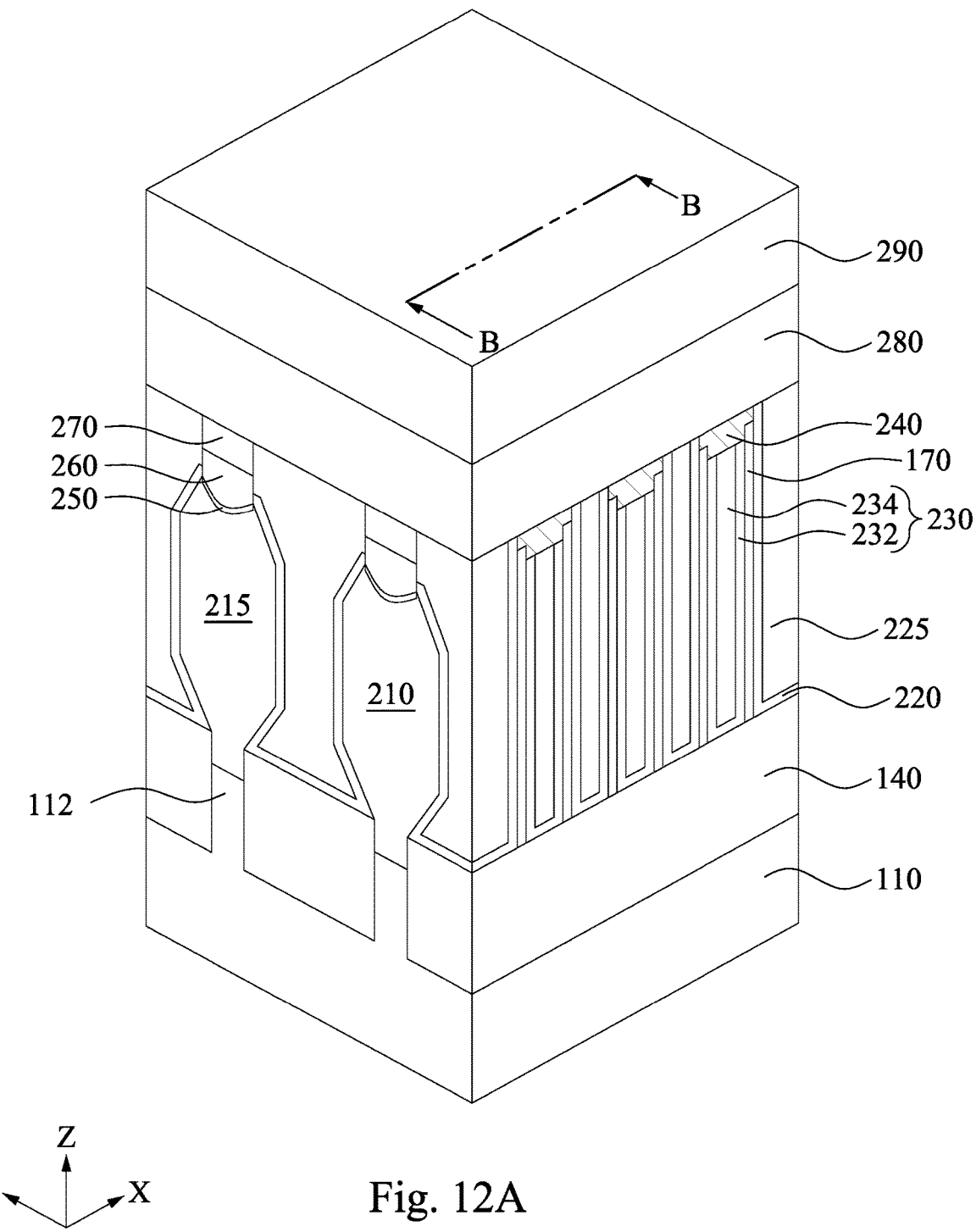
Figure 12B:
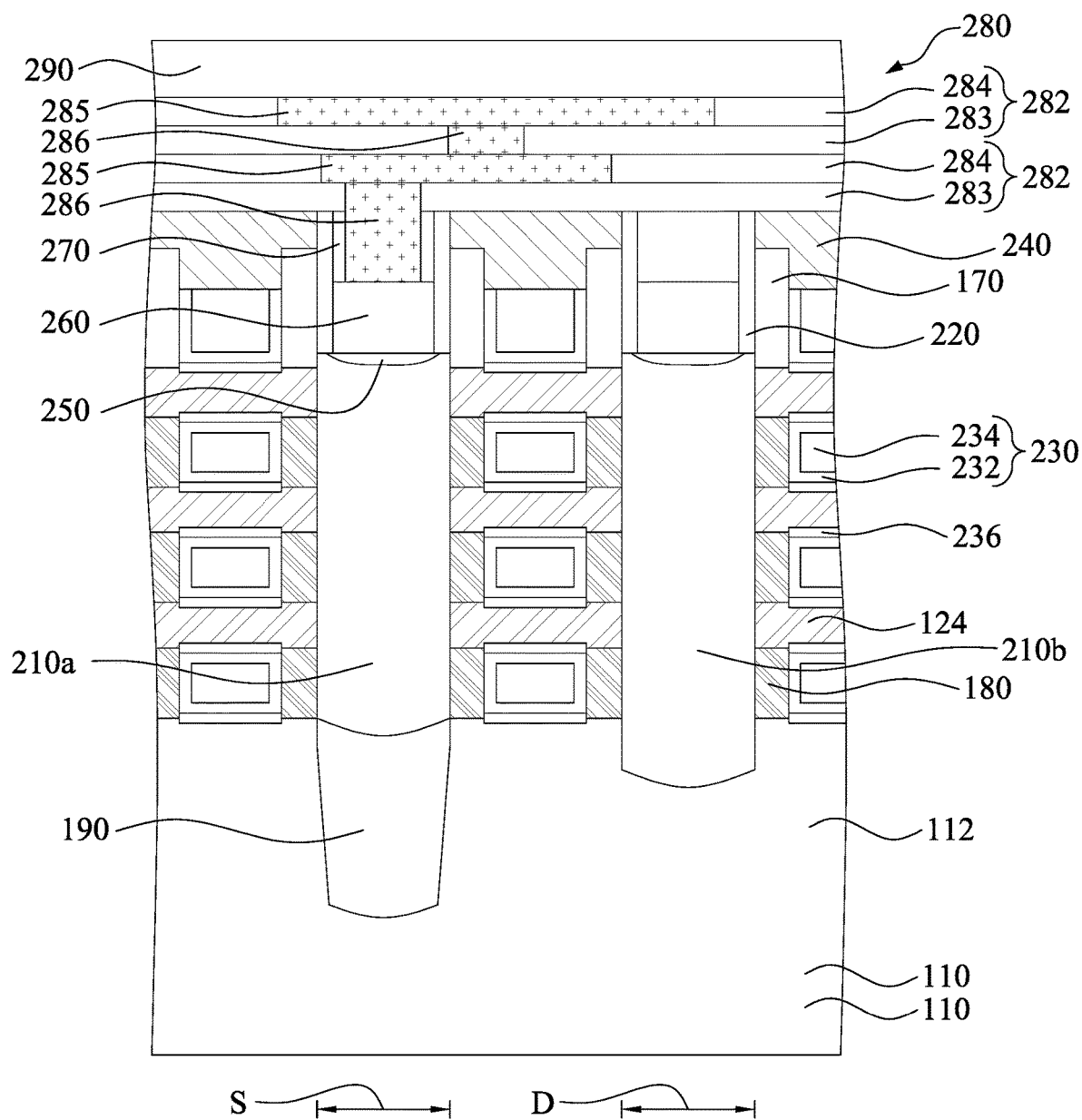

Reference is made to FIGS. 12A and 12B, where FIG. 12B is a cross-sectional view taken along line B-B of FIG. 12A. A front-side multilayer interconnection (MLI) structure 280 is formed over the substrate 110. The front-side MLI structure 280 may include a plurality of front-side metallization layers 282. The number of front-side metallization layers 282 may vary according to design specifications of the integrated circuit structure. Only two front-side metallization layers 282 are illustrated in FIG. 12B for the sake of simplicity. The front-side metallization layers 282 each includes a first front-side inter-metal dielectric (IMD) layer 283 and a second front-side IMD layer 284. The second front-side IMD layers 284 are formed over the corresponding first front-side IMD layers 283. The front-side metallization layers 282 include one or more horizontal interconnects, such as front-side metal lines 285, respectively extending horizontally or laterally in the second front-side IMD layers 284 and vertical interconnects, such as front-side conductive vias 286, respectively extending vertically in the first front-side IMD layers 283.

In some embodiments, a front-side conductive via 286 in a bottommost front-side metallization layer 282 is in contact with one of the contacts 260 to make electrical connection to the source epitaxial structure 215, and in some embodiments, another front-side conductive via 286 in the bottommost front-side metallization layer (not shown) is in contact with another of the contacts 260 to make electrical connection to the drain epitaxial structure 210. Further, still some other front-side conductive vias (not shown) in the bottom-most front-side metallization layer 282 are in contact with the gate structures 230.

The front-side metal lines 285 and front-side metal vias 286 can be formed using, for example, a single damascene process, a dual damascene process, the like, or combinations thereof. In some embodiments, the front-side IMD layers 283-284 may include low-k dielectric materials having k values, for example, lower than about 4.0 or even 2.0 disposed between such conductive features. In some embodiments, the front-side IMD layers 283-284 may be made of, for example, phosphosilicate glass (PSG), boro-phosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 285 and 286 may include metal materials such as copper, aluminum, tungsten, combinations thereof, or the like. In some embodiments, the front-side metal lines and vias 285 and 286 may further include one or more barrier/adhesion layers (not shown) to protect the respective front-side IMD layers 283-284 from metal diffusion (e.g., copper diffusion) and metallic poisoning. The one or more barrier/adhesion layers may include titanium, titanium nitride, tantalum, tantalum nitride, or the like, and may be formed using physical vapor deposition (PVD), CVD, ALD, or the like.

Subsequently, a carrier substrate 290 is bonded to the front-side MLI structure 280 in accordance with some embodiments of the present disclosure. The carrier substrate 290 may be silicon, doped or undoped, or may include other semiconductor materials, such as germanium; a compound semiconductor; or combinations thereof. The carrier substrate 290 may provide a structural support during subsequent processing on backside of the integrated circuit structure and may remain in the final product in some embodiments. In some other embodiments, the carrier substrate 290 may be removed after the subsequent processing on backside of the integrated circuit structure is complete. In some embodiments, the carrier substrate 290 is bonded to a topmost dielectric layer of the MLI structure 280 by, for example, fusion bonding.

Figure 13:
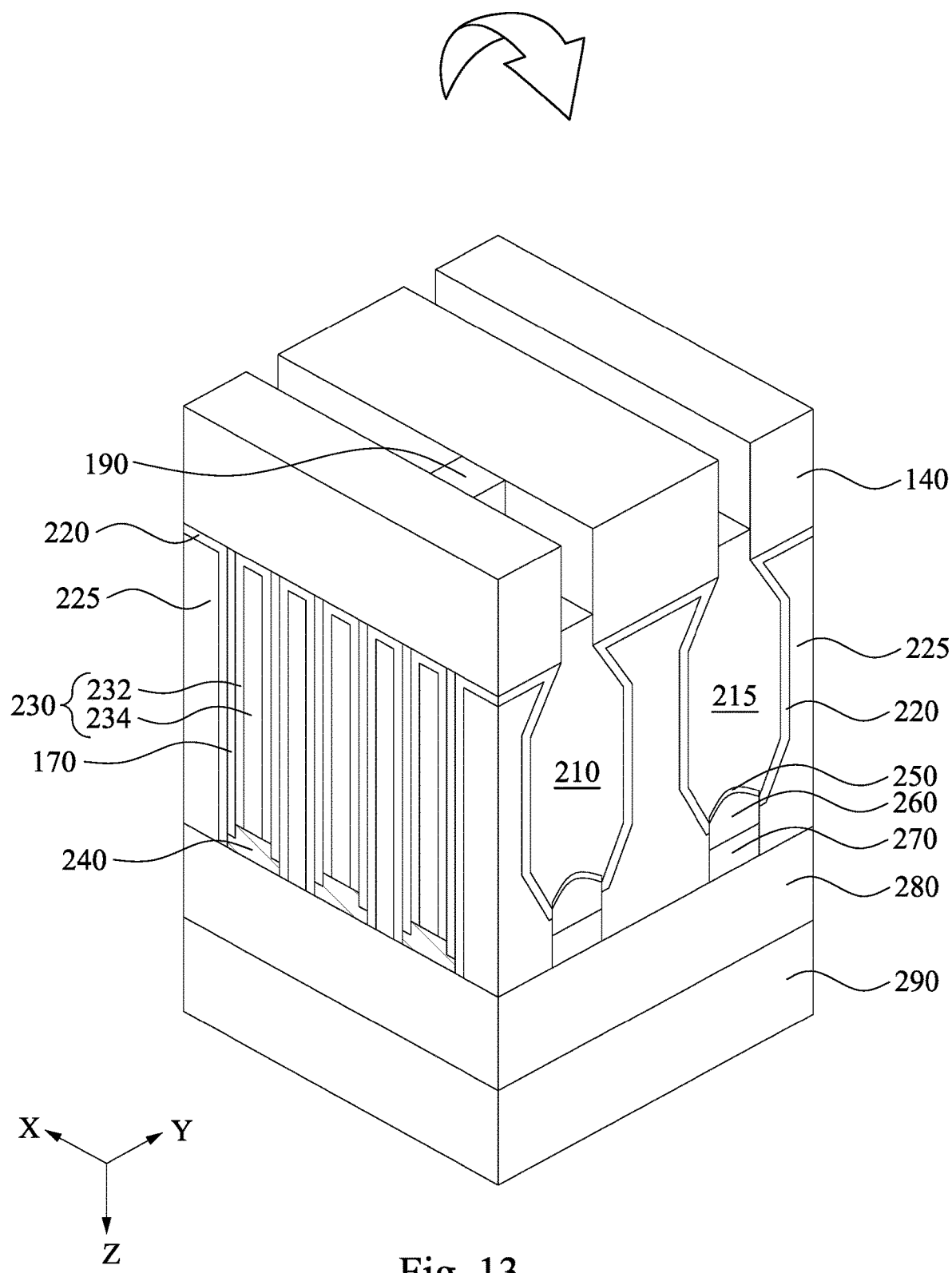

Reference is made to FIG. 13. The structure of FIG. 12A is "flipped" upside down, and the substrate 110 (see FIG. 12A) is removed. As such, the sacrificial epitaxial plug 190 and other epitaxial structures 210 and 215 not in contact with the sacrificial epitaxial plug 190 are exposed. In some embodiments, the removal processes include thinning down the substrate 110 from the backside thereof until the sacrificial epitaxial plug 190 is exposed. The substrate 110 is then removed by using a selective etching process that etches the substrate 110 at a faster etch rate that it etches the sacrificial epitaxial plug 190 (e.g., SiGe) and the isolation structure 140 (e.g., dielectric materials). In some embodiments, the selective etching process for selectively removing the substrate 110 may be a wet etching process using an wet etching solution such as tetramethylammonium hydroxide (TMAH), potassium hydroxide (KOH), $NH_4OH$, the like or combinations thereof.

Figure 14:
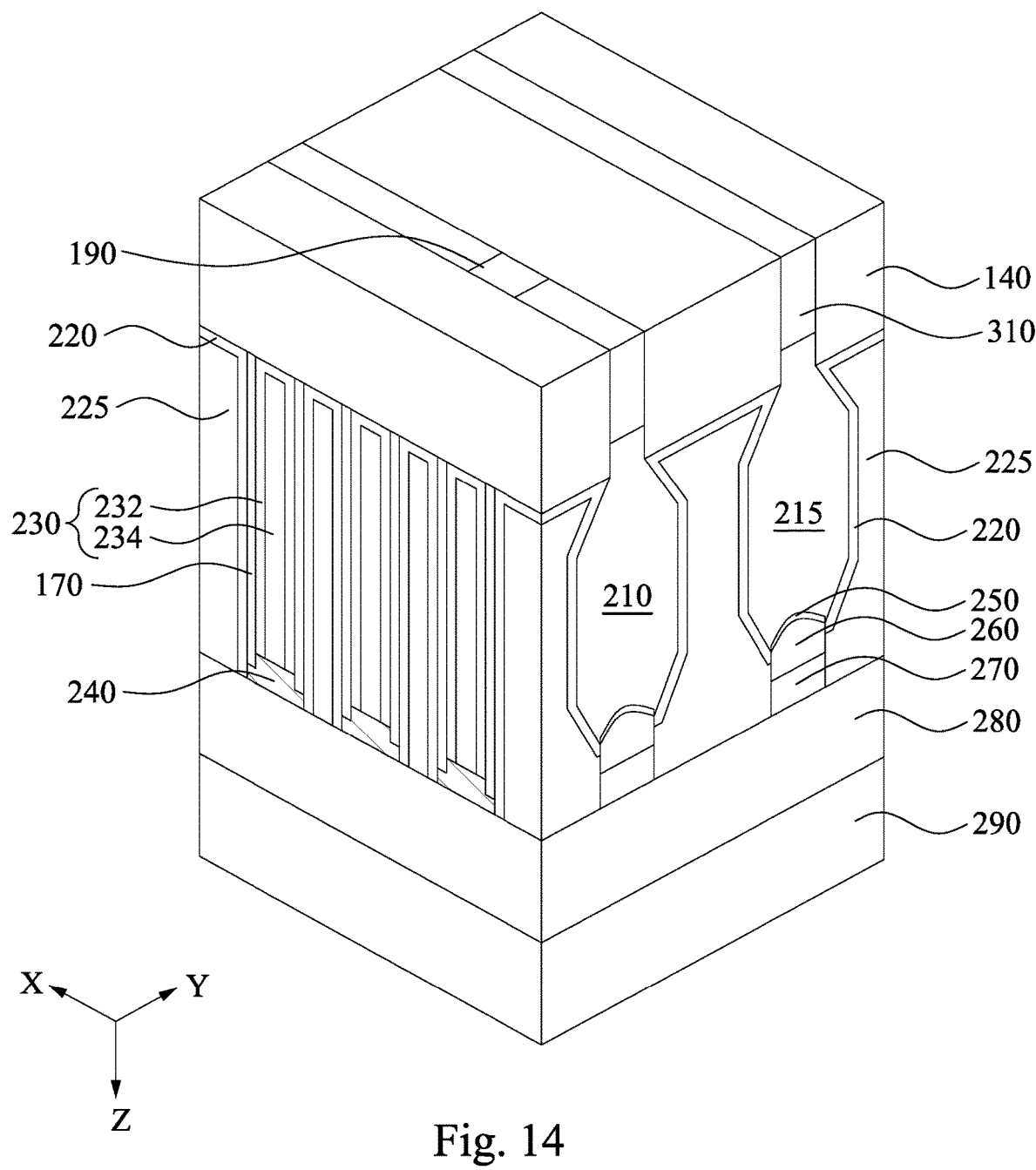

Reference is made to FIG. 14. Isolation materials 310 are formed to fill the rest space between the isolation structures 140. In some embodiments, the isolation materials 310 may be formed, for example, of a low-κ dielectric material (materials having a dielectric constant lower than silicon dioxide), such as silicon oxynitride, phosphosilicate glass (PSG), borophosphosilicate glass (BPSG), fluorinated silicate glass (FSG), $SiO_xC_y$, $SiO_xC_yH_z$, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). Other materials, such as ultra low-κ materials (e.g., having a dielectric constant less than about 2.9), such as κ=2.5-2.6, may also be used. Alternatively, the isolation materials 310 and the isolation structures 140 have substantially the same materials, e.g., oxide materials. These materials and processes are provided as examples and other materials and processes may be used.

Figure 15A:
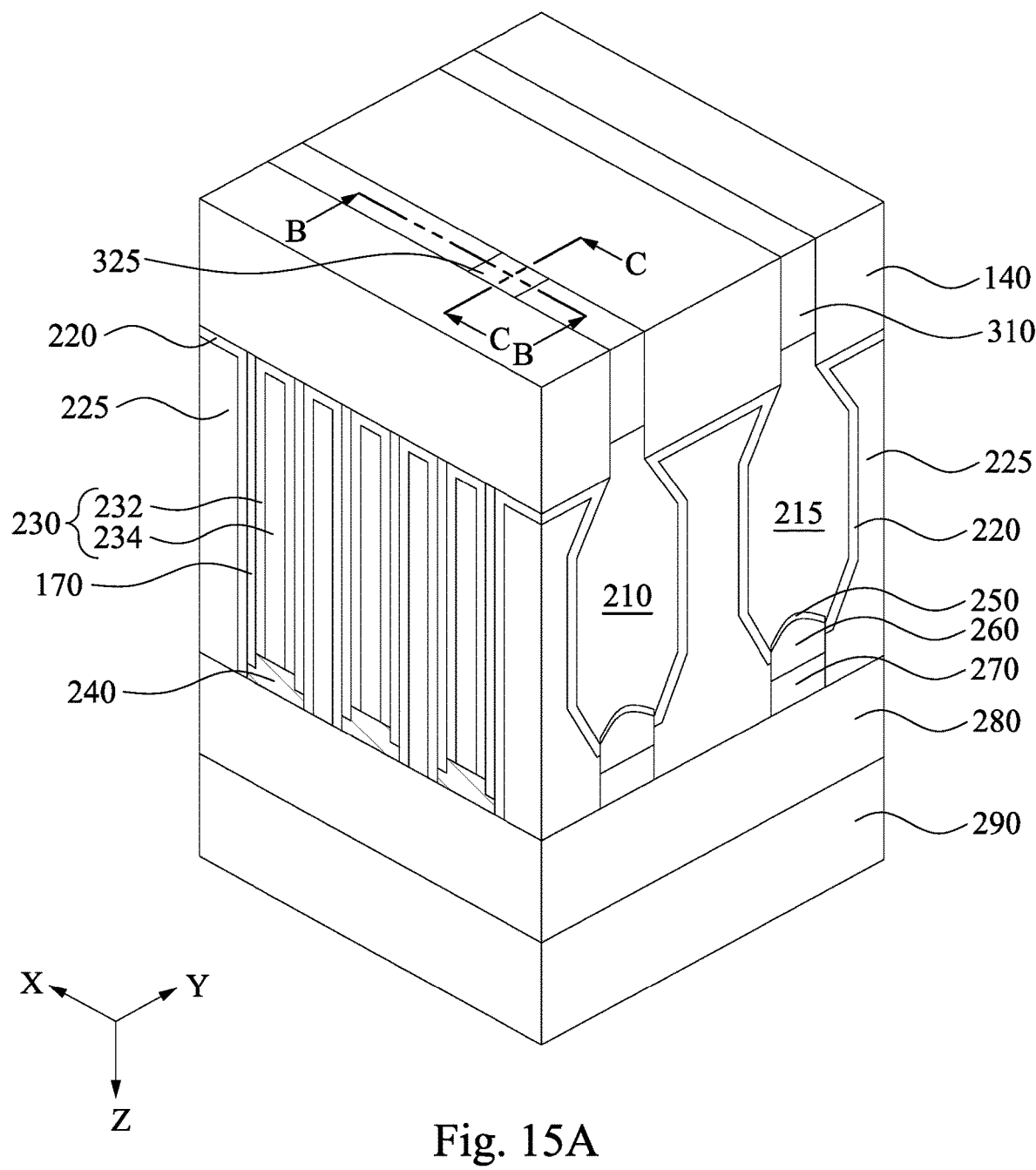
Figure 15B:
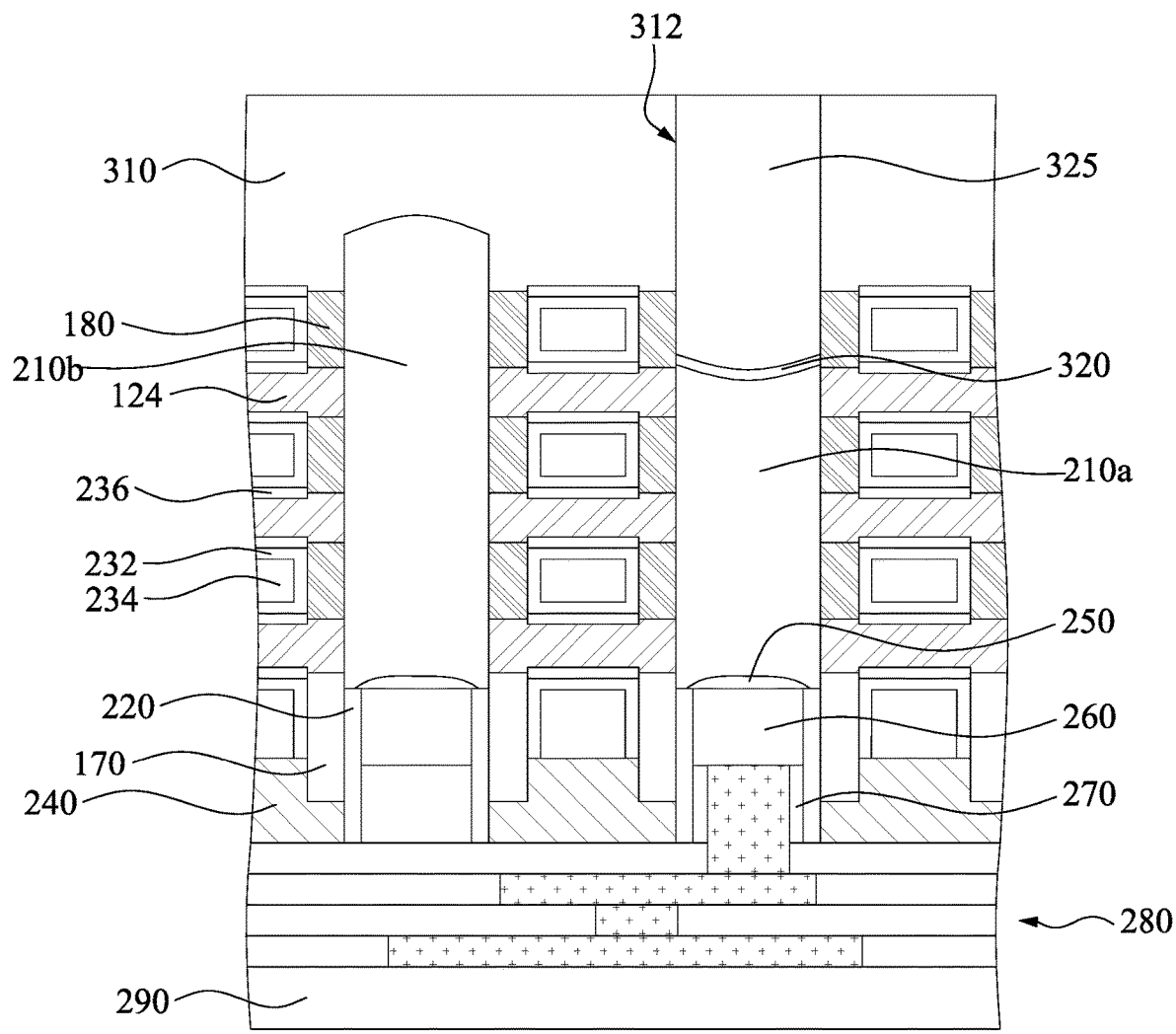
Figure 15C:
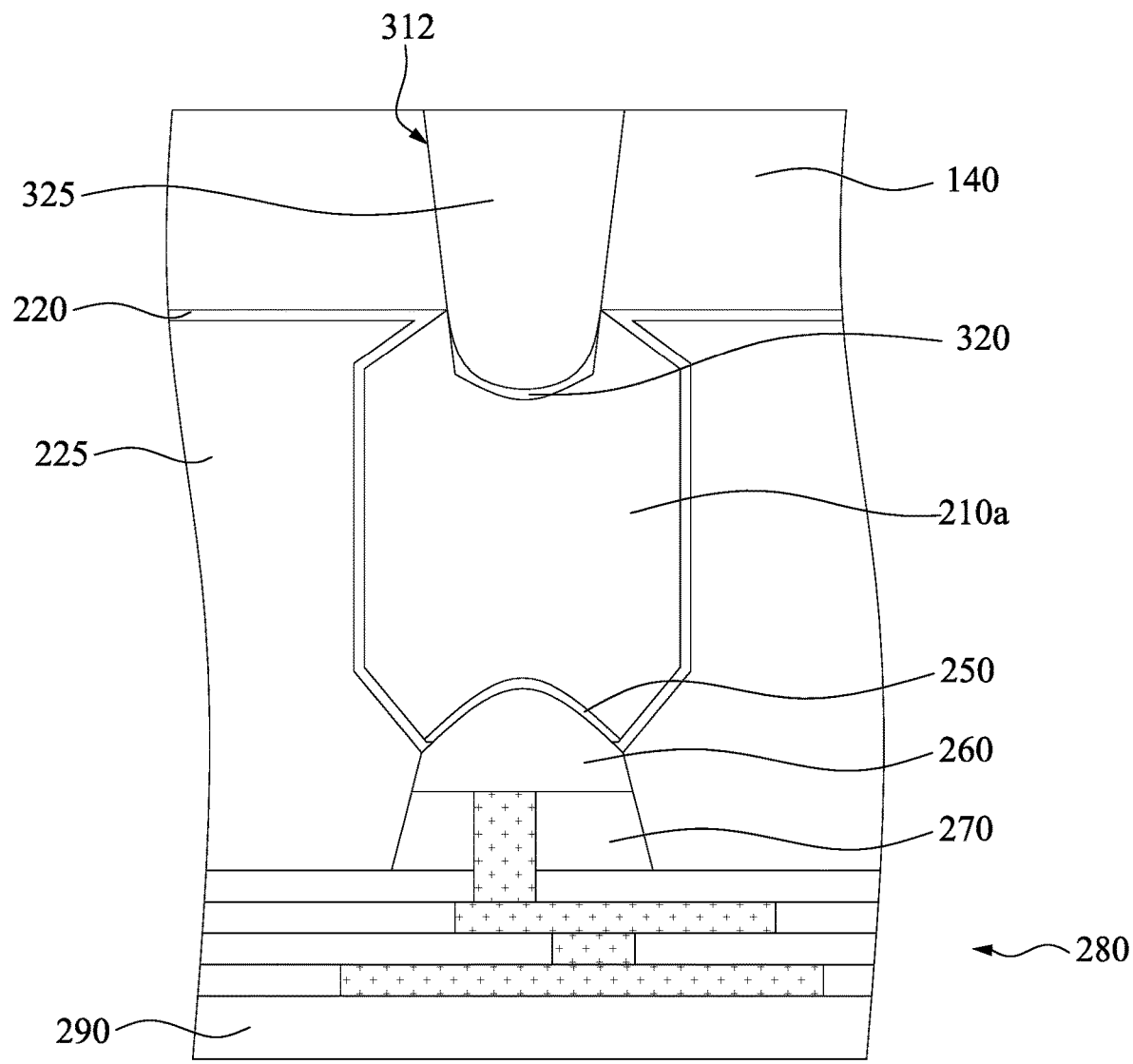

Reference is made to FIGS. 15A-15C, where FIG. 15B is a cross-sectional view taken along line B-B (a first cut) of FIG. 15A, and FIG. 15C is a cross-sectional view taken along line C-C (a second cut) of FIG. 15A. The sacrificial epitaxial plug 190 (see FIG. 14) is replaced with a backside via 325. Specifically, the sacrificial epitaxial plug 190 is removed such that an opening 312 is formed between the isolation materials 310 and between the isolation structures 140. The removal of the sacrificial epitaxial plug 190 is performed using, for example, CMP, HNA, and/or TMAH etching. The removal of the sacrificial epitaxial plug 190 is a selectively etching process, which removes the sacrificial epitaxial plug 190 at an etching rate much higher than an etching rate for etching the isolation structure 140 and the isolation materials 310. Portions of the isolation structure 140, however, may be unintentionally removed as shown in FIGS. 15B and 15C. In some embodiments, the epitaxial structure 210a right under the sacrificial epitaxial plug 190 is partially removed.

At least one backside metal alloy layer 320 is formed above the etched epitaxial structure 210a. The backside metal alloy layer 320, which may be silicide layers, is formed in the opening 312 and over the exposed epitaxial structure 210a by a self-aligned silicide (salicide) process. In some embodiments, the backside metal alloy layer 320 may include a material selected from titanium silicide, cobalt silicide, nickel silicide, platinum silicide, nickel platinum silicide, erbium silicide, palladium silicide, combinations thereof, or other suitable materials. In some embodiments, the backside metal alloy layer 320 may include germanium.

A backside via 325 is then formed in the opening 312 and above the backside metal alloy layer 320. As such, the backside via 325 is electrically connected to the etched epitaxial structure 210a. In some embodiments, the backside via 325 may be made of metal, such as Co, W, Ru, Al, Mo, Ti, TiN, Cu, TaN, Ni, or other suitable materials. After the deposition of the backside via 325, a planarization process, such as a chemical mechanical planarization (CMP) process, may be then performed. In some embodiments, a barrier layer may be formed in the opening 312 before the formation of the backside via 325. The barrier layer may be made of TiN, TaN, or combinations thereof.

Figure 16A:
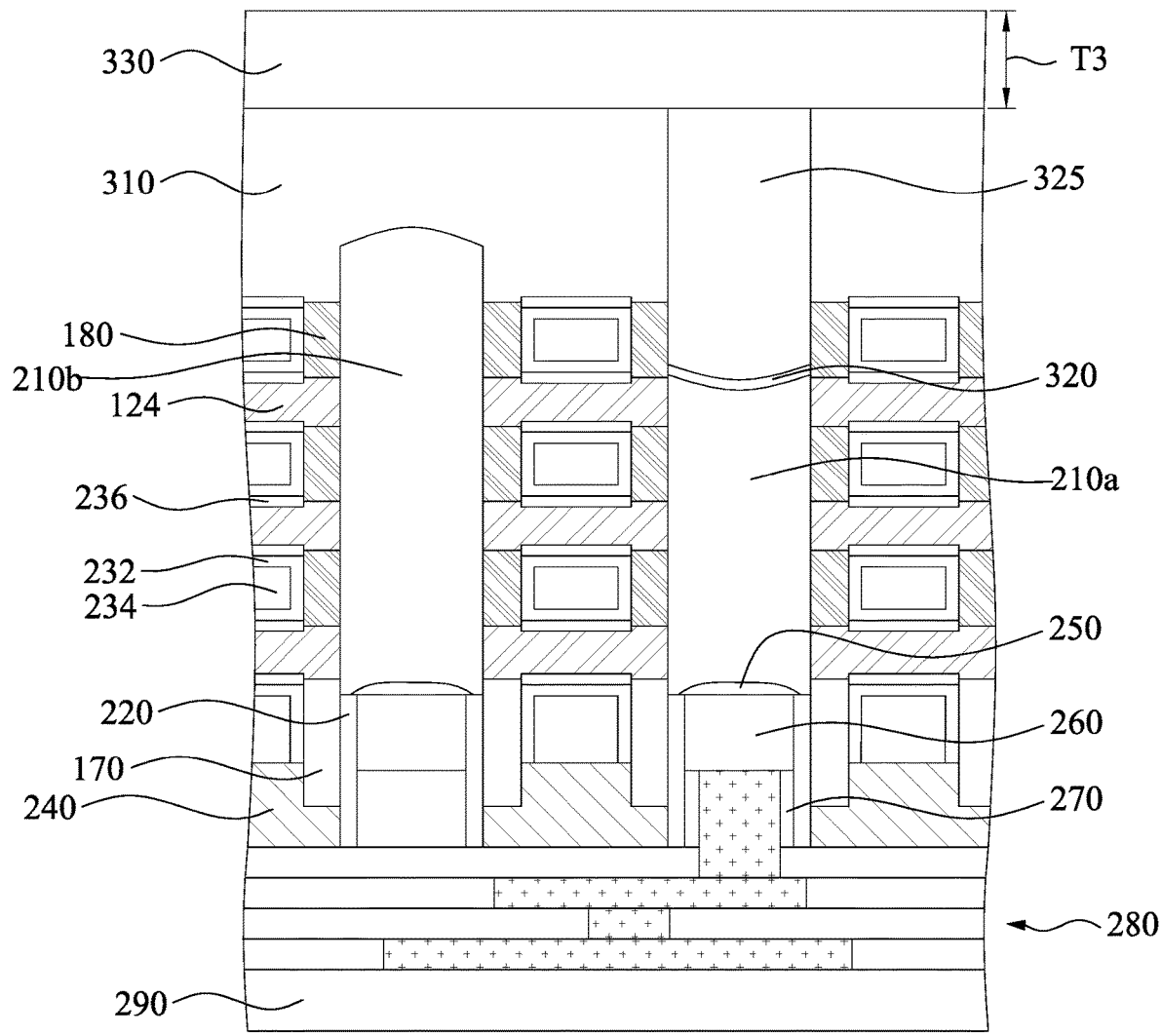
Figure 16B:
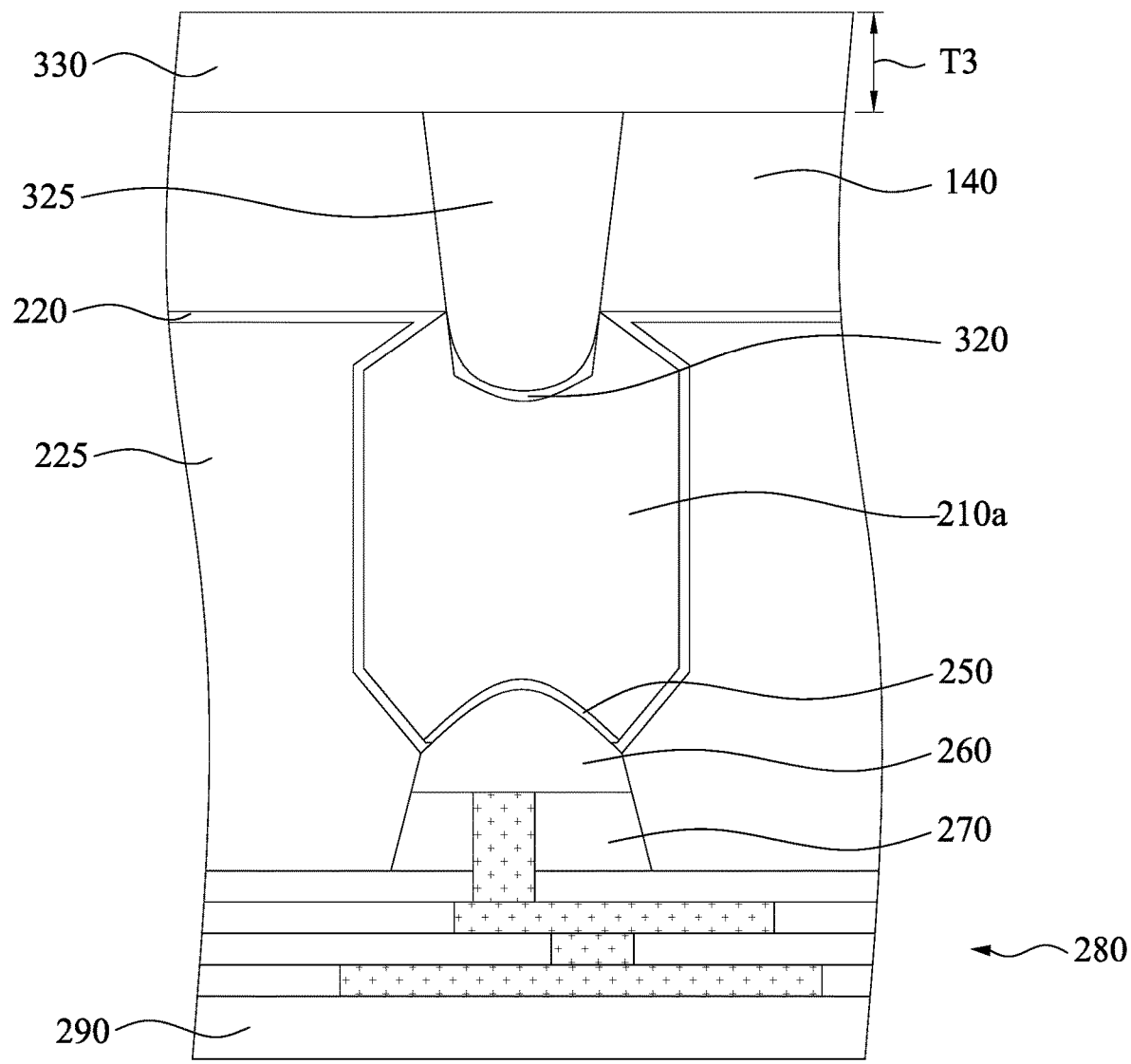

Reference is made to FIGS. 16A and 16B, where FIG. 16A is a cross-sectional view of the integrated circuit structure at various stages taken along the first cut, and FIG. 16B is a cross-sectional view of the integrated circuit structure at various stages taken along the second cut. A second ILD 330 is formed on the backside of the isolation structures 140 and the backside of the isolation materials 310. The "backside" herein is a surface of the isolation structures 140 (the isolation materials 310) opposite to a front-side surface of the isolation structures 140 (the isolation materials 310) facing the gate structures 230. The second ILD 330 also covers the backside of the backside via 325, which is a surface opposite to a surface of the backside via 325 facing the epitaxial structure 210a. In some embodiments, the second ILD 330 is made of dielectric materials, such as silicon carbide (SiC), lanthanum oxide (LaO), aluminum oxide (AlO), aluminum oxynitride (AlON), zirconium oxide (ZrO), hafnium oxide (HfO), silicon nitride (SiN), silicon (Si), zinc oxide (ZnO), zirconium nitride (ZrN), zirconium aluminum oxide (ZrAlO), titanium oxide (TiO), tantalum oxide (TaO), yttrium oxide (YO), tantalum carbonitride (TaCN), zirconium silicide (ZrSi), silicon oxycarbonitride (SiOCN), silicon oxycarbide (SiOC), silicon carbonitride (SiCN), hafnium silicide (HfSi), lanthanum oxide (LaO), silicon oxide (SiO), combinations or multiple layers thereof, or the like, formed by any suitable method, such as spin-on coating, chemical vapor deposition (CVD), plasma-enhanced CVD (PECVD), or the like. In some embodiments, a thickness T3 of the second ILD 330 is in a range of about 1 nm to about 20 nm.

Figure 17A:
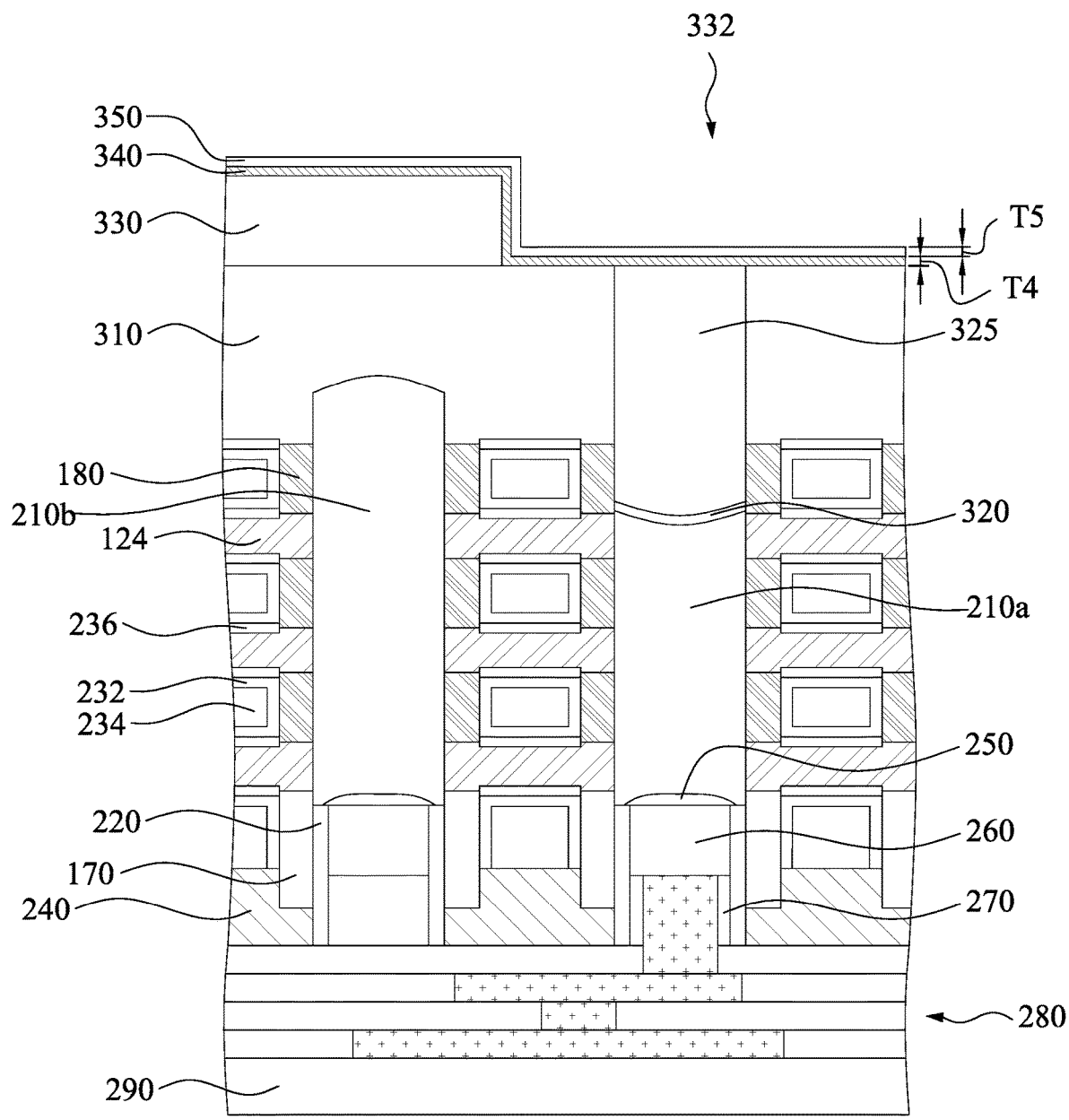
Figure 17B:
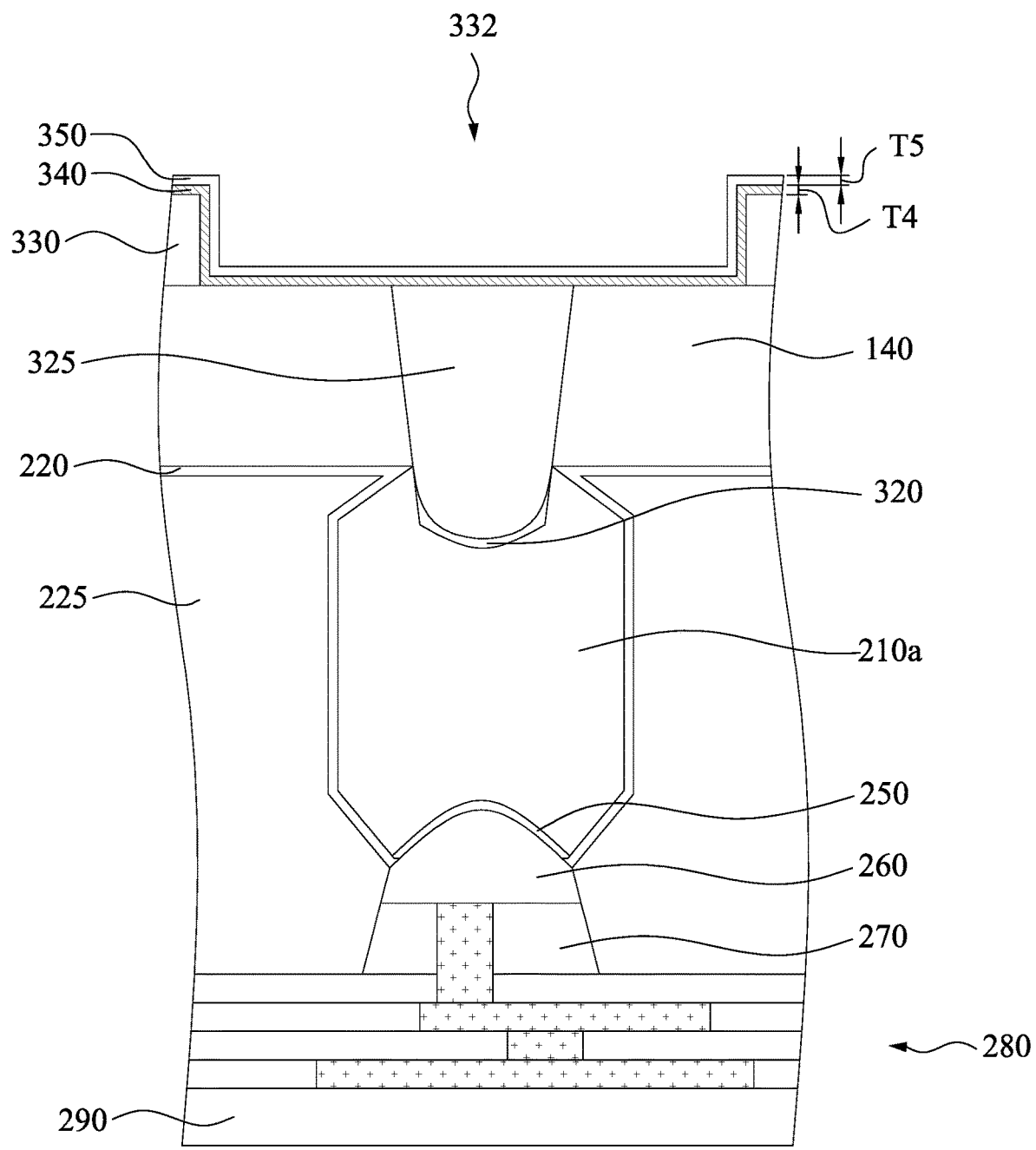

Reference is made to FIGS. 17A and 17B. An opening 332 is formed in the second ILD 330 to expose at least the backside via 325. For example, a photoresist (not shown) is formed to cover the second ILD 330. The photoresist is then patterned to form an opening therein to expose a portion of the second ILD 330, and the second ILD 330 is patterned by using the patterned photoresist as an etching mask to form the second ILD 330 with the opening 332.

Subsequently, a first spacer layer 340 and a dummy spacer layer 350 are sequentially and conformally formed in the opening 332. As such, the first spacer layer 340 is in contact with the second ILD 330, the backside via 325, the isolation structures 140, and the isolation materials 310, and the dummy spacer layer 350 is in contact with the first spacer layer 340. The dummy spacer layer 350 is made of a material that has etching selectivity to that of the first spacer layer 340.

In some embodiments, the first spacer layer 340 is made of dielectric materials, such as silicon carbide (SiC), lanthanum oxide (LaO), aluminum oxide (AlO), aluminum oxynitride (AlON), zirconium oxide (ZrO), hafnium oxide (HfO), silicon nitride (SiN), silicon (Si), zinc oxide (ZnO), zirconium nitride (ZrN), zirconium aluminum oxide (ZrAlO), titanium oxide (TiO), tantalum oxide (TaO), yttrium oxide (YO), tantalum carbonitride (TaCN), zirconium silicide (ZrSi), silicon oxycarbonitride (SiOCN), silicon oxycarbide (SiOC), silicon carbonitride (SiCN), hafnium silicide (HfSi), lanthanum oxide (LaO), silicon oxide (SiO), combinations or multiple layers thereof, or the like, formed by any suitable method, such as CVD, ALD, PVD, PECVD, or the like. The thickness T4 of the first spacer layer 340 is in a range of about 0.5 nm to about 10 nm. If the thickness T4 of the first spacer layer 340 is greater than about 10 nm, the window for depositing the conductive feature 375 (see FIGS. 20A and 20B) may be small.

In some embodiments, the dummy spacer layer 350 is made of dielectric materials, such as silicon carbide (SiC), lanthanum oxide (LaO), aluminum oxide (AlO), aluminum oxynitride (AlON), zirconium oxide (ZrO), hafnium oxide (HfO), silicon nitride (SiN), silicon (Si), zinc oxide (ZnO), zirconium nitride (ZrN), zirconium aluminum oxide (ZrAlO), titanium oxide (TiO), tantalum oxide (TaO), yttrium oxide (YO), tantalum carbonitride (TaCN), zirconium silicide (ZrSi), silicon oxycarbonitride (SiOCN), silicon oxycarbide (SiOC), silicon carbonitride (SiCN), hafnium silicide (HfSi), silicon oxide (SiO), combinations or multiple layers thereof, or the like, formed by any suitable method, such as CVD, ALD, PVD, PECVD, or the like. The first spacer layer 340 and the dummy spacer layer 350 may be formed with different material compositions such that the dummy spacer layer 350 may be selectively etched in subsequent processing operations. The thickness T5 of the dummy spacer layer 350 is in a range of about 0.5 nm to about 6 nm. If the thickness T5 of the dummy spacer layer 350 is greater than about 6 nm, the window for depositing the conductive feature 375 (see FIGS. 20A and 20B) may be small.

Figure 18A:
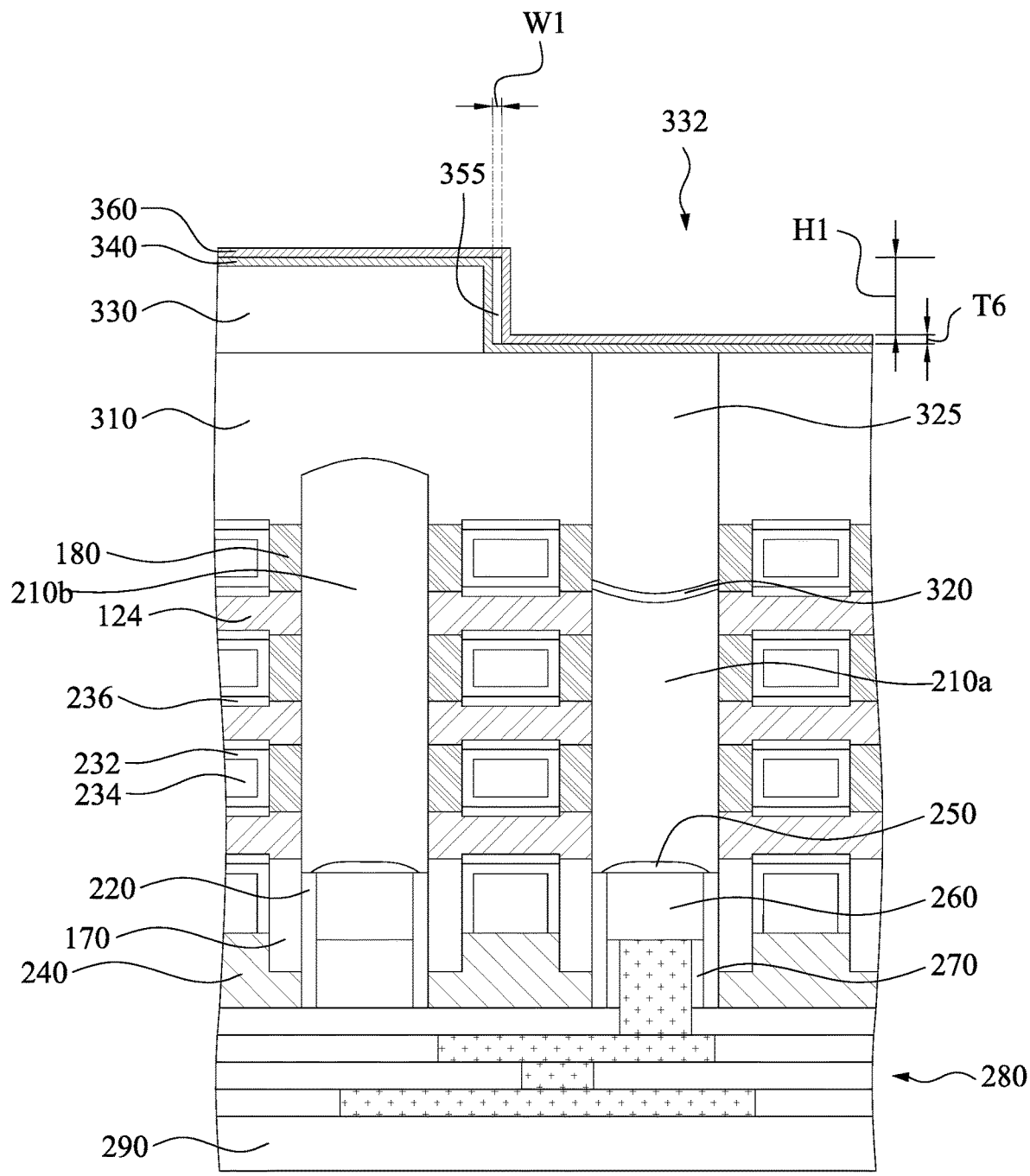
Figure 18B:
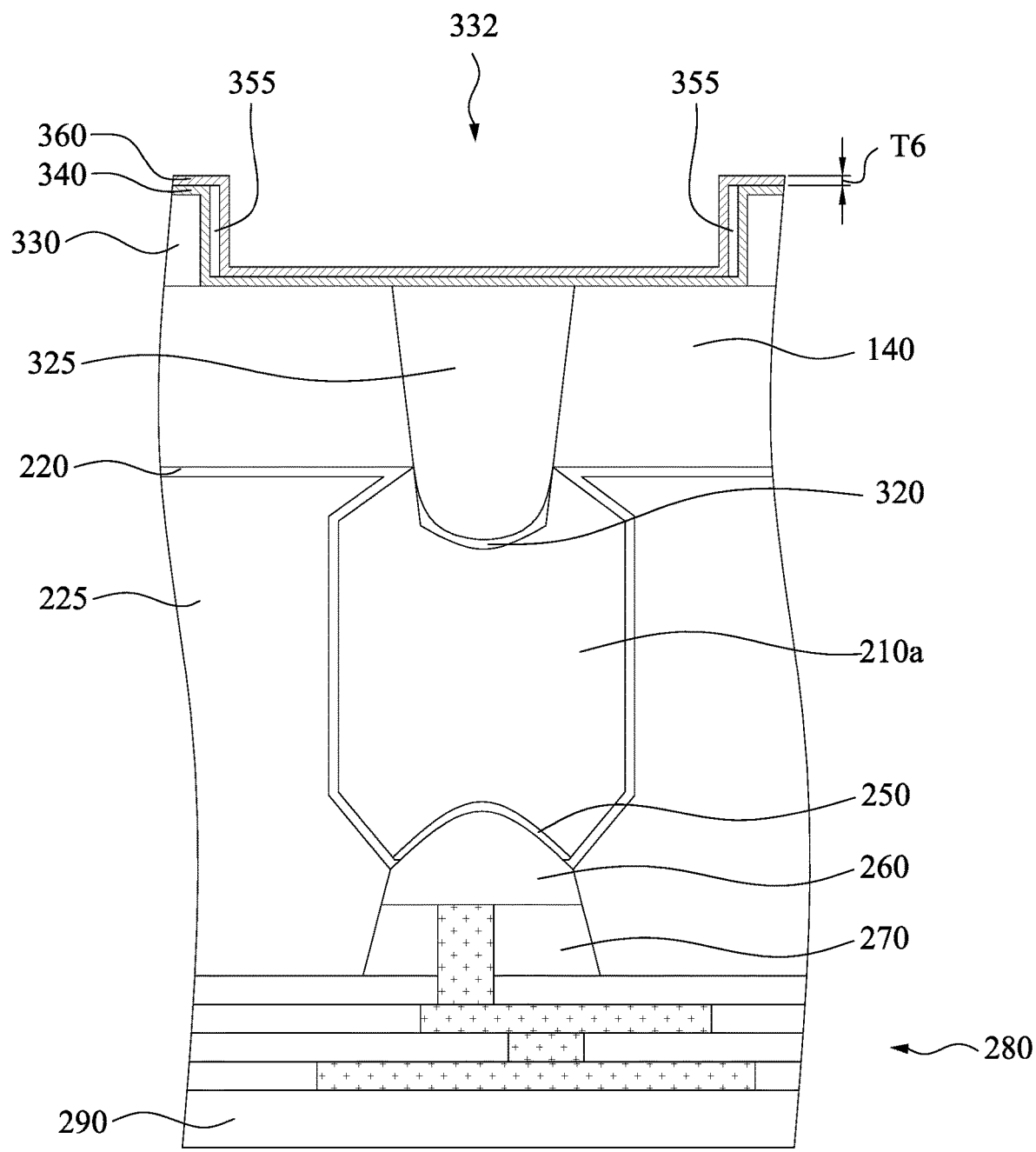

Reference is made to FIGS. 18A and 18B. Horizontal portions of the dummy spacer layer 350 are removed using an anisotropic etching process (e.g., a dry etching process) to form a dummy spacer 355 on sidewalls of the opening 332. During the anisotropic etching process, most of the dummy spacer layer 350 is removed from horizontal surfaces, leaving the dummy spacer layer 350 on the vertical surfaces such as the sidewalls of the first spacer layer 340. Since the dummy spacer layer 350 is made of a material that has etching selectivity to that of the first spacer layer 340 as mentioned above, the first spacer layer 340 protect the second ILD 330, the isolation structures 140, and the isolation materials 310 from the etchant used in etching the dummy spacer layer 350. In some embodiments, the dummy spacer layer 350 includes silicon dioxide ($SiO_2$) and the first spacer layer 340 includes silicon nitride (SiN), aluminum oxide ($AlO_x$), silicon oxycarbide (SiOC), or the like. In some embodiments, the dummy spacer layer 350 includes silicon nitride (SiN) and the first spacer layer 340 includes silicon dioxide ($SiO_2$), aluminum oxide (AlOx), silicon oxycarbide (SiOC), or the like.

In some embodiments, the etching process may include etchants such as $C_4H_6$, which may be mixed with hydrogen ($H_2$), oxygen ($O_2$), combinations thereof, or the like. The etchants may be supplied at a flowrate from about 5 sccm to about 200 sccm. The etch-back process may be performed in a chamber at a pressure from about 1 mTorr to about 100 mTorr, for a period from about 5 seconds to about 60 seconds, with a bias voltage from about 200 V to about 1,000 V, and with a plasma power from about 50 W to about 250 W. Following the etching process, the dummy spacer 355 may have widths W1 from about 0.5 nm to about 6 nm, heights H1 from about 1 nm to about 20 nm, and ratios of the heights H1 to the widths W1 may be from about 1 to about 3. Forming the dummy spacer 355 having the prescribed dimensions allows for recesses formed by subsequently removing the dummy spacer 355 to be sealed to form air gaps adjacent the conductive lines 143. Forming air spacers in the layer including the conductive lines 143 and between adjacent conductive lines 143 improves isolation of the conductive feature 375 (see FIGS. 20A and 20B), which reduces coupling capacitance and allows for increased device speeds.

Subsequently, a second spacer layer 360 is conformally formed in the opening 332 and on the first spacer layer 340 and the dummy spacer 355. As such, the second spacer layer 360 is in contact with the first spacer layer 340 and the dummy spacer 355. The second spacer layer 360 is made of a material that has etching selectivity to that of the first spacer layer 340. The second spacer layer 360 and the first spacer layer 340 have the same or different materials. For example, the second spacer layer 360 is made of dielectric materials, such as silicon carbide (SiC), lanthanum oxide (LaO), aluminum oxide (AlO), aluminum oxynitride (AlON), zirconium oxide (ZrO), hafnium oxide (HfO), silicon nitride (SiN), silicon (Si), zinc oxide (ZnO), zirconium nitride (ZrN), zirconium aluminum oxide (ZrAlO), titanium oxide (TiO), tantalum oxide (TaO), yttrium oxide (YO), tantalum carbonitride (TaCN), zirconium silicide (ZrSi), silicon oxycarbonitride (SiOCN), silicon oxycarbide (SiOC), silicon carbonitride (SiCN), hafnium silicide (HfSi), silicon oxide (SiO), combinations or multiple layers thereof, or the like, formed by any suitable method, such as CVD, ALD, PVD, PECVD, or the like. The thickness T6 of the second spacer layer 360 is in a range of about 0.5 nm to about 6 nm. If the thickness T6 of the second spacer layer 360 is greater than about 6 nm, the window for depositing the conductive feature 375 (see FIGS. 20A and 20B) may be small.

Figure 19A:
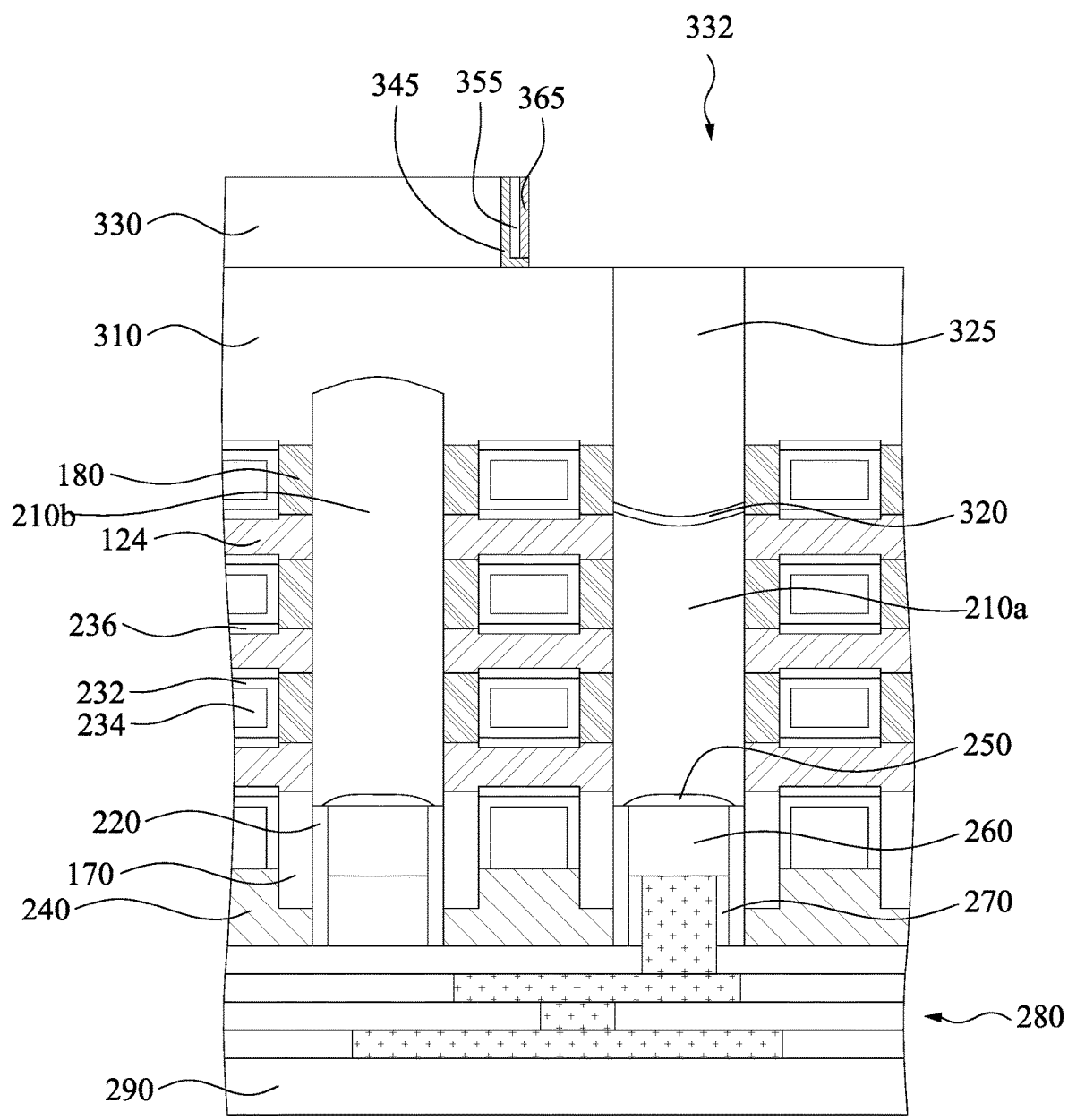
Figure 19B:
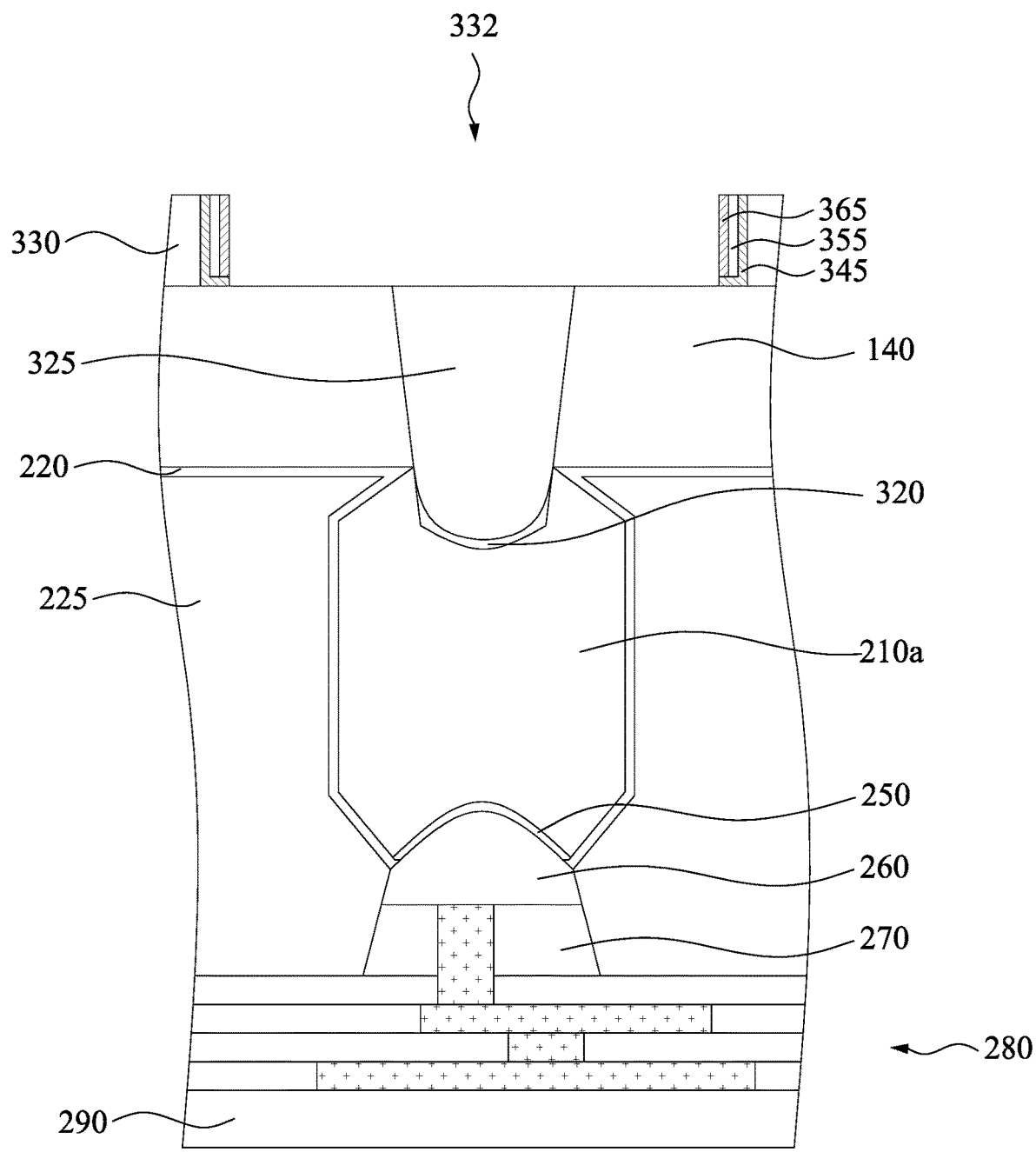

Reference is made to FIGS. 19A and 19B. Horizontal portions of the first spacer layer 340 and the second spacer layer 360 are removed using an anisotropic etching process (e.g., a dry etching process) to form a first spacer 345 and a second spacer 365 on sidewalls of the opening 332. During the anisotropic etching process, most of the first spacer layer 340 and the second spacer layer 360 are removed from horizontal surfaces, leaving the first spacer layer 340 and the second spacer layer 360 on the vertical surfaces such as the sidewalls of the dummy spacer 355. Since the dummy spacer 355 is made of a material that has etching selectivity to that of the first spacer layer 340 and the second spacer layer 360, the dummy spacer 355 remains on the sidewalls of the opening 332 during the etching process in FIGS. 19A and 19B. In some embodiments, the etching process may include etchants such as $O_2$, HF, HCl, and/or HBr, which may be mixed with $H_2$, He, and/or Ar, or the like. After the etching process in FIGS. 19A and 19B, the backside via 325 is exposed from the opening 332 again.

Figure 20A:
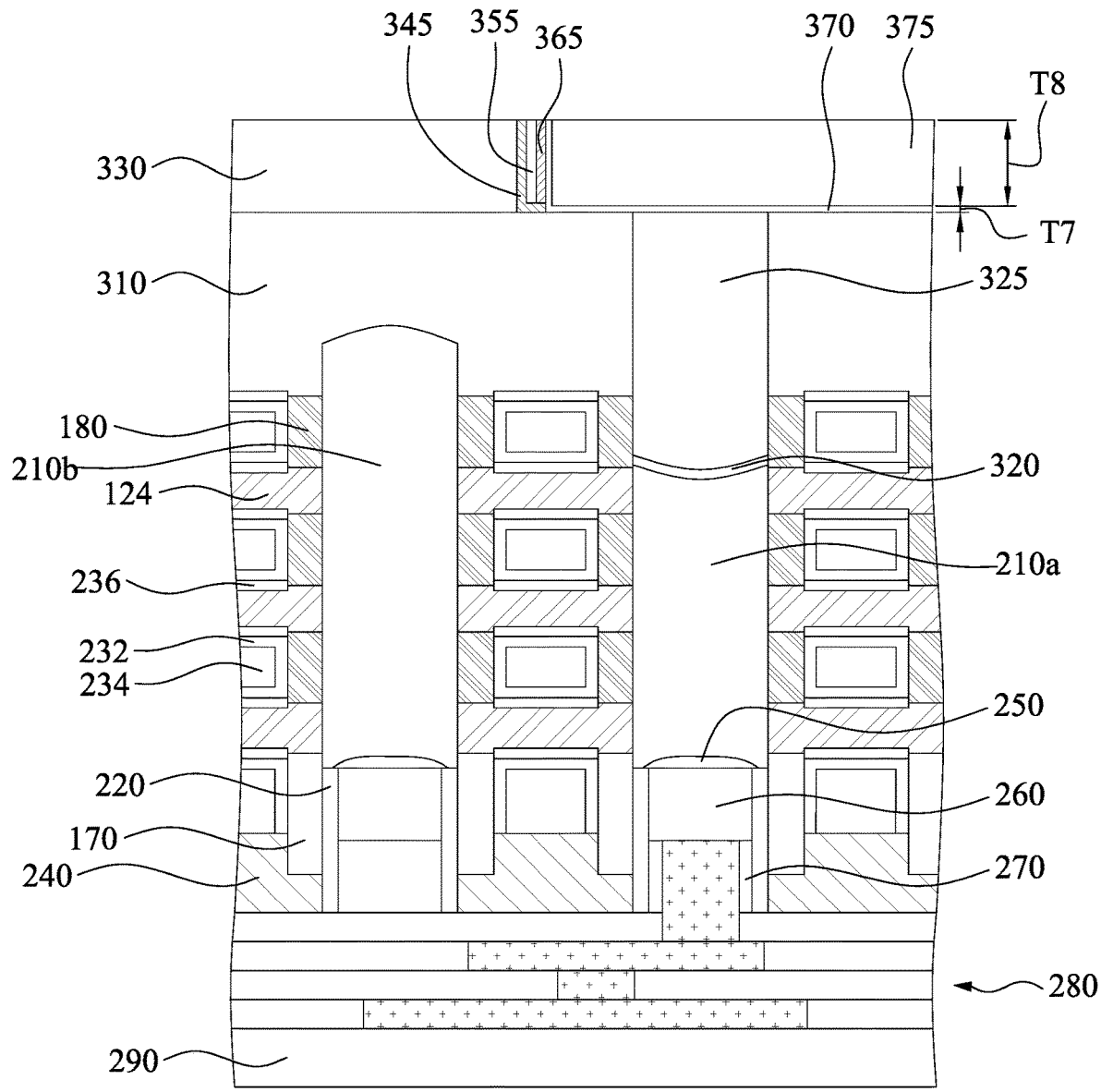
Figure 20B:
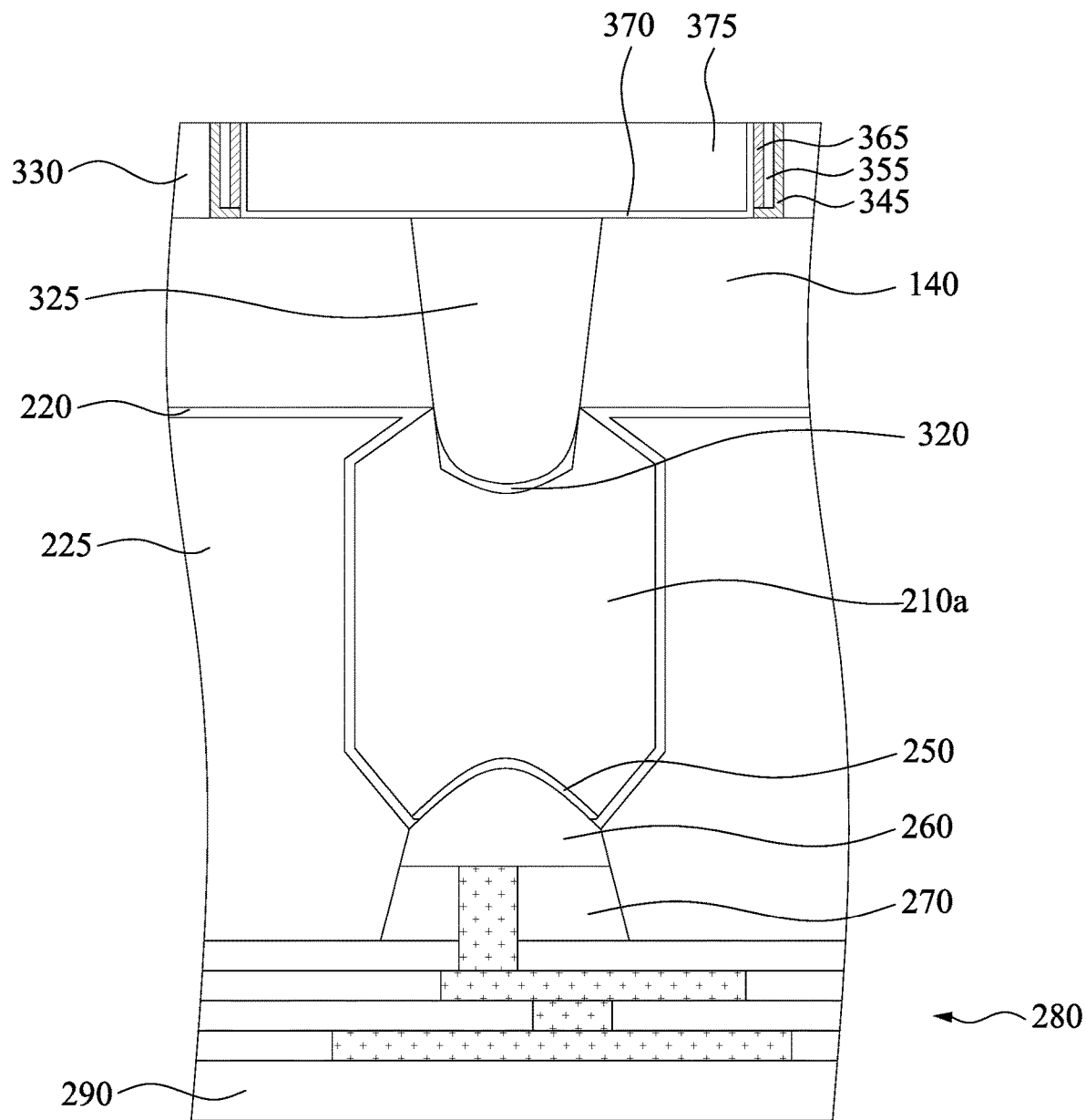

Reference is made to FIGS. 20A and 20B. A barrier layer 370 is conformally formed in the remained opening 332 (see FIGS. 19A and 19B), such that the barrier layer 370 covers and is in contact with the backside via 325, the isolation structures 140, the isolation materials 310, the first spacer 345, and the second spacer 365. In some embodiments, the barrier layer 370 is a metal-containing layer including Co, W, Ru, Al, Mo, Ti, TiN, TiSi, CoSi, NiSi, Cu, Ta, TaN, Ni, TiSiN, or combinations thereof. The barrier layer 370 may be formed using methods such as physical vapor deposition (PVD), sputtering, chemical vapor deposition (CVD), atomic layer deposition (ALD), and the like. The barrier layer 370 includes a single layer or multiple (e.g., double or triple) layers. In some embodiments, a thickness T7 of the barrier layer 370 is in a range of about 0.5 nm to about 10 nm. If the thickness T7 of the barrier layer 370 is greater than about 10 nm, the window for depositing the conductive feature 375 may be small. Subsequently, a conductive feature 375 is formed on the barrier layer 370 and fills in the opening 332. The conductive feature 375 is a metal-containing layer including Co, W, Ru, Al, Mo, Ti, TiN, TiSi, CoSi, NiSi, Cu, Ta, TaN, Ni, TiSiN, or combinations thereof. In some embodiments, a thickness T8 of the conductive feature 375 is in a range of about 0.5 nm to about 10 nm.

In some embodiments, a barrier film and a filling material are sequentially deposited in the opening 332 and a planarization process, e.g., a chemical mechanical polishing (CMP) process, is performed after the formation of the barrier film and the filling material to remove the excess portions of the barrier film and the filling material outside the opening 332, thus forming the barrier layer 370 and the conductive feature 375 and exposing the second ILD 330, the first spacer 345, the dummy spacer 355, and the second spacer 365.

Figure 21A:
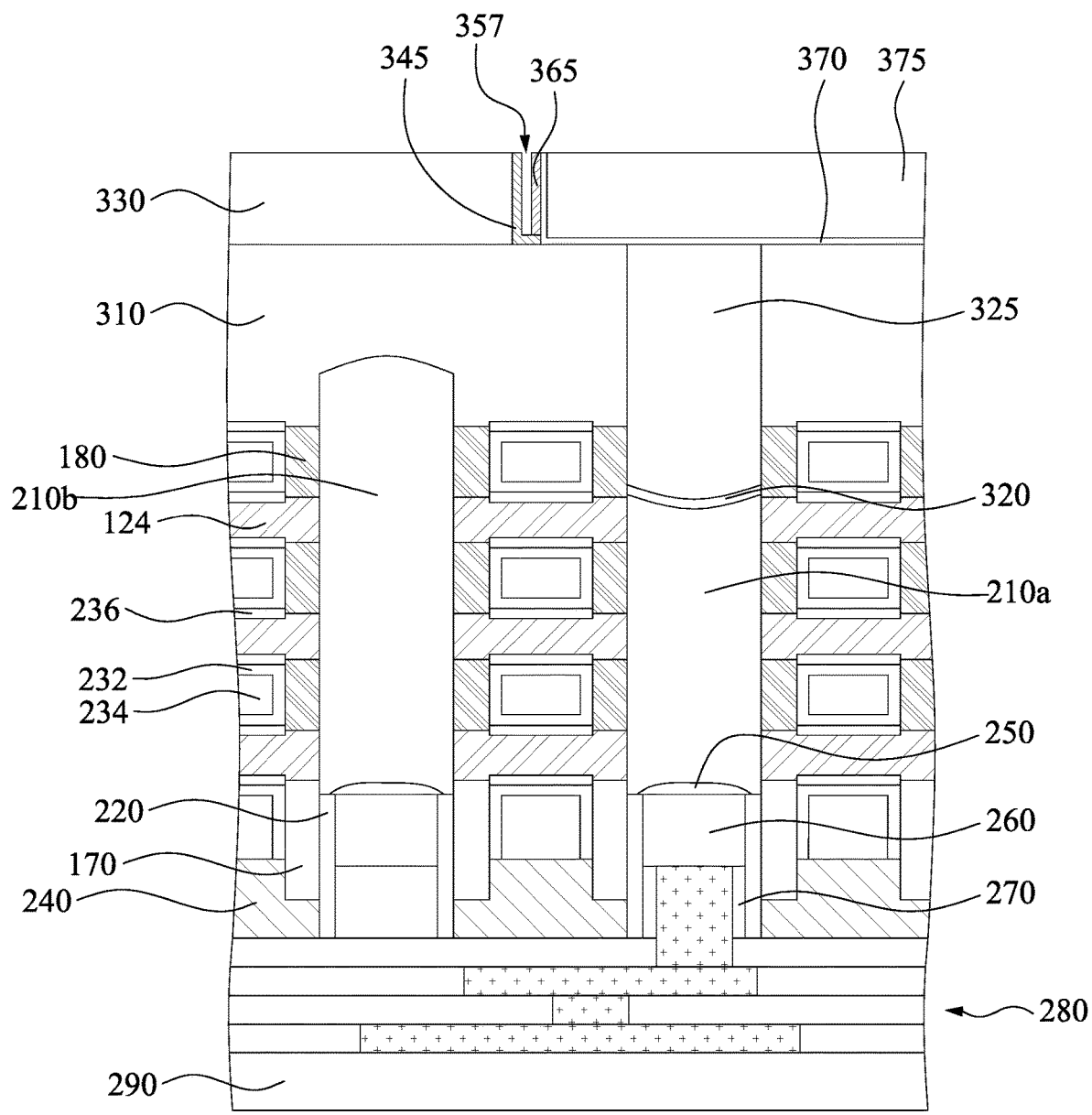
Figure 21B:
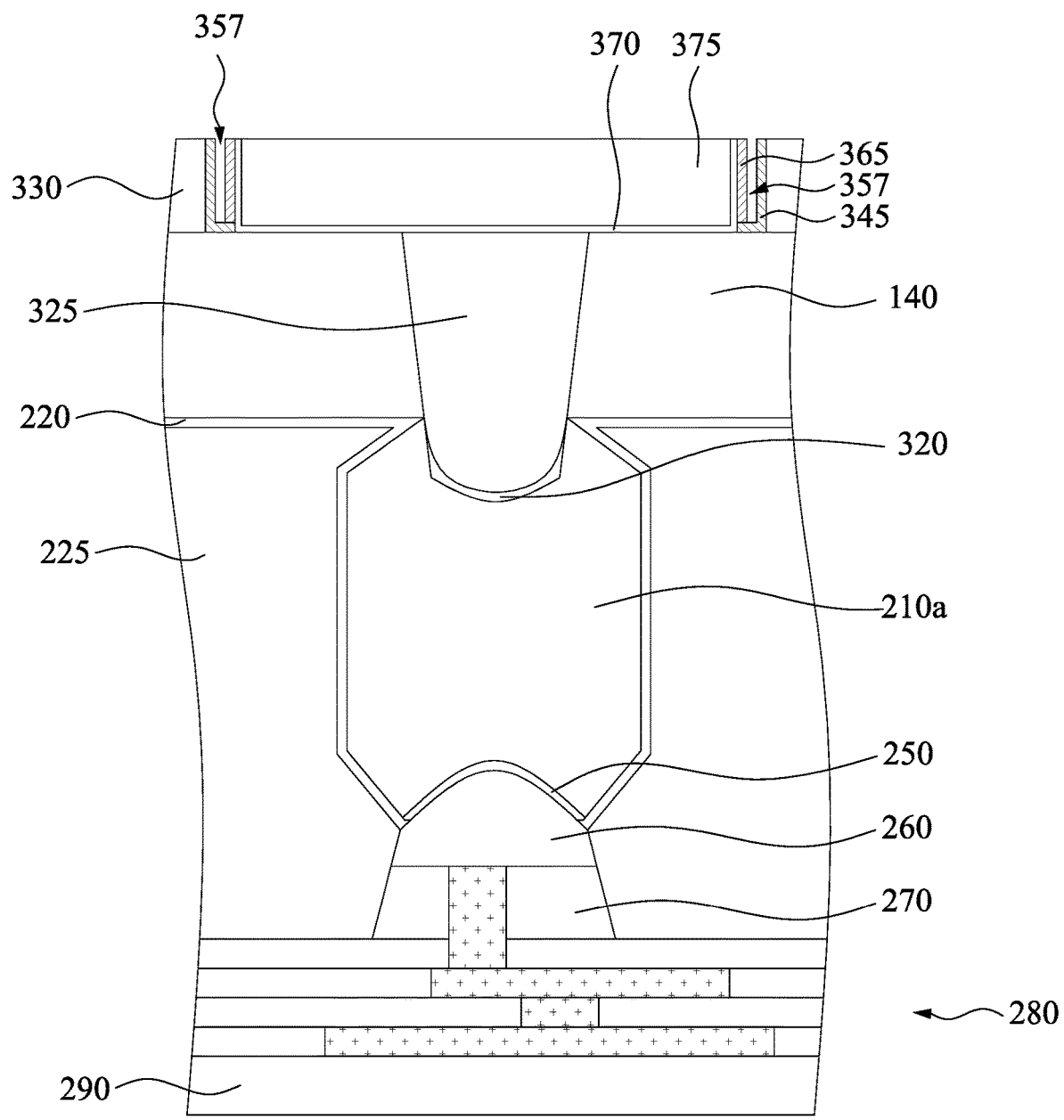

Reference is made to FIGS. 21A and 21B. The dummy spacer 355 is removed to form an air gap 357 between the first spacer 345 and the second spacer 365. As mentioned above, the dummy spacer 355 is made of a material that has etching selectivity to that of the first spacer layer 340 and the second spacer layer 360, the first spacer layer 340 and the second spacer layer 360 remain on the sidewalls of the opening 332 during the etching process in FIGS. 21A and 21B. In some embodiments, the dummy spacer 355 includes silicon dioxide ($SiO_2$) and the second ILD 330, the first spacer 345, and the second spacer 365 includes materials selected from silicon nitride (SiN), aluminum oxide (AlOx), silicon oxycarbide (SiOC), or the like. In some embodiments, the dummy spacer 355 includes silicon nitride (SiN) and the second ILD 330, the first spacer 345, and the second spacer 365 includes materials selected from silicon dioxide ($SiO_2$), aluminum oxide ($AlO_x$), silicon oxycarbide (SiOC), or the like.

In some embodiments, the dummy spacer 355 is removed by using an isotropic dry etching process. The etchants for removing the dummy spacer 355 may be $NF_3$ mixed with hydrogen-containing gas (e.g., $H_2$ or HBr) and can be introduced at a flow rate of between about 5 sccm and about 200 sccm for about 5 seconds to about 180 seconds under a chamber pressure of about 1 m Torr to about 100 m Torr. In some embodiments, the etchants are plasma with a power of about 50 W to about 250 W.

Figure 22A:
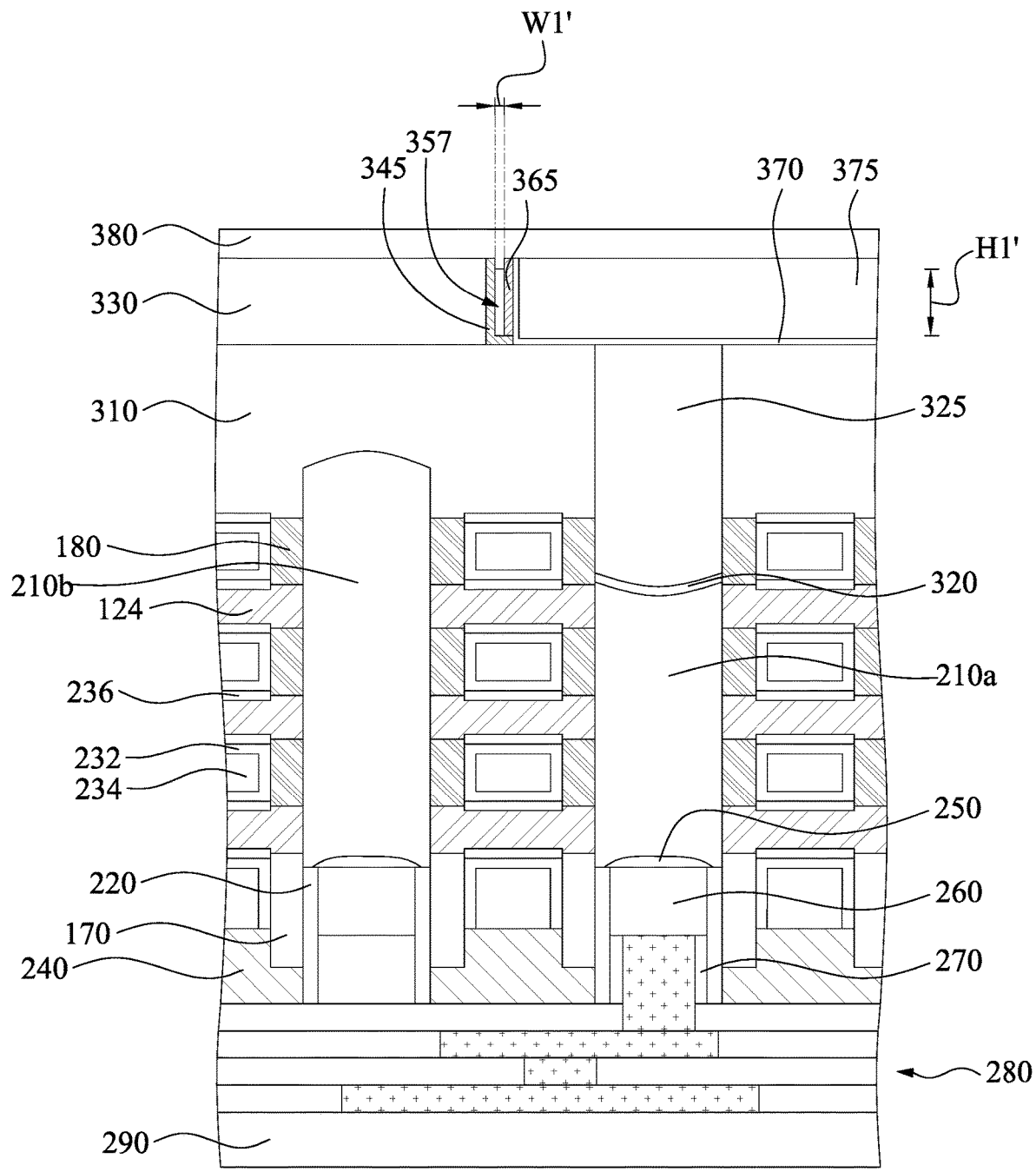
Figure 22B:
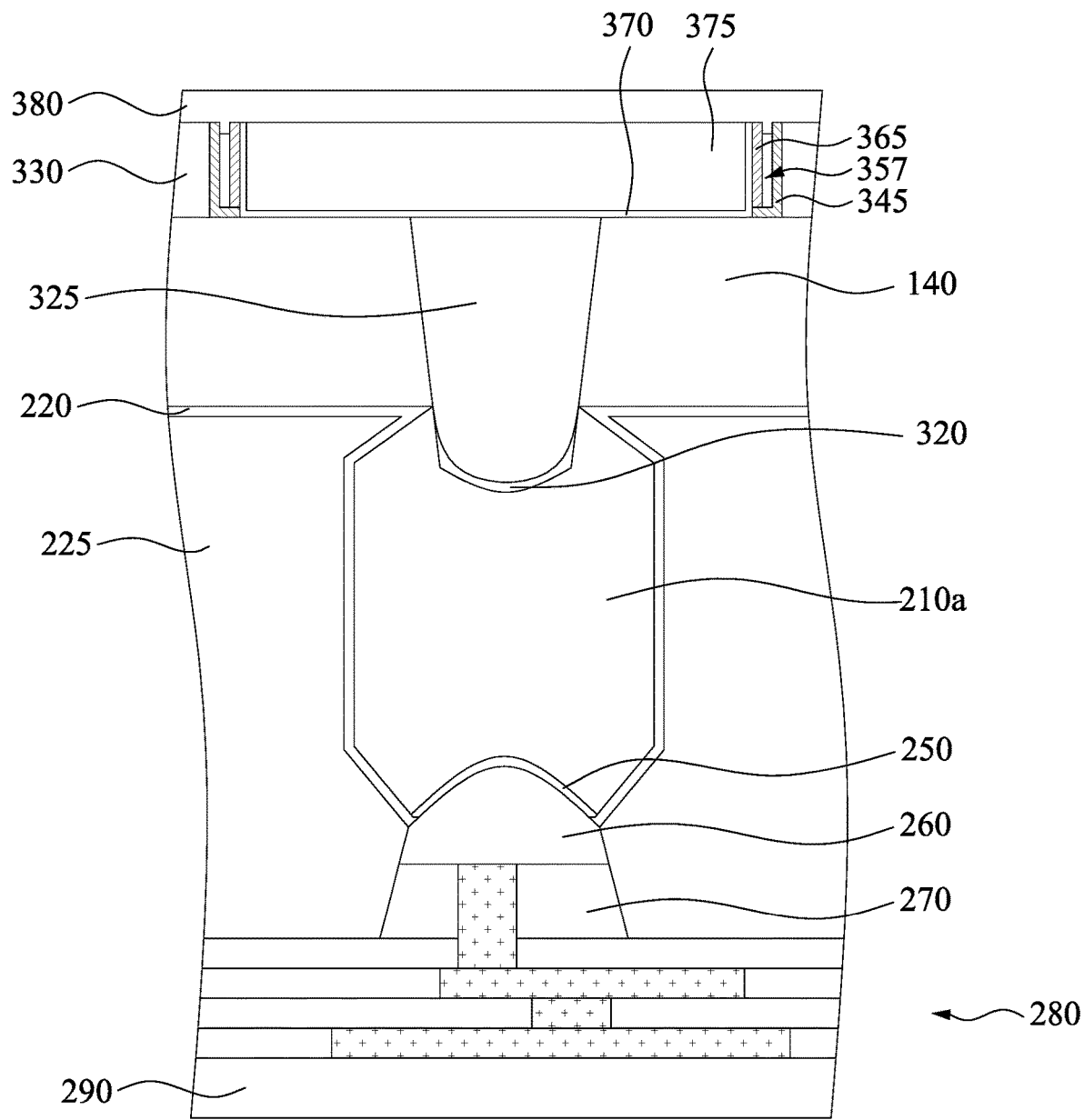

Reference is made to FIGS. 22A and 22B. A seal layer 380 is formed over the structure of FIGS. 21A and 21B to seal to air gap 357 between the first spacer layer 340 and the second spacer layer 360. In some embodiments, the seal layer 380 is formed using methods such as atomic layer deposition (ALD), physical vapor deposition (PVD), sputtering, chemical vapor deposition (CVD), and the like. For example, the seal layer 380 is deposited by using an ALD process with Si-based precursors (e.g., $SiH_4$), at a deposition temperature of about 100° C. to about 400° C. for about 5 seconds to about 30 seconds, and with a deposition rate of about 10 angstroms/min to about 100 angstroms/min. In some embodiments, after the formation of the seal layer 380, a height H1' of the air gap 357 is about 1 nm to about 20 nm, and the width W1 of the air gap 357 is about 0.5 nm to about 6 nm. The air gaps 357 may include gases such as gases used during the deposition of the seal layer 380, or any other gases that may diffuse into the air gaps 357. The air gaps 357 may have low dielectric constants (e.g., k-values), such as dielectric constants of close to 1.

Reference is made to FIGS. 23A and 23B. Subsequently, a planarization operation, such as a chemical mechanical polishing (CMP) method or an etch-back method, is performed on the seal layer 380 (see FIGS. 22A and 22B) to form a seal cap 385 between the first spacer layer 340 and the second spacer layer 360. As such, the seal cap 385, the first spacer layer 340, and the second spacer layer 360 together define the air gap 357. The second ILD 330, the first spacer layer 340, the second spacer layer 360, the seal cap 385, the barrier layer 370, and the conductive feature 375 are referred to as a backside metallization layer 391, and the conductive feature 375 can be a power rail that extends across and is in contact with one or more backside vias 325, so as to make electrical connection to one or more source epitaxial structures 210a. Because the power rail is formed, more routing space can be provided for the integrated circuit structure.

A backside MLI structure 390 including the backside metallization layer 391 is formed. The backside MLI structure 390 includes the bottommost backside metallization layer 391 and a plurality of upper backside metallization layers 392 over the bottommost backside metallization layer 391. The number of upper backside metallization layers 392 may vary according to design specifications of the integrated circuit structure. Only two backside metallization layers 392

(also called backside M1 layer and backside M2 layer) are illustrated in FIGS. 23A and 23B for the sake of simplicity.

The backside metallization layers (e.g., backside M1 layer and M2 layer) 392 each include a first backside inter-metal dielectric (IMD) layer 394 and a second backside IMD layer 396. The second backside IMD layers 396 are formed over the corresponding first backside IMD layers 394. The backside metallization layers 392 include one or more horizontal interconnects, such as backside metal lines 397, respectively extending horizontally or laterally in the second backside IMD layers 396 and vertical interconnects, such as backside vias 398, respectively extending vertically in the first backside IMD layers 394.

In FIGS. 23A-23B, the integrated circuit structure includes a transistor T, a front-side MLI structure 280, and a backside MLI structure 390. The front-side MLI structure 280 is on the front-side of the transistor T, and the backside MLI structure 390 is on the backside of the transistor T. For example, the front-side MLI structure 280 is electrically connected to the S/D epitaxial structures 210 and 215 from the front-side of the S/D epitaxial structures 210 and 215, and the backside MLI structure 390 is electrically connected to the S/D epitaxial structures 210 and 215 from the backside of the S/D epitaxial structures 210 and 215 through backside vias 325.

The backside MLI structure 390 includes a conductive feature 375, a second ILD 330, and a spacer structure 305 between the conductive feature 375 and the second ILD 330. In some embodiments, the spacer structure 305 includes the first spacer 345, the second spacer 365, and the seal cap 385. The first spacer 345, the second spacer 365, and the seal cap 385 together define an air gap 357.

The first spacer 345 is in contact with the seal cap 385, the second spacer 365, the second ILD 330, isolation materials 310, and the isolation structures 140. The second spacer 365 is in contact with the seal cap 385, the first spacer 345, and the barrier layer 370. The seal cap 385 is in contact with the first spacer 345, the second spacer 365, and the upper backside metallization layer 392.

In some embodiments, the transistor T includes channel portions (e.g., the second semiconductor layers 124), a gate structure 230, and S/D epitaxial structures 210 and 215 (e.g., see FIG. 15A). The gate structure 230 wraps or surrounds the channel portions, and the S/D epitaxial structures 210 and 215 are connected to the channel portions. In some embodiments, the S/D epitaxial structures 210 and 215 are electrically connected to the front-side MLI structure 280 through the front-side conductive vias 286 and the contacts 260. In some embodiments, the S/D epitaxial structures 210 and 215 are electrically connected to the backside MLI structure 390 through the backside vias 325.

Figure 24A:
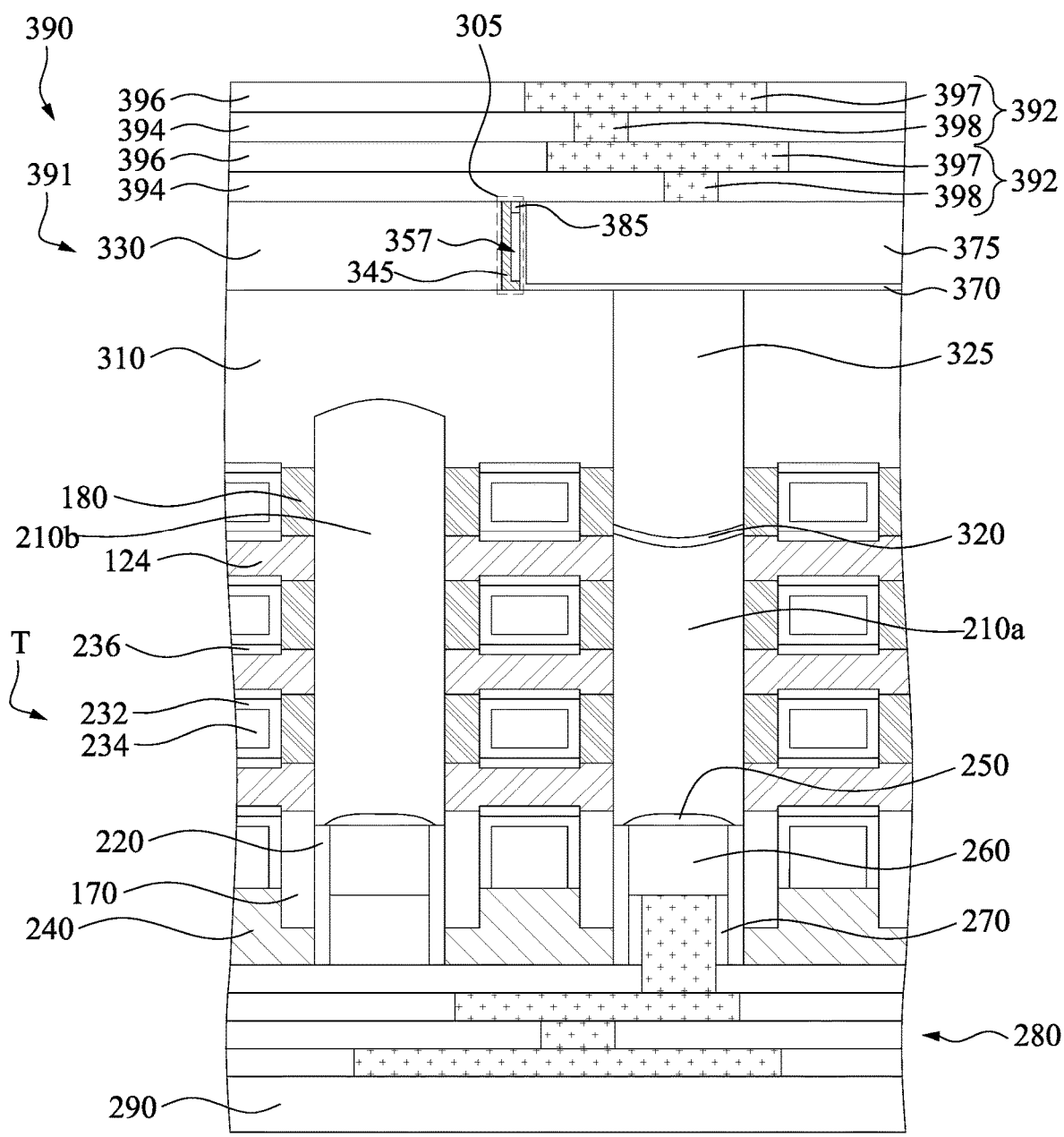
FIGS. 24A-24B are cross-sectional views of an integrated circuit structure respectively taken along the first and second cuts in accordance with some embodiments of the present disclosure.
Figure 24B:
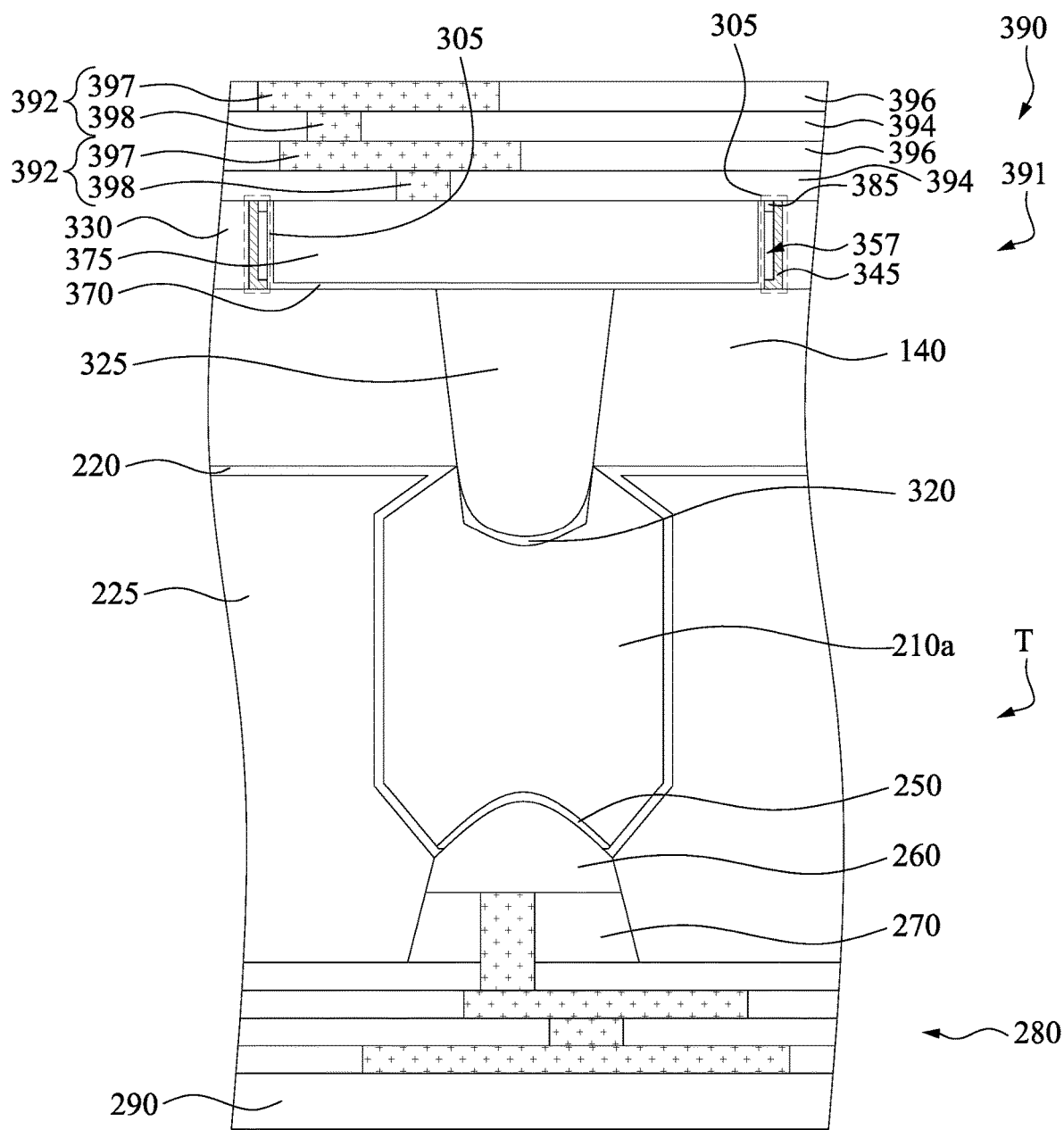

FIGS. 24A-24B are cross-sectional views of an integrated circuit structure respectively taken along the first and second cuts in accordance with some embodiments of the present disclosure. The difference between the integrated circuit structures in FIGS. 24A-24B and 23A-23B pertains to the configuration of the spacer structure 305. In FIGS. 24A-24B, the spacer structure 305 includes the first spacer 345 and the seal cap 385. That is, the formation of second spacer layer 360 (and the second spacer structure 365) (see FIGS. 18A-19B) can be omitted. For example, after the formation of the dummy spacer 355 as shown in FIGS. 18A and 18B, the first spacer layer 340 in FIGS. 18A and 18B is patterned to form the first spacer structure 345. Subsequently, the barrier layer 370 and the conductive feature 375 are formed on the backside of the backside via 325 (referring to FIGS. 20A and 20B), and the dummy spacer 355 is removed to form the air gap 357. The seal cap 385 and the backside MLI structure 390 are then formed on the conductive feature 375. In FIGS. 24A-24B, the seal cap 385 is in contact with the first spacer structure 345 and the barrier layer 370. As such, the seal cap 385, the first spacer structure 345, and the barrier layer 370 together define the air gap 357. Other relevant structural and manufacturing details of the integrated circuit structure in FIGS. 24A-24B are substantially the same as or similar to the integrated circuit structure in FIGS. 23A-23B, and, therefore, a description in this regard will not be repeated hereinafter.

Figure 25A:
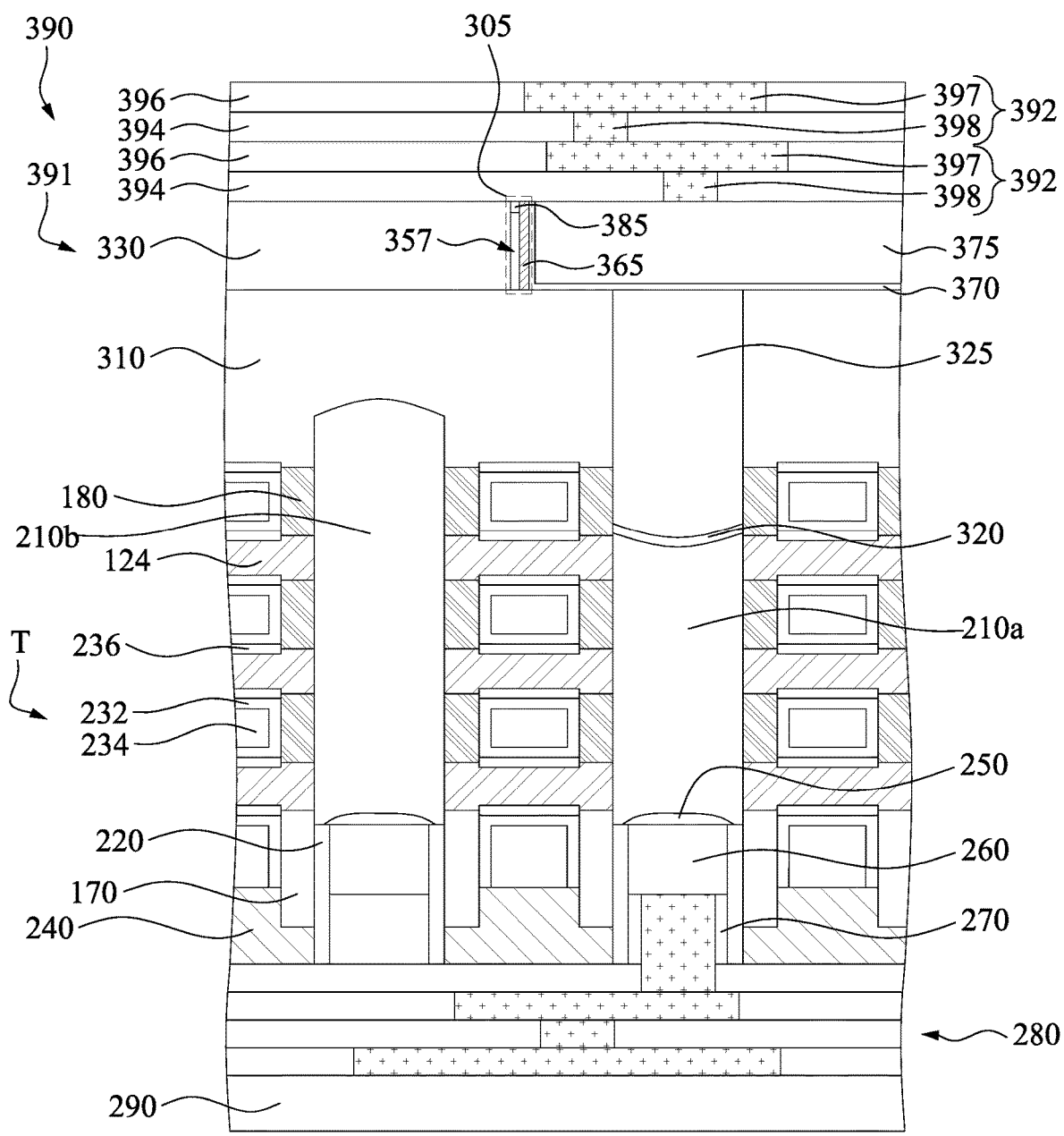
FIGS. 25A-25B are cross-sectional views of an integrated circuit structure respectively taken along the first and second cuts in accordance with some embodiments of the present disclosure.
Figure 25B:
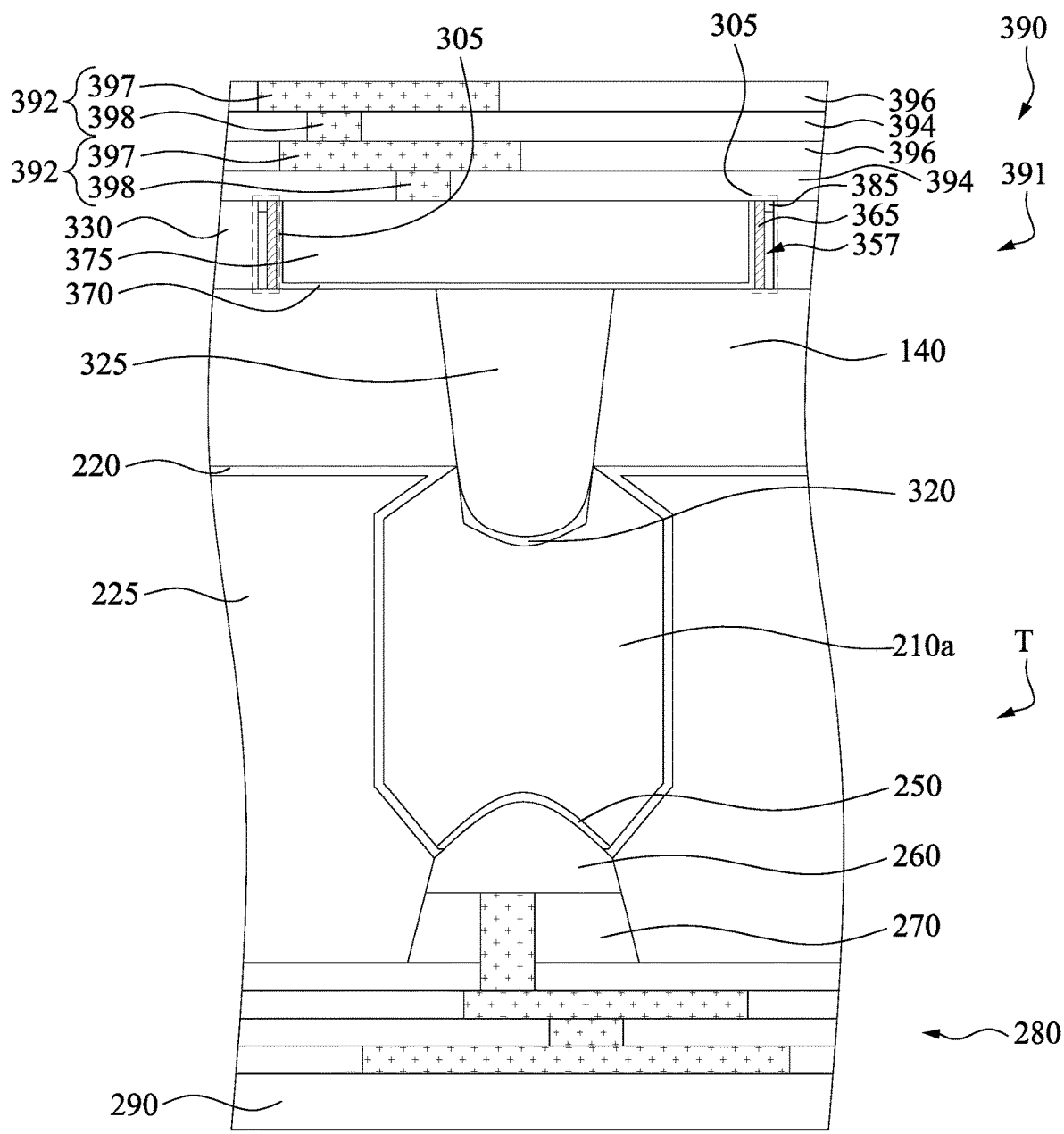

FIGS. 25A-25B are cross-sectional views of an integrated circuit structure respectively taken along the first and second cuts in accordance with some embodiments of the present disclosure. The difference between the integrated circuit structures in FIGS. 25A-25B and 23A-23B pertains to the configuration of the spacer structure 305. In FIGS. 25A-25B, the spacer structure 305 includes the second spacer 365 and the seal cap 385. For example, the formation of first spacer layer 340 (and the first spacer structure 345) (see FIGS. 17A-19B) can be omitted. That is, after the formation of the opening 332 as shown in FIGS. 17A and 17B, the dummy spacer layer 350 in FIGS. 17A and 17B is deposited in the opening 332 and then is patterned to form the dummy spacer 355. Subsequently, the second spacer structure 365 is formed on a side of the dummy spacer 355, the barrier layer 370 and the conductive feature 375 are formed on the backside of the backside via 325 (referring to FIGS. 20A and 20B), and the dummy spacer 355 is removed to form the air gap 357. The seal cap 385 and the backside MLI structure 390 are then formed on the conductive feature 375. In FIGS. 25A-25B, the seal cap 385 is in contact with the second spacer structure 365 and the second ILD 330. As such, the seal cap 385, the second spacer structure 365, and the second ILD 330 together define the air gap 357. Other relevant structural and manufacturing details of the integrated circuit structure in FIGS. 25A-25B are substantially the same as or similar to the integrated circuit structure in FIGS. 23A-23B, and, therefore, a description in this regard will not be repeated hereinafter.

FIGS. 26-30B illustrate a method for manufacturing an integrated circuit structure at various stages in accordance with some embodiments of the present disclosure. In addition to the integrated circuit structure, FIGS. 26-29A depict X-axis, Y-axis, and Z-axis directions. In some embodiments, the integrated circuit structure shown in FIGS. 26-30B may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 26:
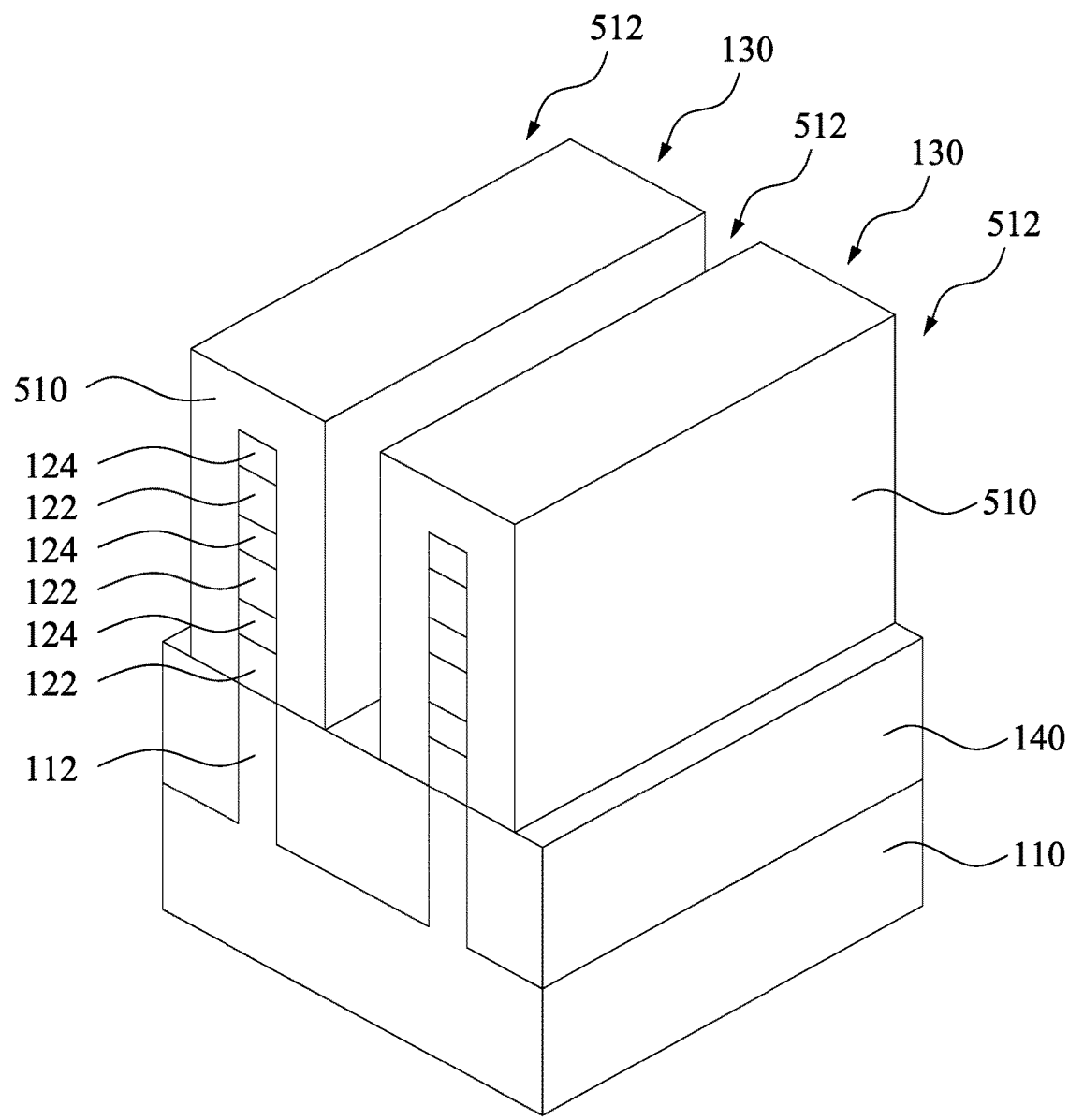
FIGS. 26, 27, 28, 29A, 29B, 30A, and 30B illustrate a method for manufacturing an integrated circuit structure at various stages in accordance with some embodiments of the present disclosure.

Reference is made to FIG. 26. A substrate 110 is provided. Materials, configurations, dimensions, processes and/or operations regarding the substrate 110 are similar to or the same as the substrate 110 of FIG. 1. Fin structures 130 are then formed above the substrate 110. Each of the fin structures 130 includes first semiconductor layers 122 and the second semiconductor layers 124. Materials, configurations, dimensions, processes and/or operations regarding the fin structures 130 are similar to or the same as the fin structures 130 of FIG. 2. Isolation structures 140 are then formed above the substrate 110. Materials, configurations, dimensions, processes and/or operations regarding the isolation structures 140 are similar to or the same as the isolation structures 140 of FIG. 3.

Sacrificial layers 510 are formed above the isolation structures 140 and respectively cover the fin structures 130. In some embodiments, the sacrificial layers 510 are made of semiconductor materials, such as SiGe or other suitable materials. In some other embodiments, the sacrificial layers 510 may be dielectric materials. The sacrificial layers 510 are separated from each other, such that trenches 512 are formed therebetween.

Figure 27:
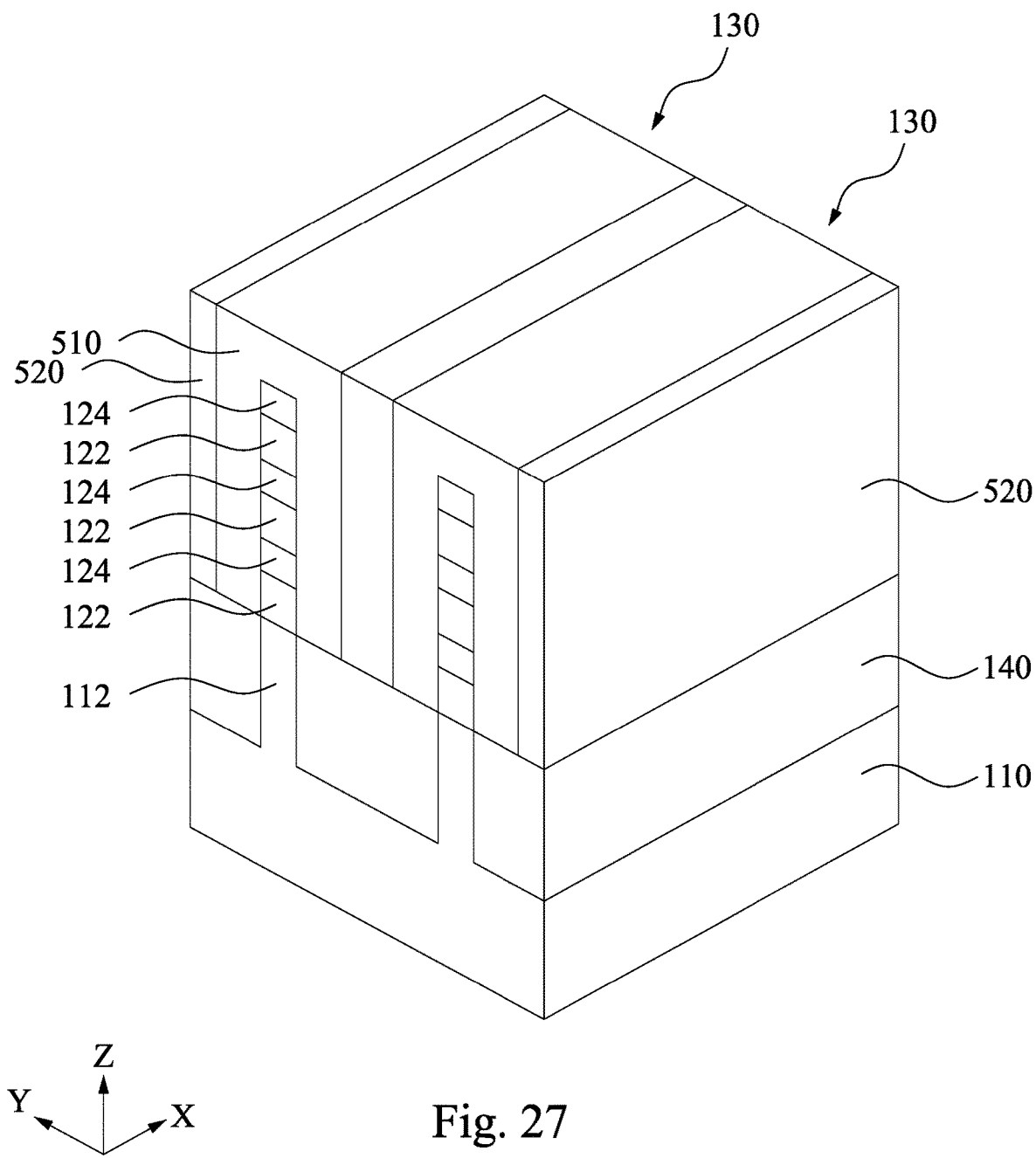

Reference is made to FIG. 27. A plurality of dummy fin structures 520 are respectively formed in the trenches 512. In some embodiments, a dielectric material is filled in the trenches 512. A planarization (e.g., CMP) process is then performed to remove excess portions of the dielectric material to form the dummy fin structures 520 respectively in the trenches 512. In some embodiments, the dummy fin structures 520 include silicon nitride, silicon oxide, silicon oxynitride, SiCN, SiCON, SiOC, or other suitable materials.

Figure 28:
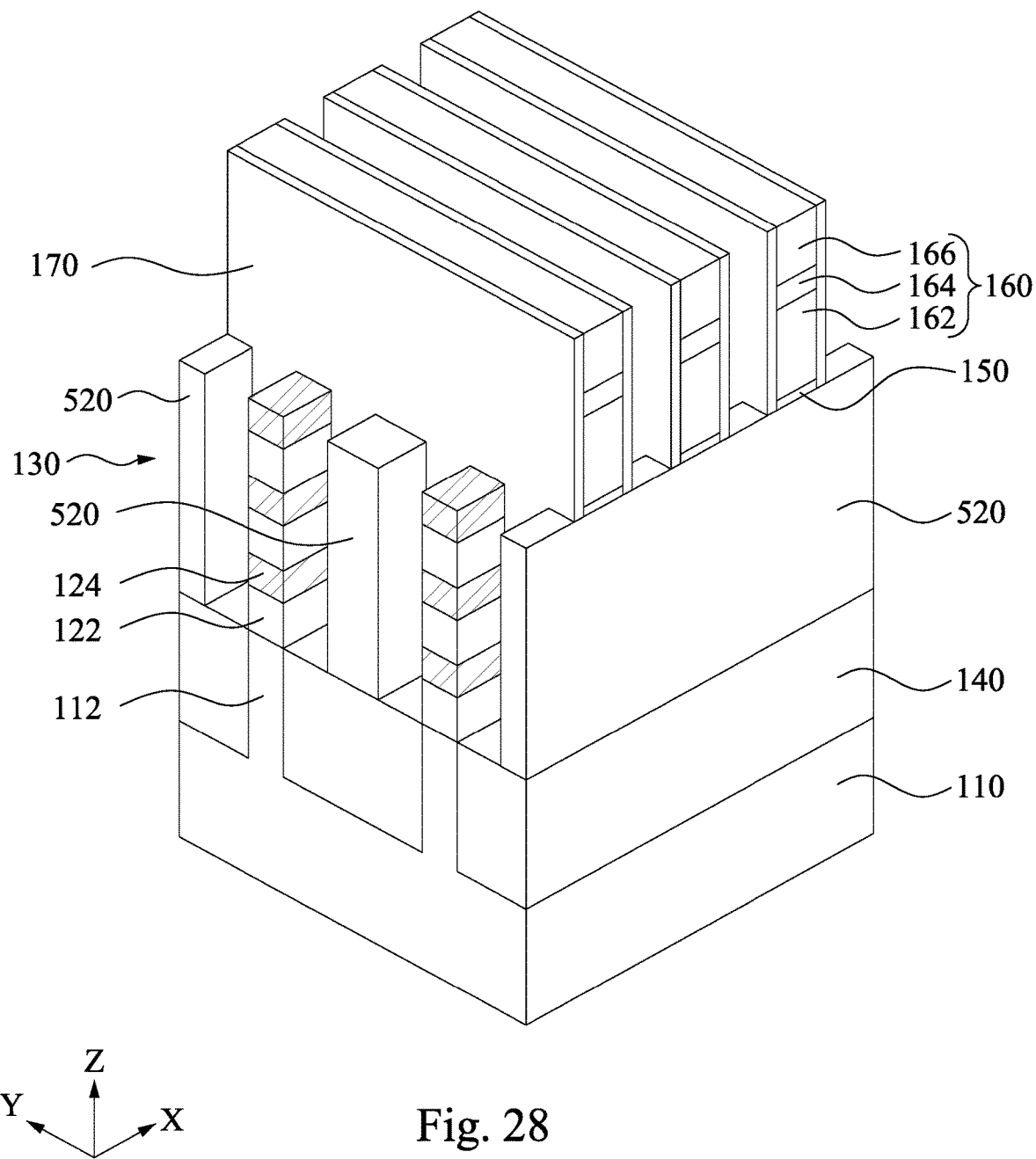

Reference is made to FIG. 28. A planarization (e.g., CMP) process is performed to remove top portions of the sacrificial layers 510 (see FIG. 27) and the dummy fin structures 520 until the uppermost second semiconductor layer 124 is exposed from the sacrificial layers 510. The sacrificial layers 510 are then removed, and the sacrificial gate dielectric layer 150 is conformally formed above the dummy fin structures 520 and the first and second semiconductor layers 122 and 124.

Subsequently, at least one dummy gate structure 160 is then formed above the sacrificial gate dielectric layer 150. The dummy gate structure 160 includes a dummy gate layer 162, a pad layer 164 formed over the dummy gate layer 162, and a mask layer 166 formed over the pad layer 164. Gate spacers 170 are then formed on opposite sidewalls of the dummy gate structures 160. Materials, configurations, dimensions, processes and/or operations regarding the sacrificial gate dielectric layer 150, the dummy gate structure 160, and the gate spacers 170 are similar to or the same as the sacrificial gate dielectric layer 150, the dummy gate structure 160, and the gate spacers 170 of FIG. 4.

Figure 29A:
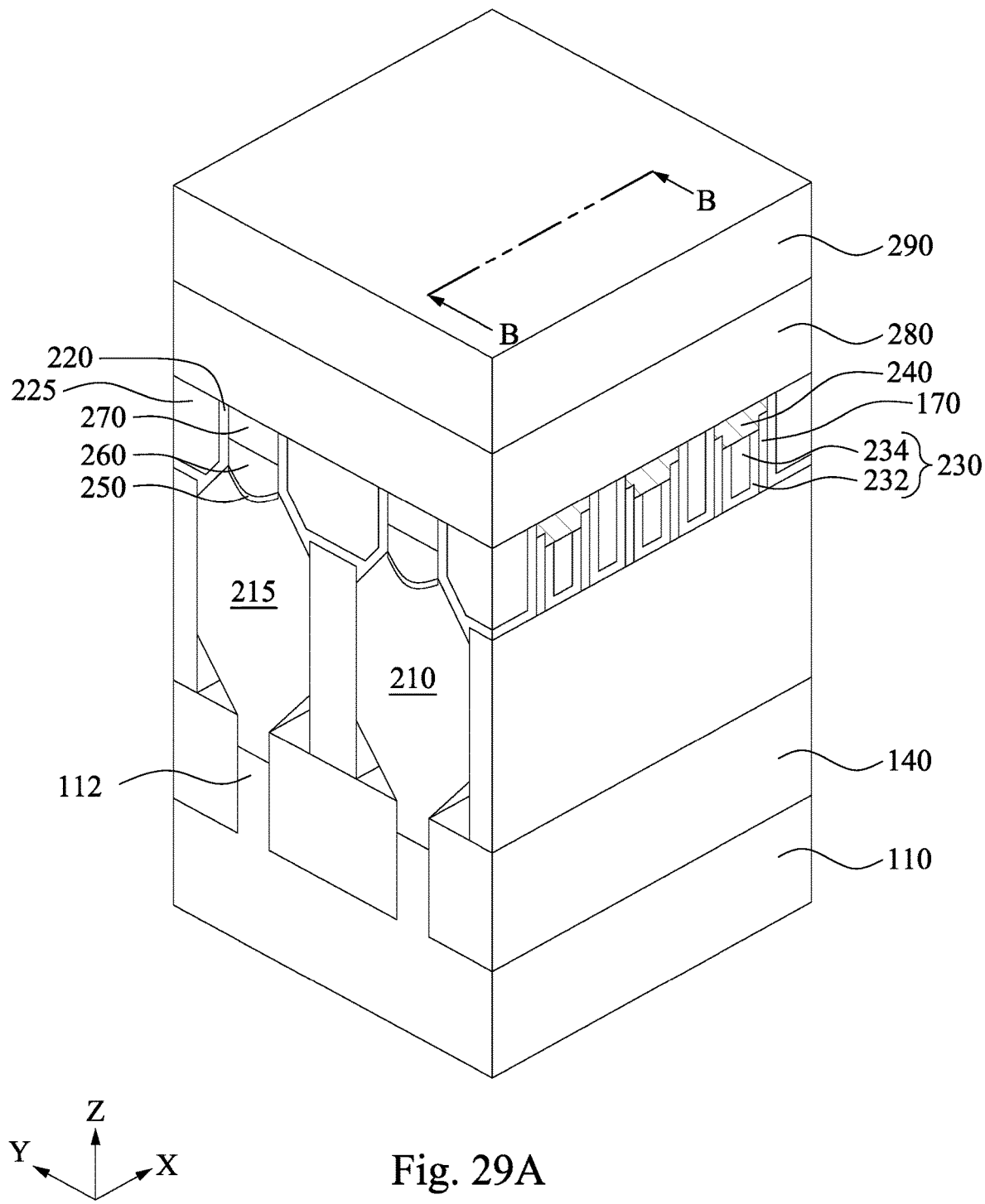
Figure 29B:
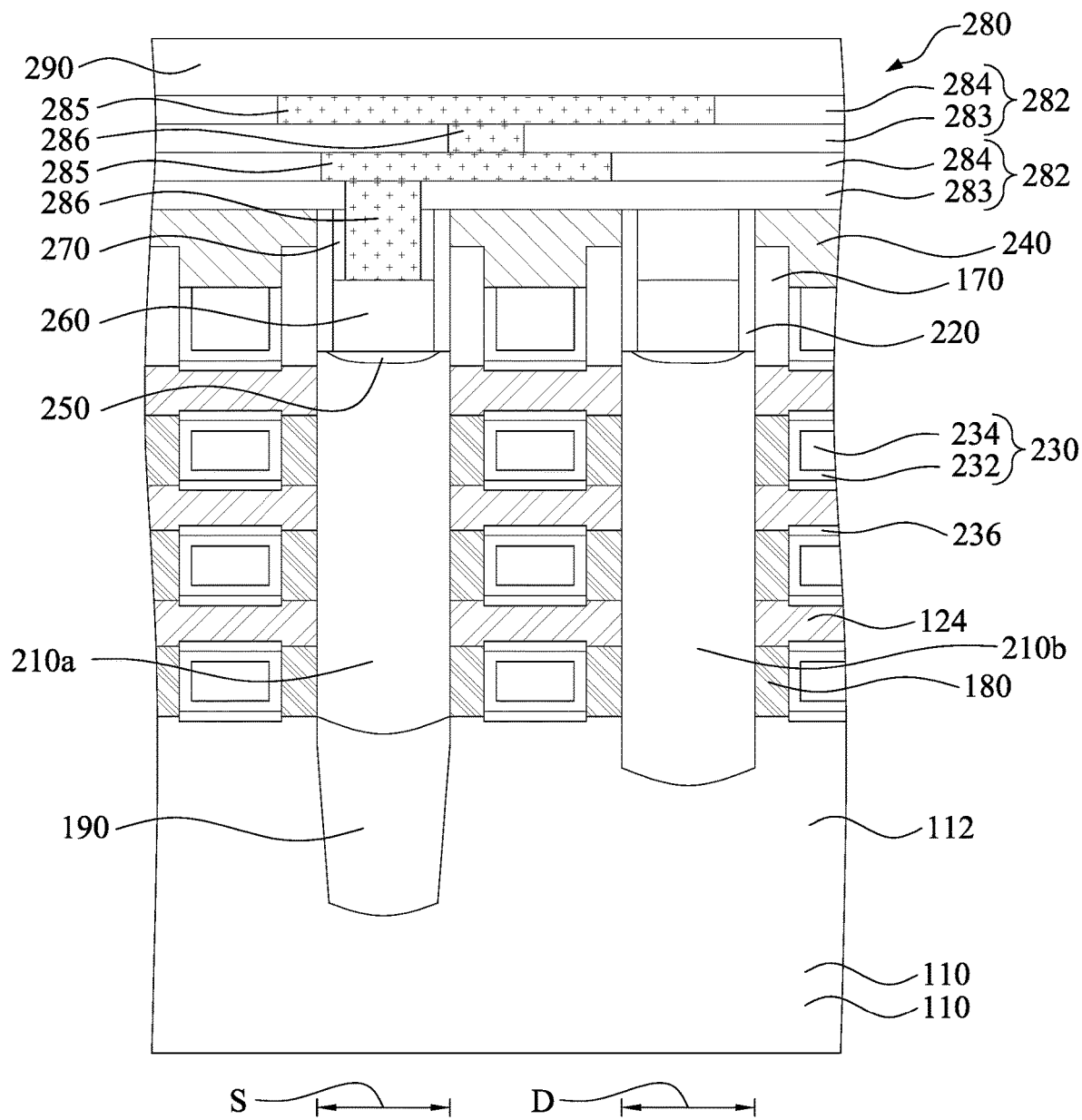

Subsequently, as shown in FIGS. 29A and 29B, where FIG. 29B is a cross-sectional view taken along line B-B in FIG. 29A, structures on front-side of the substrate 110 are formed similar to FIGS. 5 to 12B. In some embodiments, air voids are formed between the S/D epitaxial structure 210 (or the S/D epitaxial structures 215) and the dummy fin structure 520. The structure of FIG. 29A is then flipped and undergoes the backside manufacturing processes of the integrated circuit structure similar to the processes shown in FIGS. 13-23B to get the structure shown in FIGS. 30A and 30B, which are cross-sectional views of an integrated circuit structure respectively taken along the first and second cuts in accordance with some embodiments of the present disclosure.

Figure 30A:
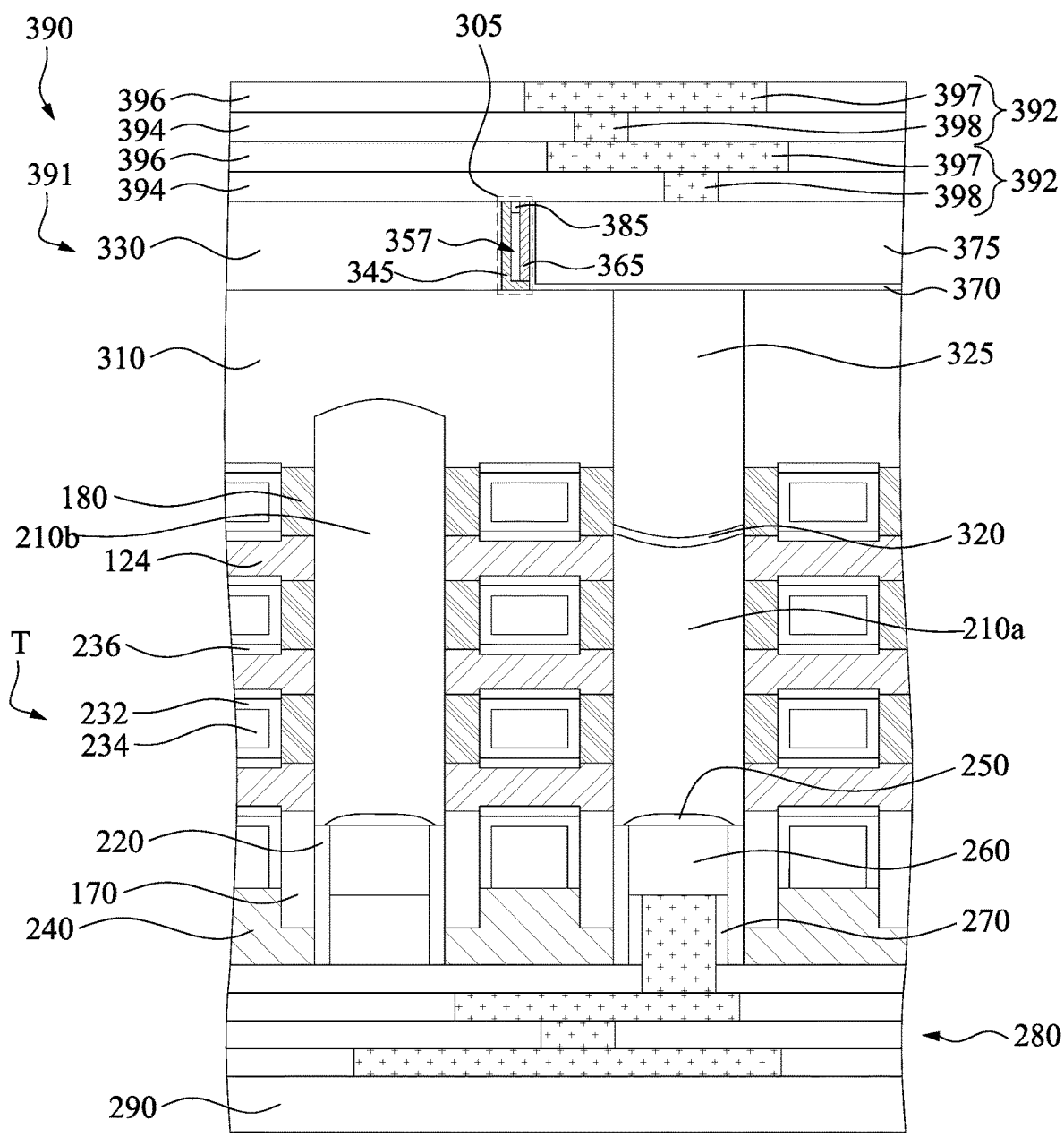
Figure 30B:
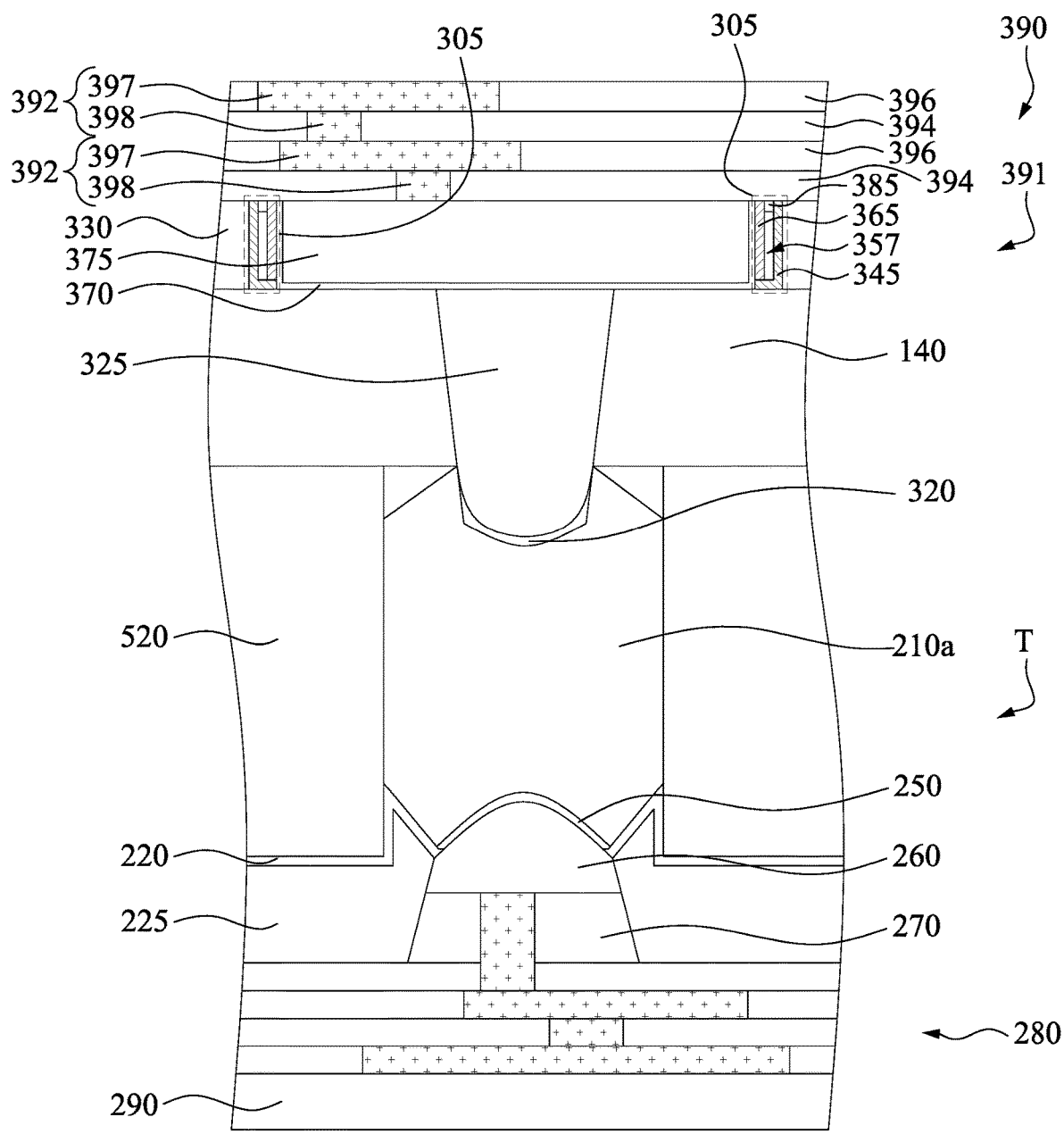

In FIGS. 30A-30B, the integrated circuit structure includes a transistor T, a front-side MLI structure 280, and a backside MLI structure 390. The front-side MLI structure 280 is on the front-side of the transistor T, and the backside MLI structure 390 is on the backside of the transistor T. For example, the front-side MLI structure 280 is electrically connected to the S/D epitaxial structures 210 and 215 from the front-side of the S/D epitaxial structures 210 and 215, and the backside MLI structure 390 is electrically connected to the S/D epitaxial structures 210 and 215 from the backside of the S/D epitaxial structures 210 and 215 through backside vias 325.

The backside MLI structure 390 includes a conductive feature 375, a second ILD 330, and a spacer structure 305 between the conductive feature 375 and the second ILD 330. In some embodiments, the spacer structure 305 includes the first spacer 345, the second spacer 365, and the seal cap 385. The first spacer 345, the second spacer 365, and the seal cap 385 together define an air gap 357.

Figure 31A:
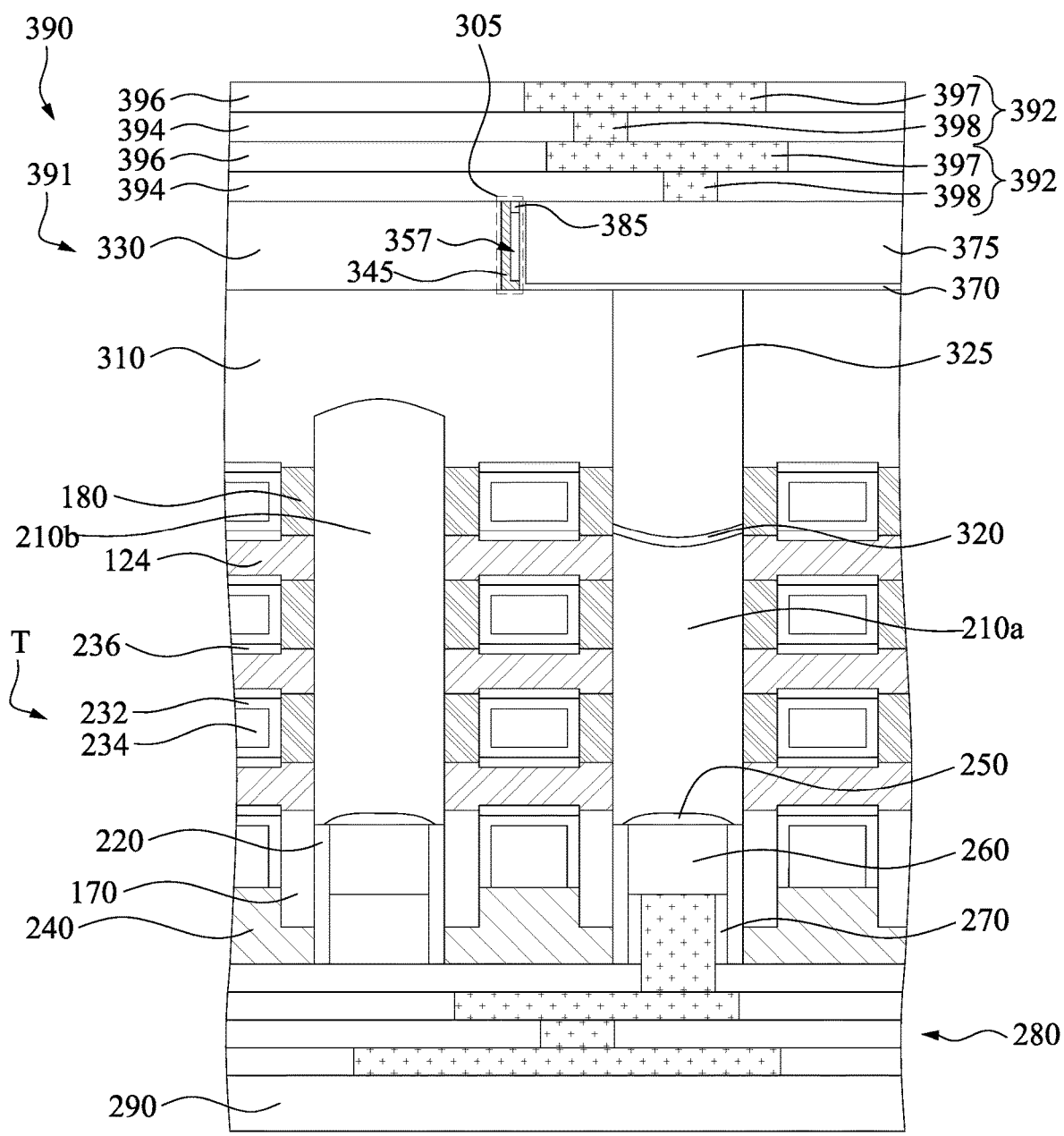
FIGS. 31A-31B are cross-sectional views of an integrated circuit structure respectively taken along the first and second cuts in accordance with some embodiments of the present disclosure.
Figure 31B:
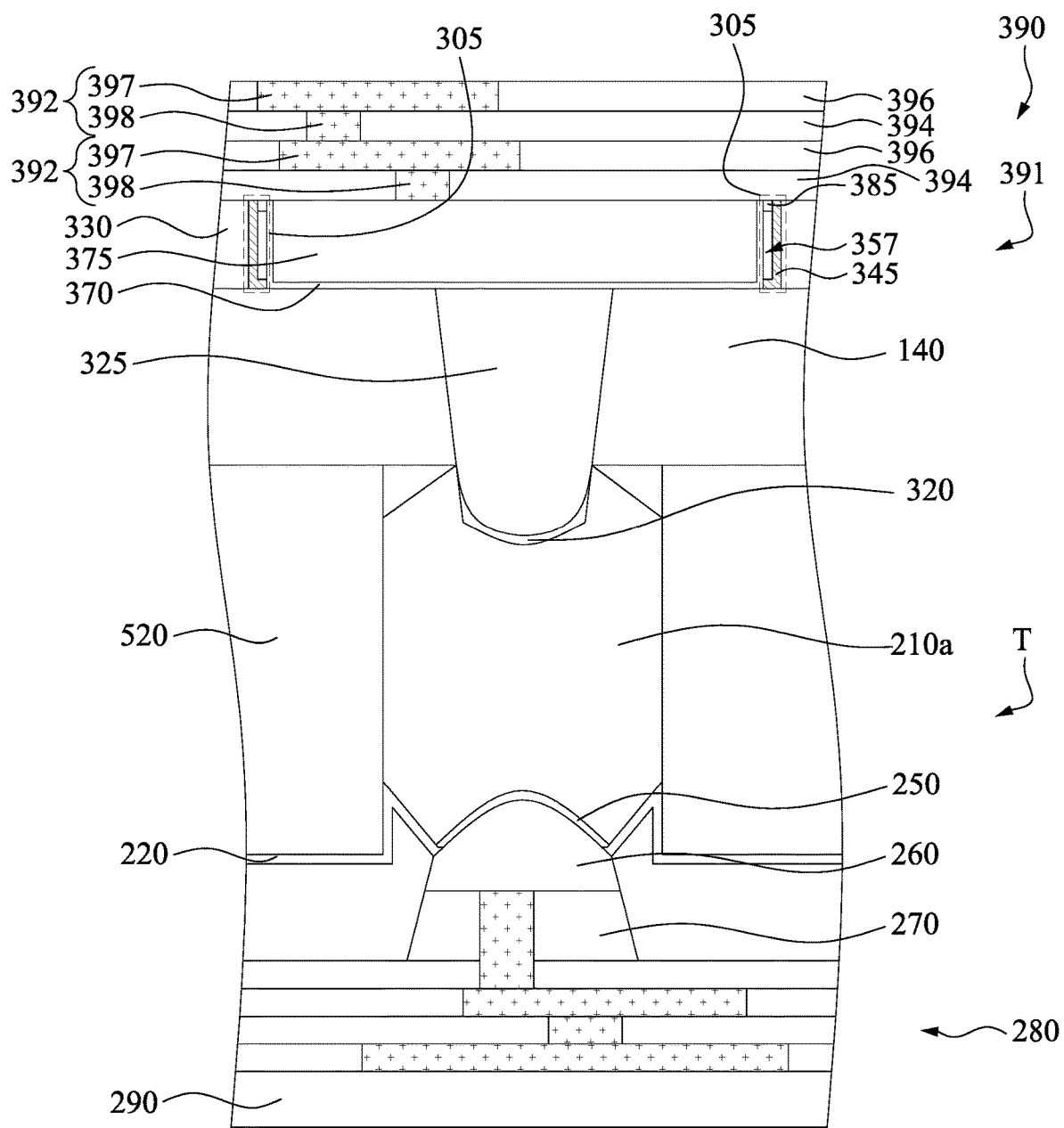

FIGS. 31A-31B are cross-sectional views of an integrated circuit structure respectively taken along the first and second cuts in accordance with some embodiments of the present disclosure. The difference between the integrated circuit structures in FIGS. 31A-31B and 30A-30B pertains to the configuration of the spacer structure 305. In FIGS. 31A-31B, the spacer structure 305 includes the first spacer 345 and the seal cap 385. That is, the formation of second spacer layer 360 (and the second spacer structure 365) (see FIGS. 18A-19B) can be omitted. For example, after the formation of the dummy spacer 355 as shown in FIGS. 18A and 18B, the first spacer layer 340 in FIGS. 18A and 18B is patterned to form the first spacer structure 345. Subsequently, the barrier layer 370 and the conductive feature 375 are formed on the backside of the backside via 325 (referring to FIGS. 20A and 20B), and the dummy spacer 355 is removed to form the air gap 357. The seal cap 385 and the backside MLI structure 390 are then formed on the conductive feature 375. In FIGS. 31A-31B, the seal cap 385 is in contact with the first spacer structure 345 and the barrier layer 370. As such, the seal cap 385, the first spacer structure 345, and the barrier layer 370 together define the air gap 357. Other relevant structural and manufacturing details of the integrated circuit structure in FIGS. 31A-31B are substantially the same as or similar to the integrated circuit structure in FIGS. 30A-30B, and, therefore, a description in this regard will not be repeated hereinafter.

Figure 32A:
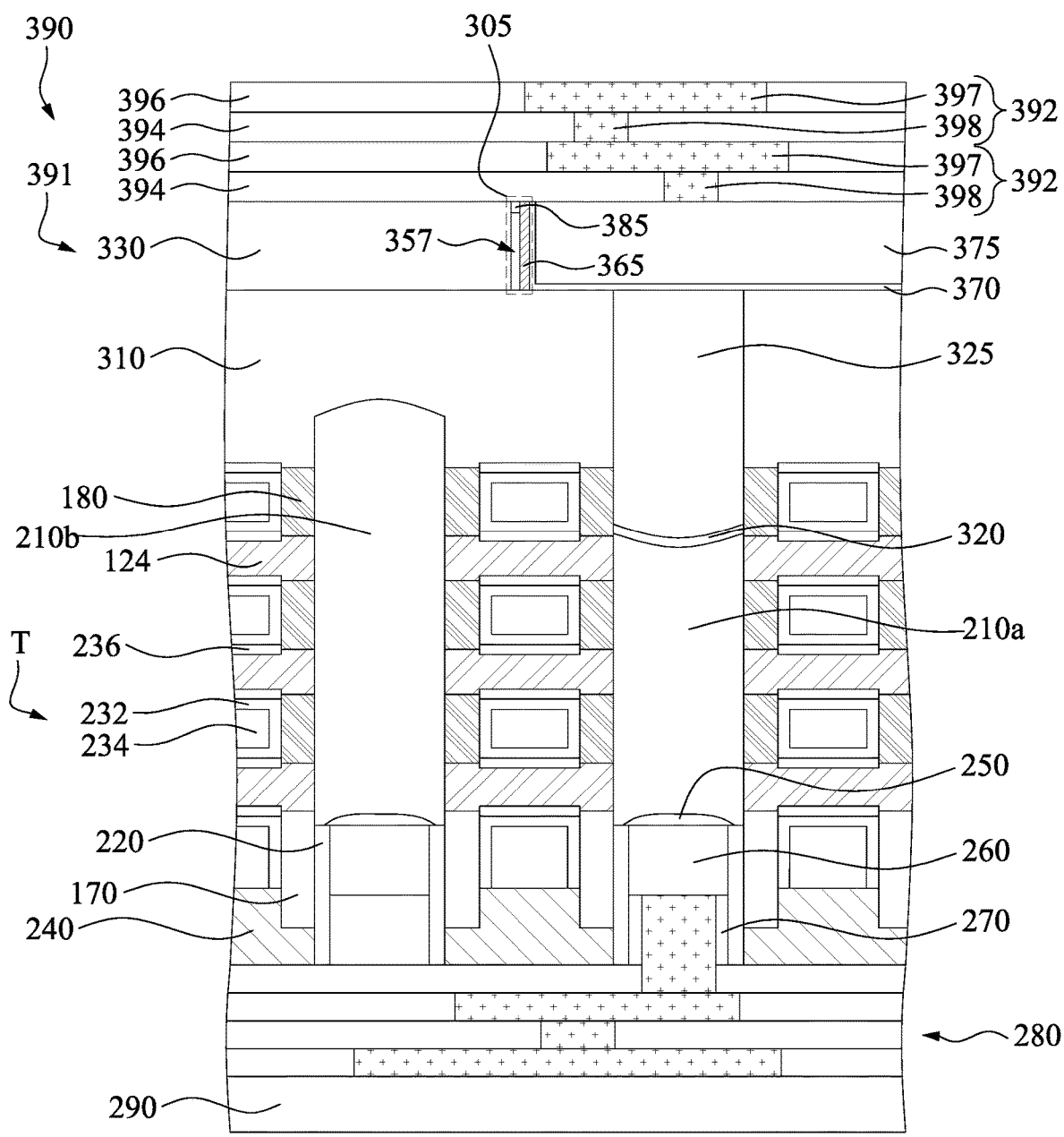
FIGS. 32A-32B are cross-sectional views of an integrated circuit structure respectively taken along the first and second cuts in accordance with some embodiments of the present disclosure.
Figure 32B:
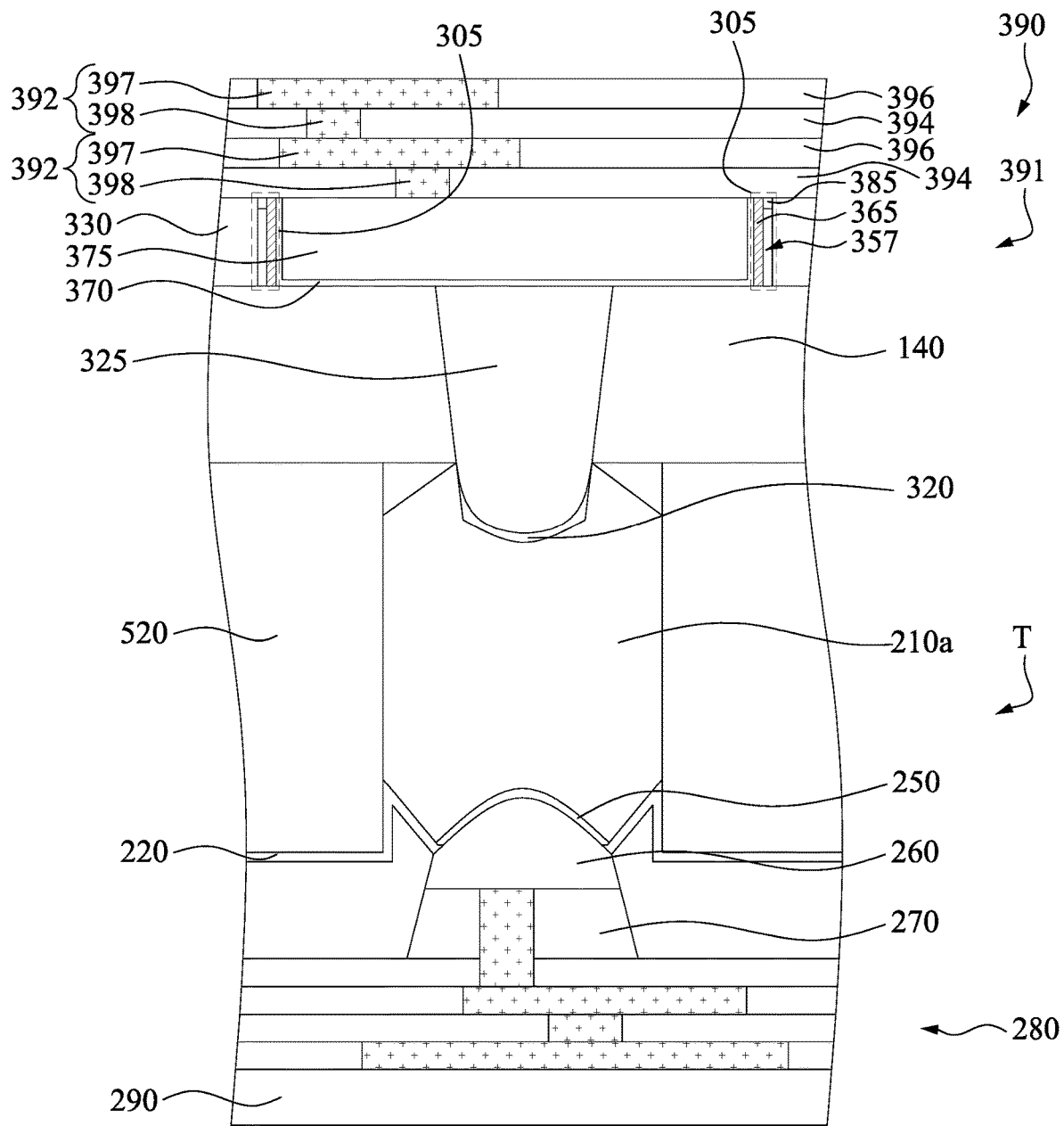

FIGS. 32A-32B are cross-sectional views of an integrated circuit structure respectively taken along the first and second cuts in accordance with some embodiments of the present disclosure. The difference between the integrated circuit structures in FIGS. 32A-32B and 30A-30B pertains to the configuration of the spacer structure 305. In FIGS. 32A-32B, the spacer structure 305 includes the first spacer 345 and the seal cap 385. That is, the formation of first spacer layer 340 (and the first spacer structure 345) (see FIGS. 17A-19B) can be omitted. That is, after the formation of the opening 332 as shown in FIGS. 17A and 17B, the dummy spacer layer 350 in FIGS. 17A and 17B is deposited in the opening 332 and then is patterned to form the dummy spacer 355. Subsequently, the second spacer structure 365 is formed on a side of the dummy spacer 355, the barrier layer 370 and the conductive feature 375 are formed on the backside of the backside via 325 (referring to FIGS. 20A and 20B), and the dummy spacer 355 is removed to form the air gap 357. The seal cap 385 and the backside MLI structure 390 are then formed on the conductive feature 375. In FIGS. 32A-32B, the seal cap 385 is in contact with the second spacer structure 365 and the second ILD 330. As such, the seal cap 385, the second spacer structure 365, and the second ILD 330 together define the air gap 357. Other relevant structural and manufacturing details of the integrated circuit structure in FIGS. 32A-32B are substantially the same as or similar to the integrated circuit structure in FIGS. 30A-30B, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that including the air gaps in the backside MLI structure adjacent the conductive feature isolates the conductive feature, reduces coupling capacitance, and allows for good device speeds to be used. This increases device performance of the integrated circuit structure.

According to some embodiments, an integrated circuit (IC) structure includes a transistor, a front-side interconnection structure, a backside via, and a backside interconnection structure. The transistor includes a source/drain epitaxial structure. The front-side interconnection structure is on a front-side of the transistor. The backside via is connected to the source/drain epitaxial structure of the transistor. The backside interconnection structure is connected to the backside via and includes a conductive feature, a dielectric layer, and a spacer structure. The conductive feature is connected to the backside via. The dielectric layer laterally surrounds the conductive feature. The spacer structure is between the conductive feature and the dielectric layer and has an air gap.

According to some embodiments, an integrated circuit (IC) structure includes a transistor, a front-side interconnection structure, a backside via, and a backside interconnection structure. The transistor includes a source/drain epitaxial structure. The front-side interconnection structure is electrically connected to a front-side of the source/drain epitaxial structure of the transistor. The backside via is electrically connected to a backside of the source/drain epitaxial structure of the transistor. The backside interconnection structure includes a dielectric layer and a power rail. The power rail is embedded in the dielectric layer and is electrically connected to the backside via. An air gap is between the dielectric layer and the power rail.

According to some embodiments, a method for manufacturing an integrated circuit (IC) structure includes forming a transistor comprising a dummy plug over a substrate. The substrate is removed to expose the dummy plug. An isolation material is formed to surround the dummy plug. The dummy plug is replaced with a backside via. A dielectric layer is formed over the backside via. An opening is formed in the dielectric layer to expose the backside via. A dummy spacer is formed at a sidewall of the opening of the dielectric layer. A conductive feature is formed in the opening. The dummy spacer is removed to form an air gap between dielectric layer and the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
    a transistor having a source/drain structure;
    a via electrically connected with the source/drain structure of the transistor;
    a conductive feature electrically connected with the via; and
    a spacer structure along a sidewall of the conductive feature and comprising:
        a first spacer having an L-shape cross-sectional profile;
        a second spacer having a bar-shape cross-sectional profile, wherein the second spacer is in contact with the first spacer; and
        a seal cap between the first spacer and the second spacer, wherein the first spacer, the second spacer, and the seal cap form an air gap.

2. The IC structure of claim 1, further comprising an interconnection structure on one side of the transistor, wherein the conductive feature is disposed on another side of the transistor.

3. The IC structure of claim 1, further comprising a barrier layer lining the conductive feature.

4. The IC structure of claim 3, wherein the conductive feature is spaced apart from the spacer structure through the barrier layer.

5. The IC structure of claim 1, further comprising an isolation structure surrounding the via and in contact with the spacer structure.

6. The IC structure of claim 1, wherein the first spacer, the second spacer, and the seal cap are made of dielectric materials.

7. An integrated circuit (IC) structure, comprising:
    a transistor;
    a front-side interconnection structure on a front-side of the transistor;
    a conductive structure on a backside of the transistor and electrically connected with the transistor; and
    a spacer structure on a sidewall of the conductive structure, wherein the spacer structure has an air gap therein.

8. The IC structure of claim 7, further comprising a via electrically connecting the conductive structure to the transistor.

9. The IC structure of claim 7, further comprising a barrier layer lining the conductive structure, wherein the barrier layer and the spacer structure collectively define the air gap.

10. The IC structure of claim 7, further comprising an interlayer dielectric layer surrounding the conductive structure and the spacer structure, wherein the interlayer dielectric layer and the spacer structure collectively define the air gap.

11. The IC structure of claim 7, wherein the conductive structure comprises a first spacer, a second spacer, and a seal cap between the first spacer and the second spacer, wherein the first spacer, the second spacer, and the seal cap collectively define the air gap.

12. The IC structure of claim 7, wherein the conductive structure is electrically connected with a source/drain structure of the transistor.

13. The IC structure of claim 7, wherein the spacer structure is made of a dielectric material.

14. The IC structure of claim 7, wherein the conductive structure serves as a power rail of the transistor.

15. A method, comprising:
    forming a front-side interconnection structure over a front-side of a transistor;
    forming a dielectric layer over a backside of the transistor;
    forming an opening in the dielectric layer;
    forming a spacer structure along a sidewall of the opening;

forming a conductive feature in the opening and adjacent to the spacer structure, wherein the conductive feature is electrically connected to the transistor; and removing a portion of the spacer structure to form an air gap therein.

16. The method of claim 15, wherein forming the spacer structure comprises:

forming a first spacer lining the opening;

forming a sacrificial layer over the first spacer, wherein removing the portion of the spacer structure to form the air gap comprises removing the sacrificial layer; and forming a seal cap sealing the air gap.

17. The method of claim 16, wherein forming the spacer structure further comprises removing a lateral portion of the first spacer, leaving a vertical portion of the first spacer remaining on the sidewall of the opening.

18. The method of claim 16, wherein forming the spacer structure further comprises forming a second spacer over the sacrificial layer.

19. The method of claim 15, further comprising forming a barrier lining the opening prior to forming the conductive feature.

20. The method of claim 15, wherein the opening exposes a via that is electrically connected with the transistor.

* * * * *